United States Patent
Fu et al.

(12)

(10) Patent No.: US 6,647,039 B2
(45) Date of Patent: Nov. 11, 2003

(54) RECONFIGURABLE LASER HEADER

(75) Inventors: Hui Fu, Allentown, PA (US); Robert K. Wolf, Fleetwood, PA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/083,838

(22) Filed: Feb. 27, 2002

(65) Prior Publication Data

US 2003/0161366 A1 Aug. 28, 2003

(51) Int. Cl.[7] ................................................ H01S 3/04
(52) U.S. Cl. .......................................... 372/36; 372/50
(58) Field of Search ....................... 372/36, 50; 333/1.1; 358/14, 92; 359/152

(56) References Cited

U.S. PATENT DOCUMENTS

| | | | |
|---|---|---|---|
| 4,019,795 A | | 4/1977 | Ringlien |
| 4,942,076 A | | 7/1990 | Panicker et al. |
| 4,962,990 A | | 10/1990 | Matsuzawa et al. |
| 5,343,315 A | * | 8/1994 | Auffret et al. ............... 359/152 |
| 5,542,018 A | | 7/1996 | Kuhara et al. |
| 5,553,174 A | | 9/1996 | Snyder |
| 5,636,059 A | | 6/1997 | Snyder |
| 5,638,391 A | | 6/1997 | Shima et al. |
| 5,692,084 A | | 11/1997 | Roff |
| 5,943,461 A | * | 8/1999 | Shahid ......................... 385/92 |
| 5,978,401 A | * | 11/1999 | Morgan ........................ 372/50 |
| 6,081,638 A | | 6/2000 | Zhou |
| 6,146,025 A | | 11/2000 | Abbink et al. |
| 6,157,502 A | | 12/2000 | Kathman |
| 6,178,188 B1 | | 1/2001 | Jing et al. |
| 6,205,274 B1 | | 3/2001 | Zhou |
| 6,215,295 B1 | | 4/2001 | Smith, III |
| 6,219,470 B1 | | 4/2001 | Tu |
| 6,229,227 B1 | | 5/2001 | Muthukumaraswamy et al. |
| 6,282,005 B1 | | 8/2001 | Thompson et al. |
| 6,289,031 B1 | | 9/2001 | Stultz et al. |
| 6,301,279 B1 | | 10/2001 | Garbuzov et al. |
| 6,330,377 B1 | * | 12/2001 | Kosemura .................... 385/14 |
| 6,437,654 B2 | * | 8/2002 | Maruhashi et al. .......... 333/1.1 |

FOREIGN PATENT DOCUMENTS

| | | |
|---|---|---|
| EP | 0 556 639 B1 | 7/1995 |
| EP | 0 918 322 A1 | 5/1999 |
| EP | 0 767 923 B1 | 1/2000 |
| EP | 1 148 367 A1 | 10/2001 |
| JP | 7-140362 A | 6/1995 |
| JP | 9-307018 A | 11/1997 |
| JP | 10-51065 A | 2/1998 |
| JP | 11-74606 A | 3/1999 |
| JP | 11-233727 A | 8/1999 |

* cited by examiner

*Primary Examiner*—Paul Ip
*Assistant Examiner*—Tuan Nguyen
(74) *Attorney, Agent, or Firm*—Allen, Dyer, Doppelt Milbrath & Gilchrist, P.A.

(57) ABSTRACT

A reconfigurable laser header assembly, wherein either an n-doped laser substrate structure or a p-doped laser substrate structure can be properly biased, includes a header coupled to a modulated electric (AC) current source, a DC positive bias electric current source, and a DC negative electric current source. A laser is mounted relative to the header, the laser includes a base electric contact and a laser electric contact. An electrical conductor on the header includes first and second metalized regions in electrical connection with the base electric contact, wherein different ones of the modulated electric current source, the bias electric current source, and the DC negative electric current source can be electrically connected to the first metalized region, the second metalized region, and the laser electric contact to properly bias the laser regardless of whether the laser is an n-doped laser substrate structure or a p-doped laser substrate structure.

16 Claims, 25 Drawing Sheets

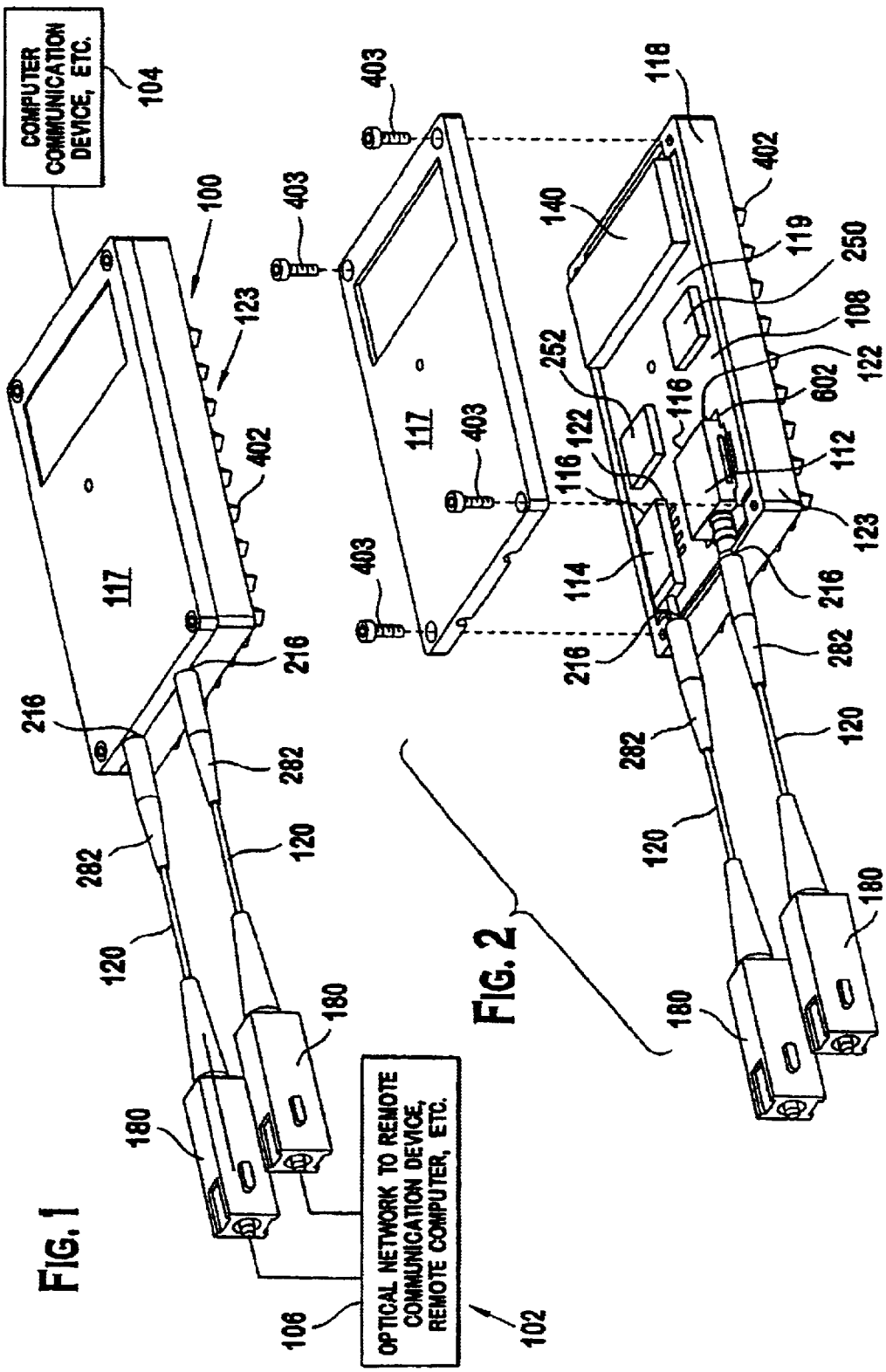

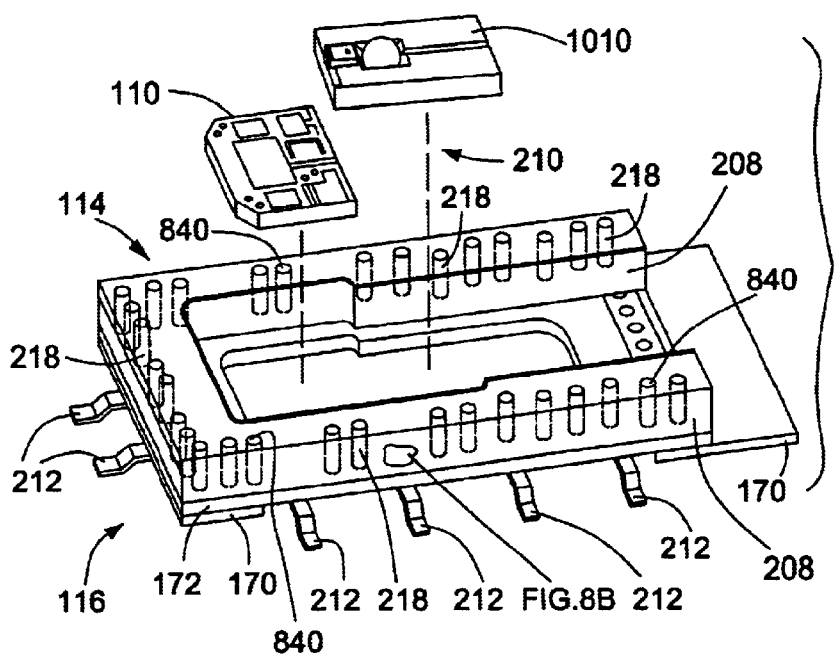
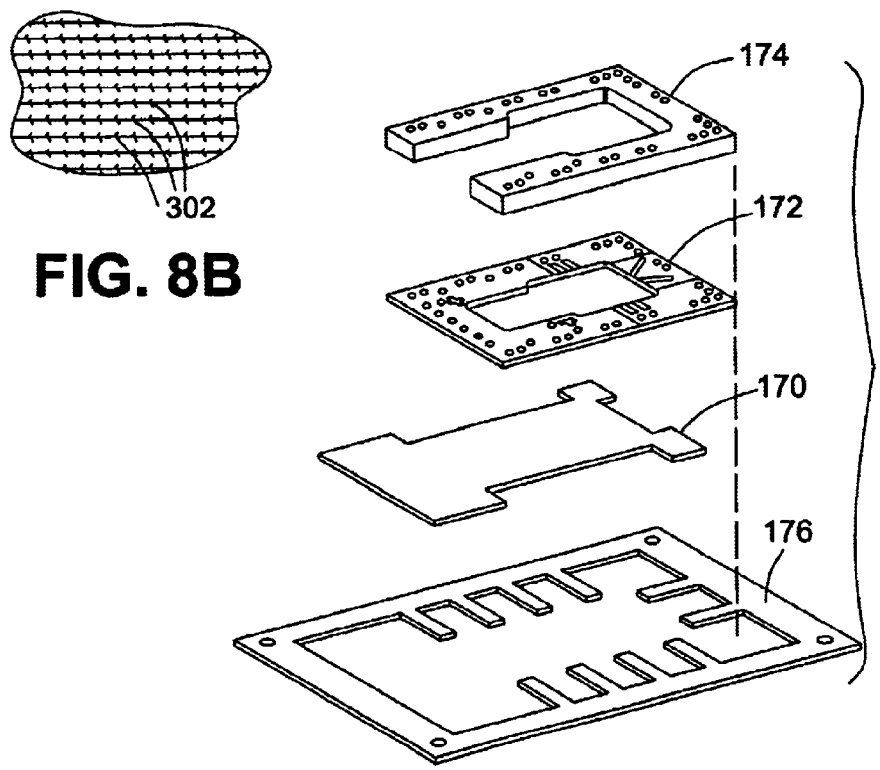

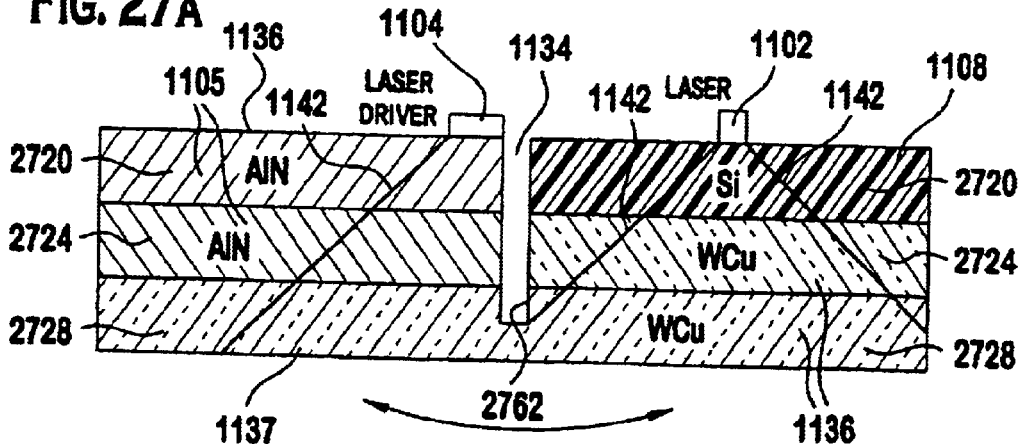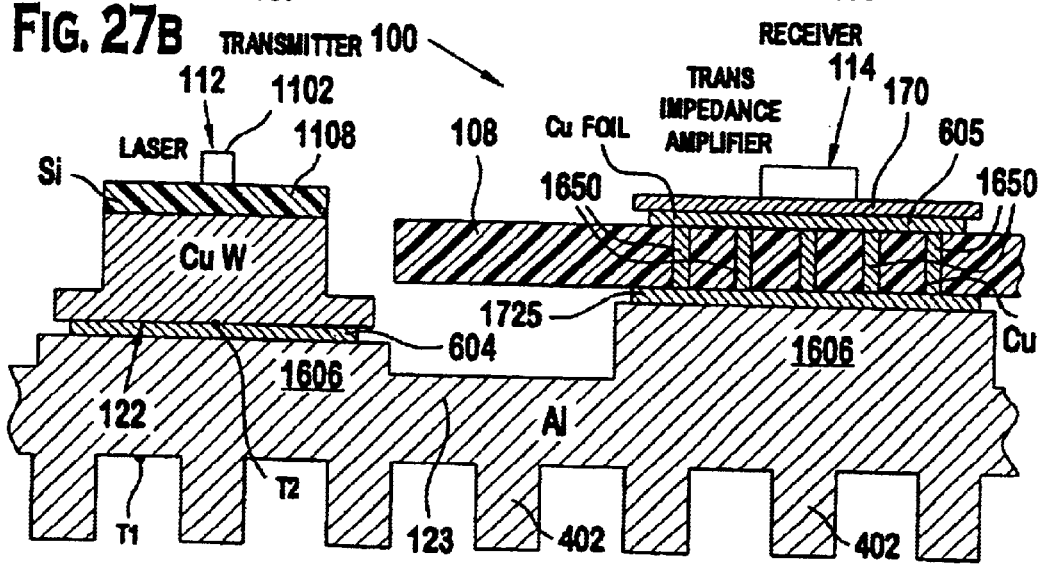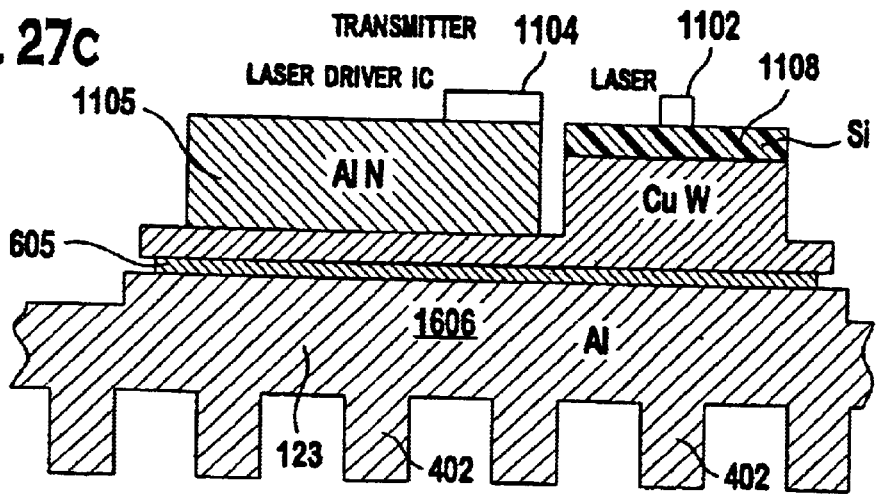

ized. Miniaturization of optical devices is challenging. For example, positioning components close together may cause electromagnetic interference (EMI) of one optical device (or component thereof) to interfere with another optical device (or component thereof). Additionally, the amount of heat that is generated (and thus has to be dissipated) is similar regardless of the size of the component. As such, miniaturized optical devices have to dissipate more heat for a given volume. As such, many designs employ thermoelectric coolers to control thermal exposure of critical optical elements such as lasers. Alternatively, they may have distinct heat generating devices (such as lasers and laser drivers within optical transmitters) separated by a considerable distance or in separate packages. However the laser driver supplies a radio-frequency electrical signal to the laser, and as such is located relatively close thereto. Spacing the components within an optical device may also result in electrical conductors that extend between certain ones of the components. An extended electrical conductor can act as a transmitting or receiving antenna of EMI or a parasitic element degrading high frequency performance.

RECONFIGURABLE LASER HEADER

FIELD OF THE INVENTION

This invention relates to optical devices, and more particularly to optical transmitters and/or optical receivers.

BACKGROUND OF THE INVENTION

Optical transponders include a combination of at least one optical transmitter and at least one optical receiver thereby providing input/output functions in one device. The use of optical networks is increasing. The bandwidth of the signals that optical transmitters can transmit, and the bandwidth of the signals that optical receivers can receive, is progressively increasing.

It is often important that optical devices such as optical transmitters and optical receivers be miniaturized. Miniaturization of optical devices is challenging. For example, positioning components close together may cause electromagnetic interference (EMI) of one optical device (or component thereof) to interfere with another optical device (or component thereof). Additionally, the amount of heat that is generated (and thus has to be dissipated) is similar regardless of the size of the component. As such, miniaturized optical devices have to dissipate more heat for a given volume. As such, many designs employ thermoelectric coolers to control thermal exposure of critical optical elements such as lasers. Alternatively, they may have distinct heat generating devices (such as lasers and laser drivers within optical transmitters) separated by a considerable distance or in separate packages. However the laser driver supplies a radio-frequency electrical signal to the laser, and as such is located relatively close thereto. Spacing the components within an optical device may also result in electrical conductors that extend between certain ones of the components. An extended electrical conductor can act as a transmitting or receiving antenna of EMI or a parasitic element degrading high frequency performance.

Optical transmitters and optical receivers typically include both optical and electronic (microwave) portions. In optical transmitters, an electrical signal received and processed by the electronic portion is converted into an optical signal and then transmitted over an optical fiber cable. In optical receivers, an optical signal received over an optical fiber cable is processed by the microwave portion and then transmitted as an electrical signal.

A design challenge involves repairing, replacing, or updating any optical device that is mounted to a circuit board. It would be desired to effectively replace one optical device (having both electronic and mechanical connections) by another optical device. Removal of an optical device involves not only mechanical connections, but electrical connections between the optical device and the circuit board must also be disconnected. To insert a replacement optical device, the applicable optical device similarly is secured by providing a mechanical connection as well as an electrical connection to the circuit board.

Materials play an important role in the design of optical devices. The device packages that enclose optical transmitters or optical receivers must adapt to a variety of mechanical, thermal, electrical, and optical conditions. For instance, the different portions of the device package are configured to withstand thermomechanical stresses, vibrations, and strains that are applied by, e.g., outside forces to the device package which houses the optical device. It is also required that different parts of the optical device can tolerate different thermal expansions that would otherwise create excessive stresses or strains in the device package resulting in optical instability. Thermal conditions also relate to the capability of operating successfully at a series of high or low temperatures, depending on the application. Additionally, the optical device has to provide the optical and electrical functions for which it is designed. As such, the materials selected play an important role in allowing the optical device to perform its desired function.

In one aspect, it would be desired to provide an optical device that is designed to operate under the variety of thermal, mechanical, optical, and/or electrical conditions that the optical device will potentially encounter over its life. In another aspect, it would be desired to provide a Faraday cage to limit the transmission of electromagnetic interference through a part of a device package case of an optical transmitter or optical receiver. In yet another aspect, it would be desired to provide effective heat sinking from one or more heat generating components within an optical component. In yet another aspect, it would be desired to provide an effective surface mount to secure an optical transmitter or optical receiver to a circuit board.

SUMMARY OF THE INVENTION

An aspect of the present invention is directed to a reconfigurable laser header assembly that can be used to properly bias either an n-doped laser substrate structure or a p-doped laser substrate structure. The reconfigurable laser header assembly includes a header that is coupled to a modulated electric (AC) current source, a (DC positive) bias electric current source, and a DC negative electric current source. The header assembly also includes a laser mounted on the header, and an electrical conductor formed from first and second metalized regions. The laser includes a base electric contact and a laser electric contact. Each of the first and second metalized regions is in electrical connection with the base contact. Different ones of the modulated electric (AC) current source, the (DC positive) bias electric current source, and the DC negative electric current source can be electrically connected to the first and second metalized regions, and the laser electric contact in a manner to properly bias the laser regardless of whether the laser is an n-doped laser substrate structure or a p-doped laser substrate structure.

BRIEF DESCRIPTION OF THE DRAWINGS

The accompanying drawings, which are incorporated in and constitute part of this specification, illustrate different embodiments of the invention, and, together with the general description given above and the detailed description given below, serve to explain features of the invention.

FIG. 1 shows a perspective view of one embodiment of an optical transponder;

FIG. 2 shows a partially exploded view of the optical transponder of FIG. 1 in which the cover is removed to show internal components of the optical transponder including an optical transmitter and an optical receiver;

FIGS. 8A–8B shows a partial exploded perspective view of an optical receiver subassembly;

FIG. 9 shows another exploded view of the ceramic wall portion in the optical receiver including the baseplate and lead frame;

FIG. 27A shows a cross-sectional view of one embodiment of a header or transmitter optical bench and a hybrid subassembly partially separated by a vertically extending air trench formed therein, in which the air trench defines a plurality of pedestals and which one of the pedestals supports a laser and another one of the pedestals supports an additional heat-generating component such as a laser driver;

FIG. 27B shows a side cross sectional view of one embodiment of the components associated with an optical transponder including an optical transmitter, such as illustrated in FIG. 27A and an optical receiver;

FIG. 27C shows a side view, as taken through sectional lines 27—27 of FIG. 27B;

Throughout the figures, the same reference numerals and characters are used, unless otherwise stated, to denote like features, elements, components, or portions of the illustrated embodiments.

DETAILED DESCRIPTION OF THE EMBODIMENTS

I. Optical Transponder

Figure 3:
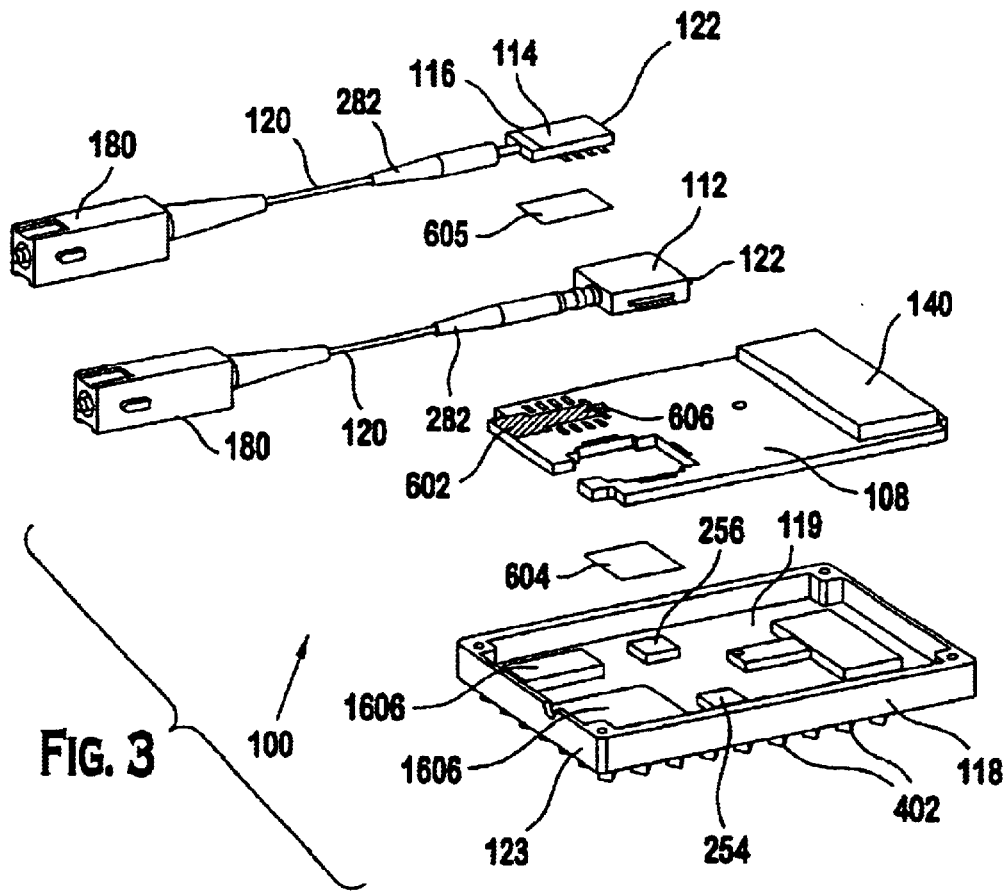
FIG. 3 shows a perspective view of the circuit board shown in FIG. 2, with the optical receiver shown as separated, and the optical transmitter shown as removed.

One embodiment of optical transponder 100 that is included as part of an optical/electronic network 102 is shown in FIG. 1. FIGS. 2 and 3 show different views of the optical transponder 100 of FIG. 1 that includes a circuit board 108, a mateable electronic connector 140, an optical transmitter 112, and an optical receiver 114. The circuit board 108 supports such exemplary optical devices 116 as the optical transmitter 112 and the optical receiver 114. The optical transponder 100 performs the transmitting, receiving, and other capabilities as described herein.

This disclosure describes a variety of aspects relating to the optical transponder 100. Certain general aspects of the Faraday cage, surface mount components, matching materials characteristics, optical device removal tool, and optical bench assembly as described herein are applicable generically to the optical transmitter 112 or the optical receiver 114. Other aspects of the optical transponder relate specifically to optical transmitter 112 but not typically the optical receiver 114. These aspects include effective laser, laser driver, and header or optical bench configurations as described later in the specification.

In this disclosure, the optical transmitter 112 and the optical receiver 114 are each categorized as different embodiments of the optical device 116. The optical transmitter 112 transmits optical signals over at least one optical fiber cable 120. The optical receiver 114 receives optical signals over at least one of the optical fiber cables 120. The optical transponder 100 also includes a housing case 123. The housing case 123 includes a casing 118 and a casing cover 117 that forms an enclosure 119. The enclosure 119 encloses one or more optical devices 116 mounted within the enclosure.

Figure 4:
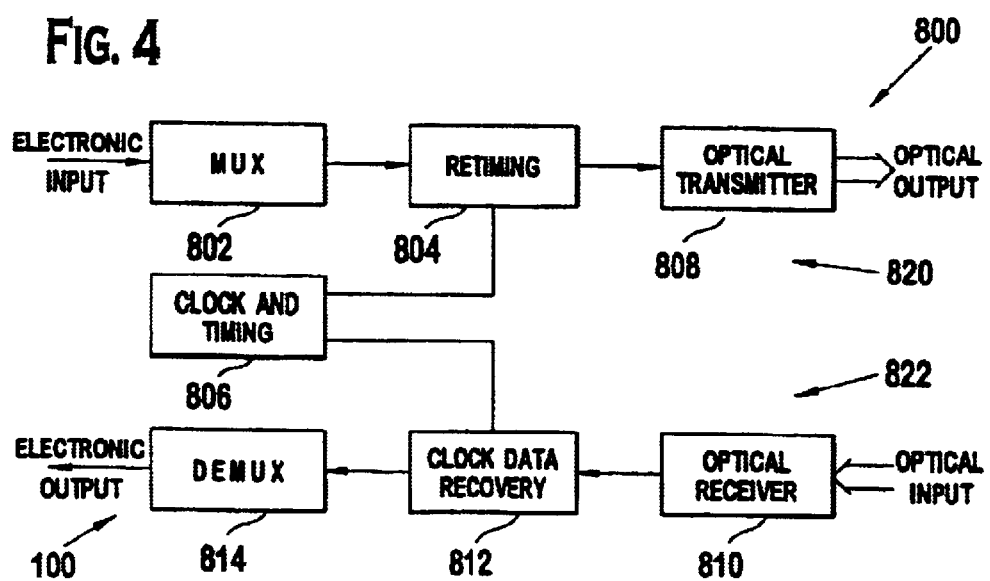
FIG. 4 shows a block diagram of one embodiment of an optical transponder.

Certain embodiments and views of portions of the optical transponder 100 are shown in FIGS. 1–18, 20A, 20B, 21, 22, and 22A. FIG. 4 shows one embodiment of a block diagram 800 for the optical transponder 100. The optical transponder 100 provides the overall optical transmitter and optical receiver functions. The optical transmitter 808 and optical receiver 810 represent the operational equivalents of similarly named devices that are described herein with respective references numbers 112 and 114 in FIG. 2. The transponder block diagram 800 can be segmented into a transmitter portion 820 and receiver portion 822, with the clock and timing circuit 806 controlling certain timing aspects in both the transmitter portion 820 and the receiver portion 822. The transmitter portion 820 includes an electrical multiplexer 802, a retiming circuit 804, and an optical transmitter 808. The receiver portion 822 includes an optical receiver 810, a clock and data recovery circuit 812 and an electrical demultiplexer 814.

The electrical multiplexer 802 receives a plurality of electrical input signals, and combines the plurality of electrical input signals into a single multiplexed electrical signal. The retiming circuit 804 retimes the multiplex electrical signal to allow it to be acted upon by the optical transmitter 112. The optical transmitter 112 converts the electrical signal (that typically is a multiplexed signal) into an optical signal, which is configured to be transmitted over an optical medium such as an optical fiber cable or optical waveguide. The clock and timing circuit 806 controls the timing of the retiming circuit 804 and the clock and data recovery circuit 812.

For the receiver portion, the optical receiver 810 receives an optical input signal over an optical fiber cable, or other optical medium such as waveguide, and converts the signal into a multiplexed electrical signal. The multiplex electrical signal is applied to the clock and data recovery circuit 812 which (under the control of clock and timing circuit 806) changes the multiplexed electrical signal output by the optical receiver 810 into a form to be received by the electrical demultiplexer 814. The electrical demultiplexer 814 acts to divide each one of a plurality of electrical output signals that are combined in the electrical multiplex signal. The optical/electronic network 102 further includes a computer/communication device 104 and an optical network 106. The optical/electronic network 102 may be configured as a hybrid optical and electronic network that allows a large number of end users to communicate. The general use of fiber optic networking is increasing with optical networks such as SONET are gaining greater acceptance. It is important to provide optical systems capable of transmitting and/or receiving an ever-increasing bandwidth of data. SONET is presently primarily configured as a backbone network protocol that provides for the transmission of a large bandwidth of data over relatively large optical cables. One design challenge with optical networks is to provide a so-called "first mile" optical protocol that transmits data between each end user and the optical backbone.

The computer/communication device 104 shown in FIG. 1 is envisioned to be an end-user terminal, such as a computer, network switch, or communications server computer. The computer/communication device 104 can transmit and receive data in the form of video, audio, image, text, and/or any other known type of data. The optical network 106 is configured as, for example, the SONET network utilizing an optical cable that can transmit a large bandwidth of data.

The optical fiber cables 120 extend through apertures 216 to connect to their respective optical device 116. In one embodiment, the optical fiber cable 120 is attached at the distal end (opposite from the end which is connected to the optical device 116) to an optical connector 180. The optical connector 180 permits quick coupling and decoupling of the optical fiber cable 120 to an additional optical fiber cable or another component of the remainder of the optical network 106. At least one optical fiber cable 120 extends through the housing case 123 and is operatively converted to an optical device 116.

Each optical device 116 is encased within, and includes a device package case 122 as shown in FIGS. 2, 3, 5, 6. The device package case 122 may also be referred to as a housing. The device package case 122 may include one member, two members, or a plurality of members secured to each other using such illustrative connecting techniques as an electrically conductive adhesive, weld, soldering, and/or a mechanical connector or fastener. These connectors, as well as the materials selected for the housing, are selected based upon thermal, mechanical, electrical, and optical considerations as described herein. The dimensions of the package case 122 for each optical device 116 can be designed (considering miniaturization and other design criteria) based largely on the components of the optical subassembly located within the device package.

A variety of connections may be established between one of the optical devices 116 and some portion of the optical transponder 100 to secure the optical device 116 in position within the device package case 122. In one embodiment, the device package case 122 of the optical device 116 can be secured to an attachment region 606, such as with the optical receiver 114 shown in FIGS. 2 and 3. In another embodiment, the attachment regions 606 may be formed directly in the housing case 123 formed in the casing 118, such as with the optical transmitter 112 shown in FIGS. 2 and 3. In the latter embodiment, a cut-away region 602 is formed in circuit board 108 that permits the optical device 116 to be mounted securely to the attachment regions 606 located on the housing case 123 formed in the casing 118. Heat sink fins 402 are arranged across a lower surface of the casing 118 as shown in FIGS. 1 and 3. The heat sink fins 402 may have a substantially circular, rectangular, or other cross sectional configuration. In one embodiment, the lowermost surface of the heat sink fins 402 is a plane that can be secured to some surface to which the housing case 123 of the casing 118 is mounted. Securement fasteners 403 are used to mount the housing case package 123 of the optical transponder 100 so the heat sink fins 402 are mounted on a mating surface. Such mounting of the heat sink fins 402 can enhance heat transfer.

Figure 7:
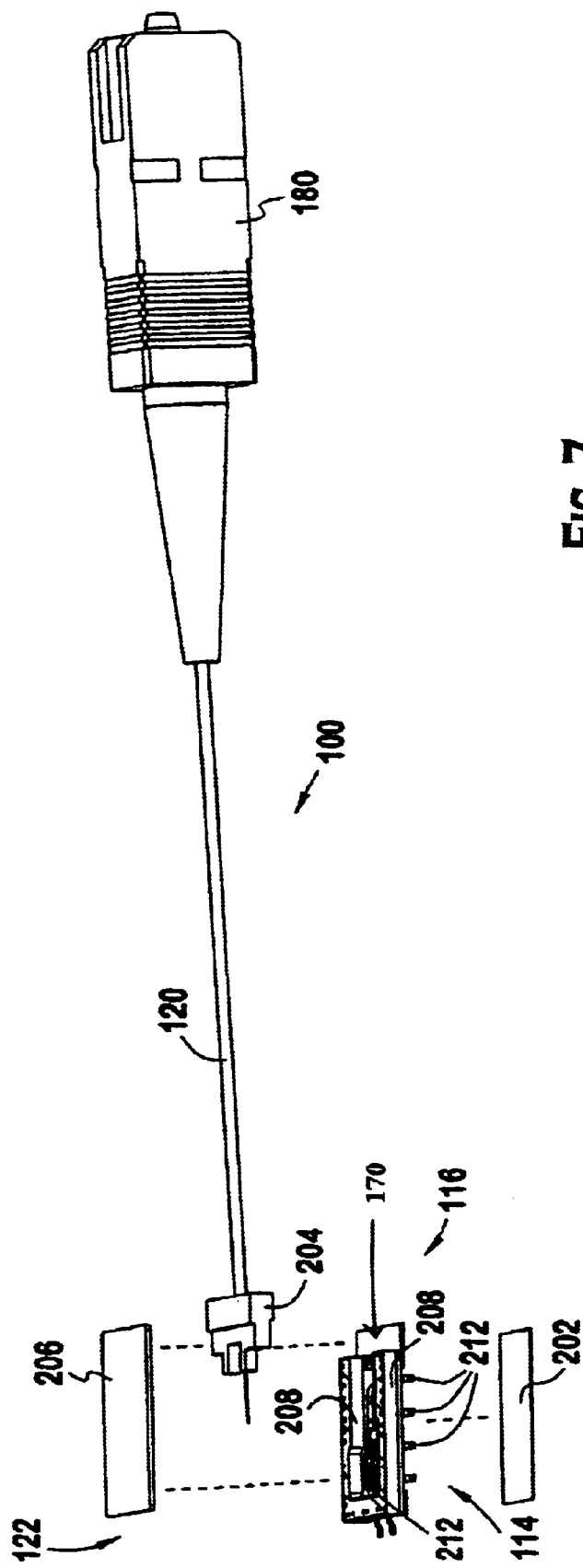
FIG. 7 shows a partially exploded view of the optical receiver of FIG. 2.
Figure 10:
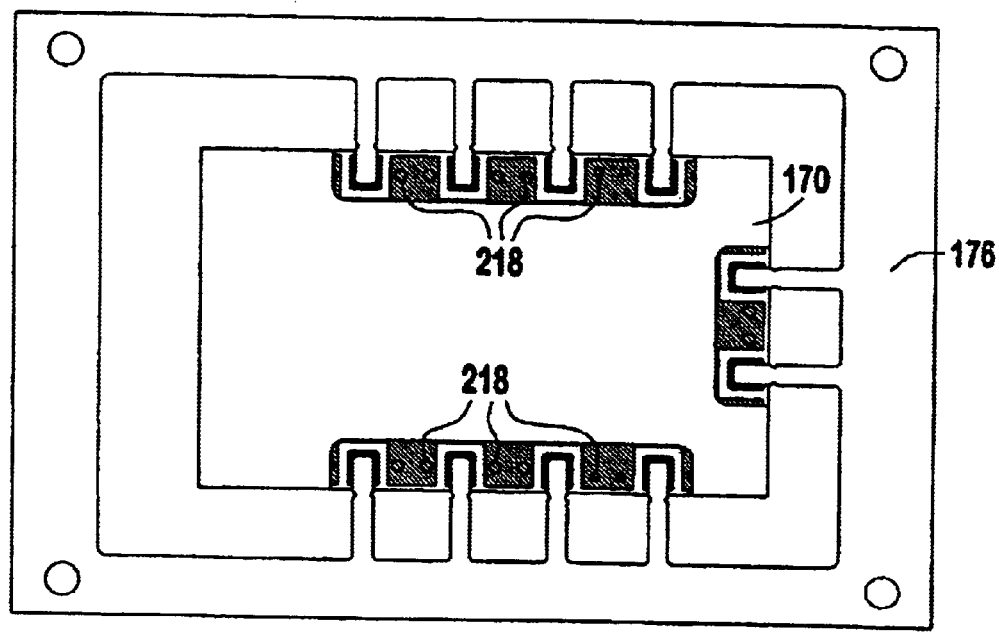
FIG. 10 shows a bottom view of the optical receiver with lead frame attached.
Figure 11:
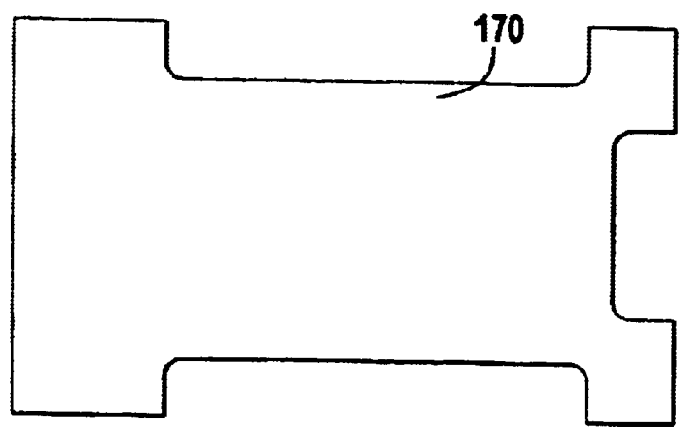
FIG. 11 shows a baseplate of the optical receiver.

One embodiment of the device package case 122, shown in exploded view in FIG. 7, includes a baseplate 170, a backbone 204, a lid 206, and a ceramic wall portion 208. The baseplate 170, the backbone 204, the ceramic wall portion 208, and the lid 206 are each configured in such a manner as to remain within the overall dimensional limitations and machinability requirements for the device package case 122. The "ceramic wall portion" 208, one embodiment of which is shown in greater detail in FIG. 8, is a structure including layered ceramic layers, certain of the layers have applied metalization. Other embodiments of the device package case 122 may include the components described relative to the embodiment of device package case 122 shown in FIG. 2. For example, the backbone 204 and the ceramic wall portion 208 may be formed as a unitary member in certain embodiments. The baseplate 170, the ceramic wall portion 208, and/or the backbone 204 may be formed as one member in still other embodiments.

Figure 5:
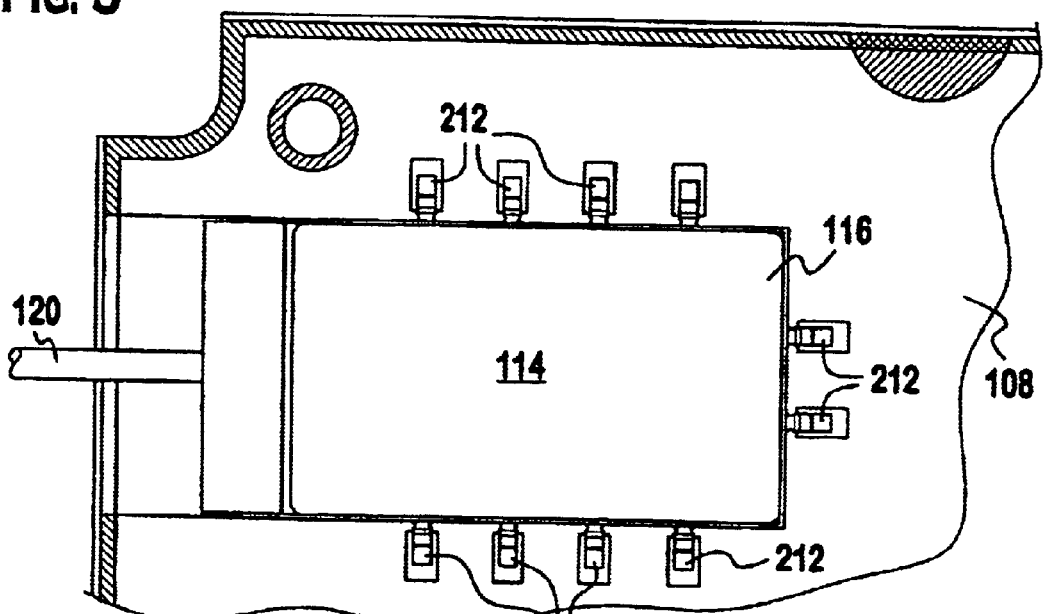
FIG. 5 shows a top view of the optical receiver of the optical transponder shown in FIG. 2.
Figure 6:
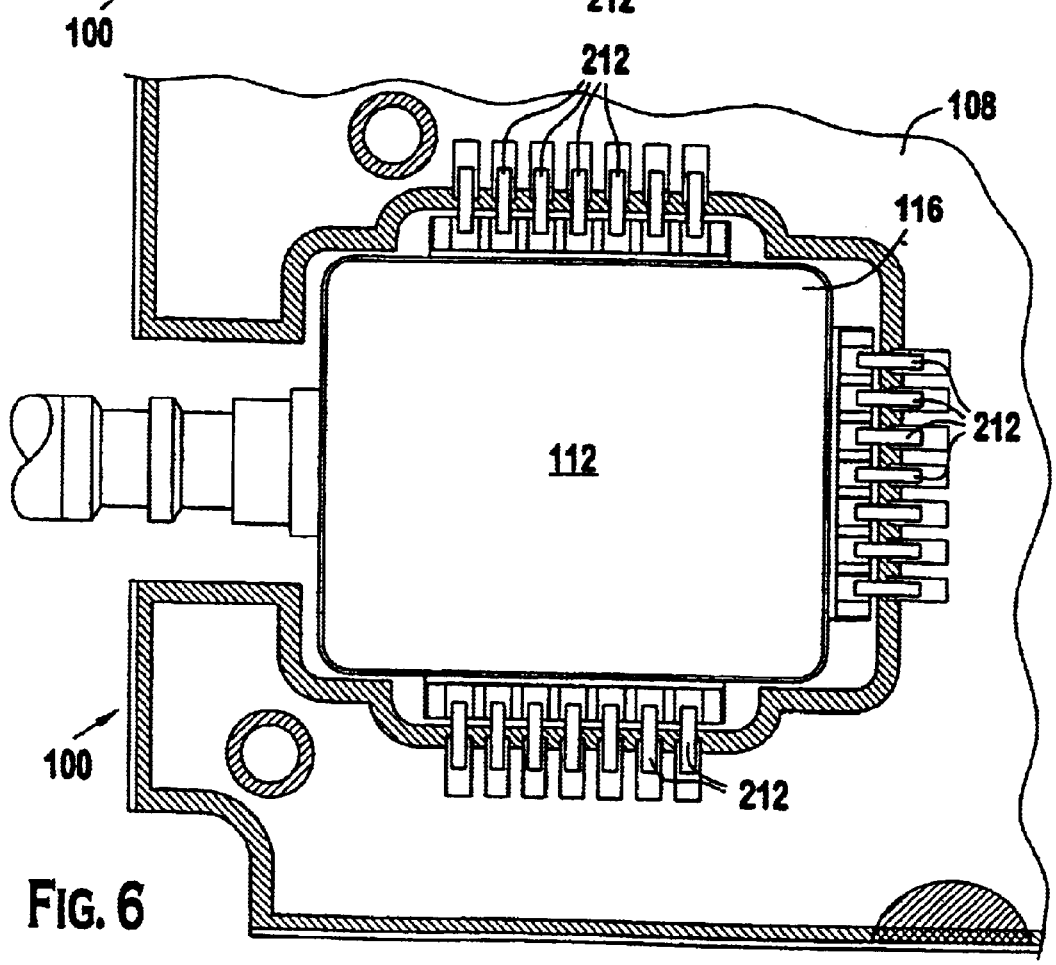
FIG. 6 shows a top view of the optical transmitter of the optical transponder shown in FIG. 2.

The device package case 122, as shown in FIG. 8, is designed to contain and protect the components located therewithin. The device package case 122 encases an optical subassembly 210 within an enclosure formed in the device package case 122. The optical subassembly 210 is designed to perform the desired optical operation of the particular optical device 116. In the optical transmitter 112, the optical subassembly 210 is configured as an optical transmitter subassembly whereas in the optical receiver 114, the optical subassembly 210 is configured as an optical receiver subassembly. The applicable optical subassembly 210 is affixed to the baseplate 170, although it can be affixed to other members in the device package case 122. FIG. 5 shows a top view of one embodiment of optical receiver 114 including the electrical lead interconnects 212. FIG. 6 shows a top view of one embodiment of optical transmitter 116 including the electric lead interconnects 212. As shown in FIGS. 8 and 9 and described below, the electric lead interconnects 212 in the embodiment of device-package case 122 can be connected to electric traces that are formed on certain ceramic layers 172 and 174 of the ceramic wall portion 208. In other embodiments, the electric lead interconnects 212 themselves can partially extend through other portions of the device package case 122 such as the lid 206, the baseplate 170, and/or the backbone 204. The first ceramic layer 172 of the ceramic wall portion 208 is mechanically and electrically secured to a lead frame 176 that protects the electric lead interconnects 212 during transportation. The lead frame 176 is trimmed from the electric lead interconnects. As shown in FIG. 9, the lead frame 176 includes a plurality of lead interconnects.

Figure 12:
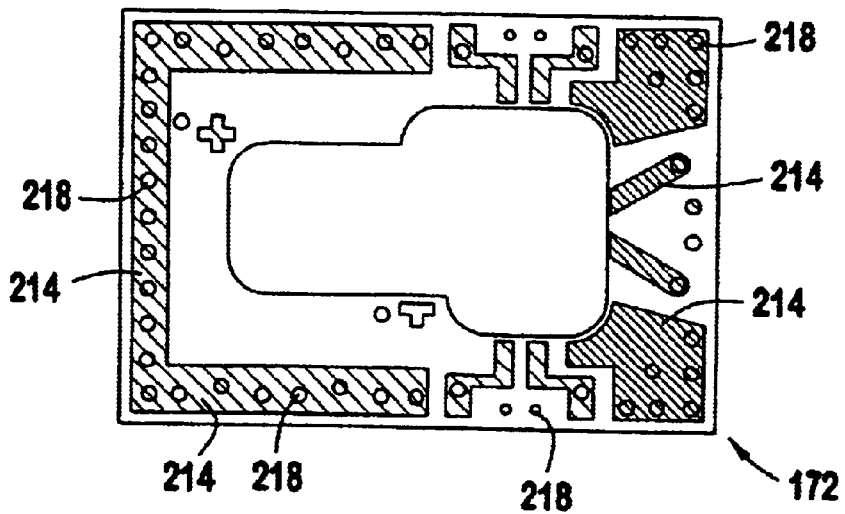
FIG. 12 shows a top view of layer two of the optical device shown in FIG. 8.

Electric traces 214 are formed, in one embodiment, as metalized layers on one of the ceramic layers 172, as shown in FIG. 12. Metallic vias 218 provide a connection between electric traces at different levels. Each one of a plurality of electric traces 214 electrically connect to either the electrical hybrid subassembly 110 and the optical subassembly 210. As such, the electric lead interconnects 212 electrically connect to the electric hybrid subassembly 110 to optical subassembly 210 to provide necessary electric input/output thereto. The optical fiber cable 120 extends through an aperture formed in the backbone 204. The backbone 204 is attached to the baseplate 170, the lid 206, and the ceramic wall portion 208 to form the device package case 122. One embodiment includes a tungsten copper-based metal baseplate 170. The Invar-based backbone 204 can be plated using gold or other suitable material.

The backbone 204 has a sufficiently large cross-sectional dimension to allow the aperture (not shown) to be machined therein. The aperture has a dimension selected to retain and align the optical fiber cable 120 relative to some component. Only certain materials can be drilled with such small diameter apertures as may be necessary precisely retain/align the optical fiber cable (e.g., about 0.0055") to limit excessive motion and/or provide alignment of the optical fiber cable 120 within the device package case 122.

The connections between certain ones of the baseplate, the ceramic wall portion, the backbone, and the lid may be connected to each other using brazing, epoxy, and other attachment techniques depending on the particular members being connected, the materials being used, and the operating environment of the optical devices.

IA. Faraday Cage

One concern in the design of optical devices 116 is that electromagnetic radiation can produce electromagnetic interference (EMI). The transfer of EMI through a wall of a device package can be limited by use of a Faraday cage. Electromagnetic radiation includes not only electrical and electronic radiation, but also photonic radiation (light, as used in optical systems). EMI can destructively interfere with other digital or analog signals such that the signals can be interpreted as providing an incorrect signal level indication.

Faraday cages 840 (one embodiment partially shown in FIG. 8) limit the transmission of EMI generated by one device from interfering with another device. Embodiments of the lid 206, the backbone 204, and the baseplate 170 are each formed of material that is selected to limit the transmission of EMI. As such, in the embodiment of device package case 122 shown in FIGS. 2 and 8, the EMI would pass only through the base material (ceramic) of the ceramic wall portion 208.

Figure 13:
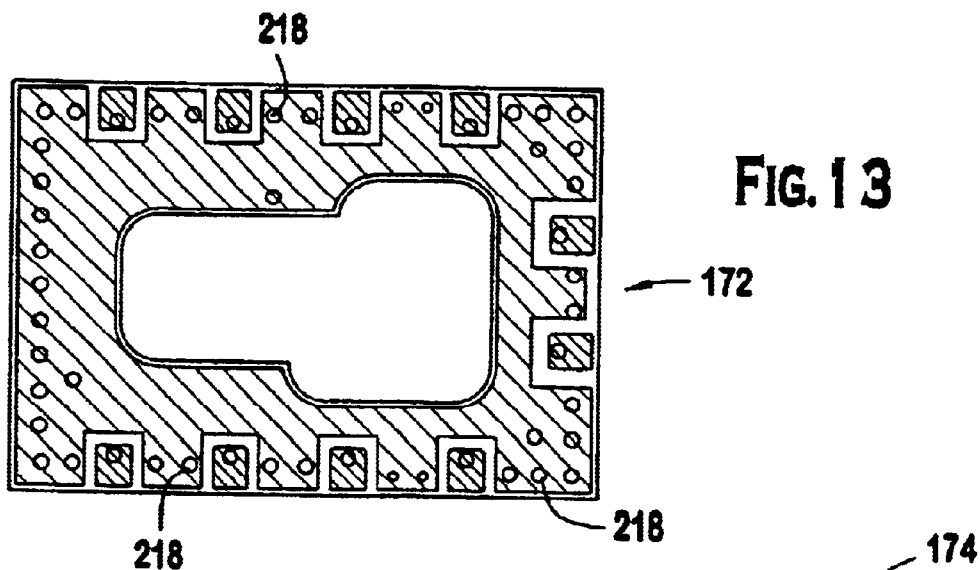
FIG. 13 shows a bottom view of layer two of the optical device shown in FIG. 8.
Figure 14:
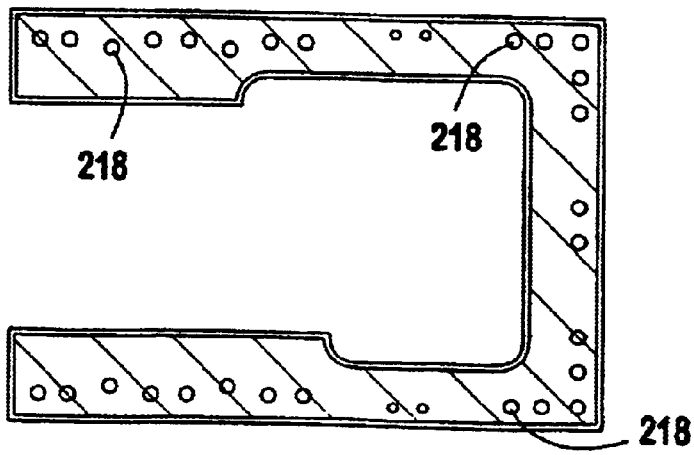
FIG. 14 shows a top view of layer three of the optical device shown in FIG. 8.
Figure 15:
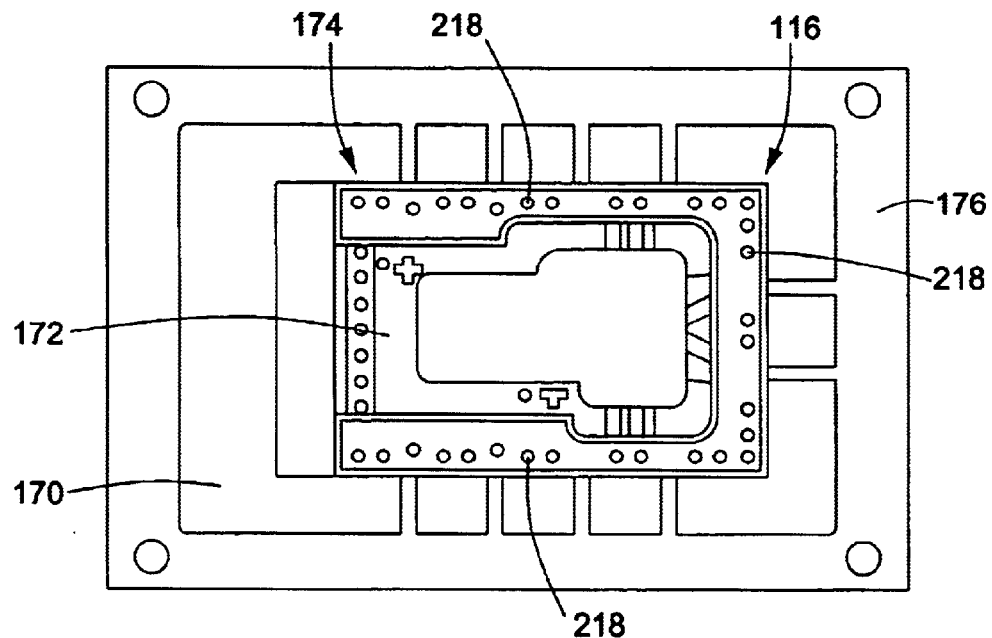
FIG. 15 shows a top view of the lead frame mounted to assembled layers one, two, and three.

In one embodiment, vias 218 formed as a plurality of laser-drilled holes that extend within the ceramic wall portion 208 in the optical receiver 114 as shown in FIGS. 13, 14, and 15, can be applied to optical transmitters 112 as well as optical receivers. The vias 218 continue from the lid 206 to the baseplate 170, shown in FIG. 7, to provide a ground reference that can be reached at either location as well as provide a portion of the Faraday cage 840, as described herein. The vias 218 can also act as a ground plane for the RF trace.

Faraday cages 840 may be used alternatively with EMI receiving and/or EMI generating devices such as optical receivers 114 or optical transmitters 112. Faraday cages 840 in optical receivers 114 limit the transmission of EMI from sources external to the device package case 122 that would otherwise be received by the sensitive optical receiver subassembly 210 located within the device package case 122. Faraday cages 840 in optical transmitters 112 limit the transmission of EMI from the optical subassembly 210 that is located within the optical transmitter 112 to sensitive components (e.g., an adjacent optical receiver) located outside the device package case 122. The embodiment of Faraday cage 840 shown in FIGS. 13 through 15 includes an arrangement of vias 218 that extend about the periphery of the optical device 116. The vias 218 are formed by punching through the layers of the ceramic wall portion 208 prior to lamination and cofiring. Alternatively, drilling can be performed, e.g. using mechanical drilling, laser drilling, etc. The thickness and material of the layers of the ceramic wall portion may largely dictate how the vias are formed. The vias 218 are shown as substantially vertically extending in the embodiment of Faraday cage 840 of FIG. 8, though they may also be angled or even extend substantially horizontal. In certain embodiments, the vias 218 are metalized to take the form of a series of substantially parallel metalized pillars. The vias 218 may take the form of a series of parallel pillars formed of air voids having a metal plated surface. Additionally, the vias 218 are typically cylindrical, though they may be formed as tapered, curved, or some other desired configuration.

The spacing between the adjacent vias 218 is selected to limit transmission of EMI, of the desired wavelengths, through the device package case 122 to partially form the Faraday cage 840. The spacing distance should be less than a quarter wavelength ($\lambda/4$) of the highest operating frequency component requiring attenuation. The vias 218, as such, extend in a direction substantially perpendicular to the baseplate 170 and the lid 206. As shown in FIG. 8, the ceramic wall portion 208 includes a plurality of cofired ceramic layers 302 (some of ceramic layers may be metalized). Metalization layers are thus formed between or above certain ones of the cofired ceramic layers 302 as shown in FIGS. 10, 12, 13, and 15.

IB. Material Design Considerations For Ceramic Wall Portion

Material selection for the baseplate 170, the ceramic wall portion 208, the lid 206, and the backbone 204 is important since each component in device package case 122 as shown in FIG. 7 provides the desired optical, mechanical, thermal, and electrical operation for optical devices. The materials in certain embodiments of portions of device package case 122 may include Kovar and Invar. Certain components of the device package case 122 include parts made from different materials since different portions of the device package case 122 have different design considerations and demands.

Different portions of the device package case 122 may be exposed to different temperatures based on the design, operation, and environment of the optical device. One embodiment of device package includes a variety of components formed from different materials, wherein the materials of each component is selected based on its operating temperature. Since different components have different temperatures, the selection of different materials having different coefficients of expansions allows each component to expand at similar rates. Therefore, if all components are formed from different materials, the different portions may expand at different rates. Selecting materials for the design that have a similar rate of expansion thus limits the stresses and strains being created at certain device package locations.

Optical transmitters 112 and optical receivers 114 must/can be made more compact as the operating frequency increases. Miniaturization therefore becomes practical at higher operating frequency. Unfortunately, smaller volume devices (such as miniaturized device packages) tend to operate at similar temperatures as larger optical devices, and as such a similar amount of heat has to be dissipated over a smaller volume. As such, with miniaturization, material selection becomes more critical.

Longer electric lead interconnects 212 result in lower frequency operation. Conversely, smaller device packages and lead interconnects can be designed for higher frequency operation. The design characteristics of the device package case 122 therefore become more critical at increased frequencies, such as 40 GHz and above. The selected material of the ceramic wall portion 208 provides matched characteristics to 90 GHz and above. As packaging decreases in dimension, transponders including optical transmitters 112 and/or optical receivers 114 can be produced having an operating frequency of 40 GHz, 90 GHz, and above. The frequencies of the optical devices 116 described herein are illustrative, and will increase as technologies improve, and are not intended to be limiting in scope.

Integrated designs for optical transmitters 112 and/or optical receivers 114 are also important for optical devices operating at the higher operating frequencies, such as 40 GHz and above. As an example, a device package case 122 may be integrated within another housing case 123 and/or within the casing 118. The more integrated the components within the device package case 122 become, the smaller the overall dimension of the device package case 122 often become. Integration may involve physically locating components close together so that the signals do not have to travel a large distance, and thus the signals travel quicker between the components. The functionality and components that were originally separated may in fact now be included in the same device package case 122. This could increase the optical device response speed by eliminating walls and limiting distances between sub-components by merging certain sub-components.

The electronic connector 140 can be integrated, in certain embodiments, into the device package case 122. The electronic connection 140 provides an interface that allows end users to connect their electronic devices (e.g., computers, phones, etc.) to the optical transponder 100. The housing case also includes an electrical multiplexer 250, a multiplexer pedestal 254, an electrical demultiplexer 252 and a demultiplexer pedestal 256. In one embodiment, the optical device 116 can be located proximate to the electronic mateable connector 140. Different device package case designs (e.g., device packages designed by different manufacturers or designers) can be configured differently while still achieving similar operational characteristics.

A microwave package may be fashioned with one or more co-planar lines, including the electric trace 214 that extends on top of (or within and through) the ceramic wall portion 208. The electric trace 214 electrically connects with the optical device 116. The electric lead interconnects 212 electrically connect to the electric trace 214. In one embodiment, the electric lead interconnects 212 change from a co-planar line (with electric trace within the device package case 122) into a coaxial line (via and ground configuration that is located within the ceramic wall portion). One or more ground planes (indicated as one of the combined electric lead interconnects 212 and electric traces 214) extend across the ceramic wall portion 208 from the interior of the device package case 122 to the lead interconnects on the exterior of the device package, and connects within the interior to the optical device 116.

The RF electrical conductor structure (including microwave circuits) is used in many embodiments of optical receivers 114 and optical transmitters 112 that are miniaturized. This RF lead interconnect configuration allows the electric lead interconnects 212 to extend directly from a double micro-strip line so lead interconnects can bond to the outside of the device package case 122, which is desired when the device package is miniaturized. In these instances, the ceramic wall portion 208 extends around a large percentage of the periphery of the device package case 122 (in one embodiment, the entire periphery excluding the backbone 204). The ceramic wall portion 208 is configured to allow for the inclusion of a large number of distinct electric lead interconnects 212, electric traces 214, and vias 218 (that take the form of metalization layers that extend through the ceramic wall portion 208).

Many components forming the device package case 122 are designed at least partially based on thermal considerations. Aluminum nitride substrates (that may be used in headers, optical benches, hybrid integrated circuits, etc.) are fairly common in the industry. The aluminum nitride substrates dissipate considerable heat from the various electrical and optical portions of the device package. This aluminum nitride substrate may be epoxied with electrically conductive epoxy, soldered, or brazed to the baseplate 170.

In one embodiment, the device package case 122 must achieve good thermal management to dissipate the heat generated by a laser 1102, the laser driver 1104, (shown in FIGS. 22A and 22B) or other heat generating components. For example, heat generated by the optical subassembly 210 can be dissipated through the copper tungsten pedestal (202). Multiple elements can also interact to provide the thermal management including the optical subassembly 210, the electrically conductive epoxy, the baseplate 202 (FIG. 21), and the adhesive pad 604 or 605 (FIG. 3). These elements act together to sink heat out of the critical components. If one of these items is missing or has poor thermal properties, the thermal properties of the whole system may degrade considerably. It is important that the substrate, and the associated attachment material, act as a heat sink to increase the thermal dissipation from the optical device 116. In one embodiment, the chip located on the electrical hybrid subassembly 110 in the receiver includes a transimpedance amplifier (TIA).

The electrical hybrid subassembly 110 uses an aluminum nitride substrate (typically 10 to 15 mils thick) which is epoxied or soldered to the baseplate 170 of the device package case 122. Certain embodiments of the baseplate 170 and lid 206 may be formed from ceramic, and other embodiments are formed from plated or solid metal. The optical assembly 210 acts as a high purity, high definition substrate for One embodiment of the ceramic wall portion 208 is formed from multiple ceramic layers (including, for example, the layers 172 and 174), as shown in the embodiment of FIG. 9. Each ceramic layer 172 and 174 has to be formed precisely. Each ceramic layer 172, 174 may be formed from a plurality (e.g., thirty or more) ceramic sublayers. To obtain the desired operation, it is important to consider the electrical characteristics of the materials used to form the ceramic wall portion 208. For instance, in one embodiment, cofired ceramics with very low dielectric constants at 20 GHz and above are selected for the ceramic layers 172 and 174 which increases the insulative electrical resistance between the various metalization layers.

The fabrication attributes of the ceramic must also be considered. Many circuits require complex electrical connections between various metalized layers layered on the ceramic layers 172 and 174. One embodiment of the metalized layer pattern is shown in FIGS. 12 and 13 with selected metalized vias 218 forming electrical connections between the metalized layers. This requires that the ceramic and the metalization be capable of being fabricated to very close dimensional tolerances. The metals used in the metalization process have to be compatible with the ceramic type and the method of processing. DuPont and Ferro are examples of companies that produce the types of ceramics that can be used in the ceramic layers 172 and 174 and the compatible metalization materials. An example of suitable ceramic material include DuPont 943 Green Tape (a low temperature cofired dielectric) with compatible DuPont HF500 series gold metal system.

The laminated configuration of the ceramic wall portion 208 combines with the backbone 204, the baseplate 170, and the lid 206 in the embodiment of device package 144 shown in FIG. 2 to provide a complete robust device package case 122 (and actually completes one embodiment of the Faraday cage). All of the components of the device package case 122 acting together, and not any particular component thereof, thus contribute to the robustness of the device package case 122.

The thermal aspects of the device package case 122 are also important. The baseplate 170 and the lid 206 may each be formed from a metallic material such as Kovar, molybdenum, copper laminate, or copper tungsten. Copper and aluminum also have high thermal conductivity, but are not effective because of their high coefficients of expansion. As such, the lid 206, the backbone 204, and the baseplate 170 become useful in dissipating the heat from miniaturized optical devices. The specific baseplate 170, lid 206, backbone 204, and/or ceramic wall portion 208 materials described herein are illustrative in nature, and are not intended to be limiting in scope.

The appropriate combination of thermal conductivity and coefficient of thermal expansion provides for a design balance for internal components of the device package case 122. The thermal conductivity applies especially to the baseplate 170 to allow transfer of heat from the internal components to the outside of the device package. Matched coefficients of thermal expansion are required to limit the creation of internal stresses and strains as temperature of the optical device varies. Operationally, the lead frame 176 (also known as a tie bar) integrally supports the electric lead interconnects 212 during the transport and assembly process. The lead frame 176 is trimmed off from the lead interconnects prior to use, and the lead interconnects are then individually formed. The electric lead interconnects 212 passing through the ceramic well portion 208, being metallic, have low electrical loss characteristics preferably under 0.0004 dB/in and the interface between the electric lead interconnects 212 and ceramic wall portion 208 represents a low electrical loss region. Electrical signals travelling over the electric lead interconnects 212 can therefore propagate over a long distance without excessive dissipation of the signal strength. Kovar or Invar can also be used for certain parts of the device package case 122.

ID. Surface Mounts

Figure 16:
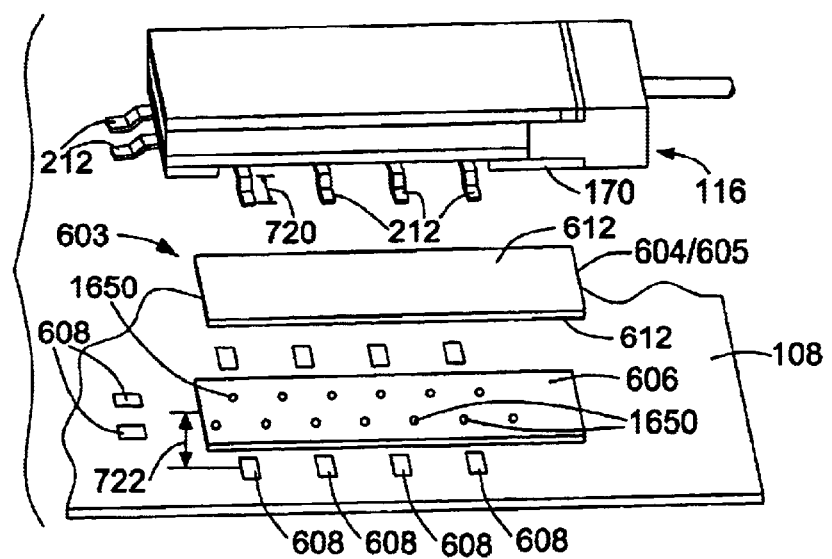
FIG. 16 shows a perspective exploded view of one embodiment of an optical device using a surface mount adhesive pad.
Figure 18:
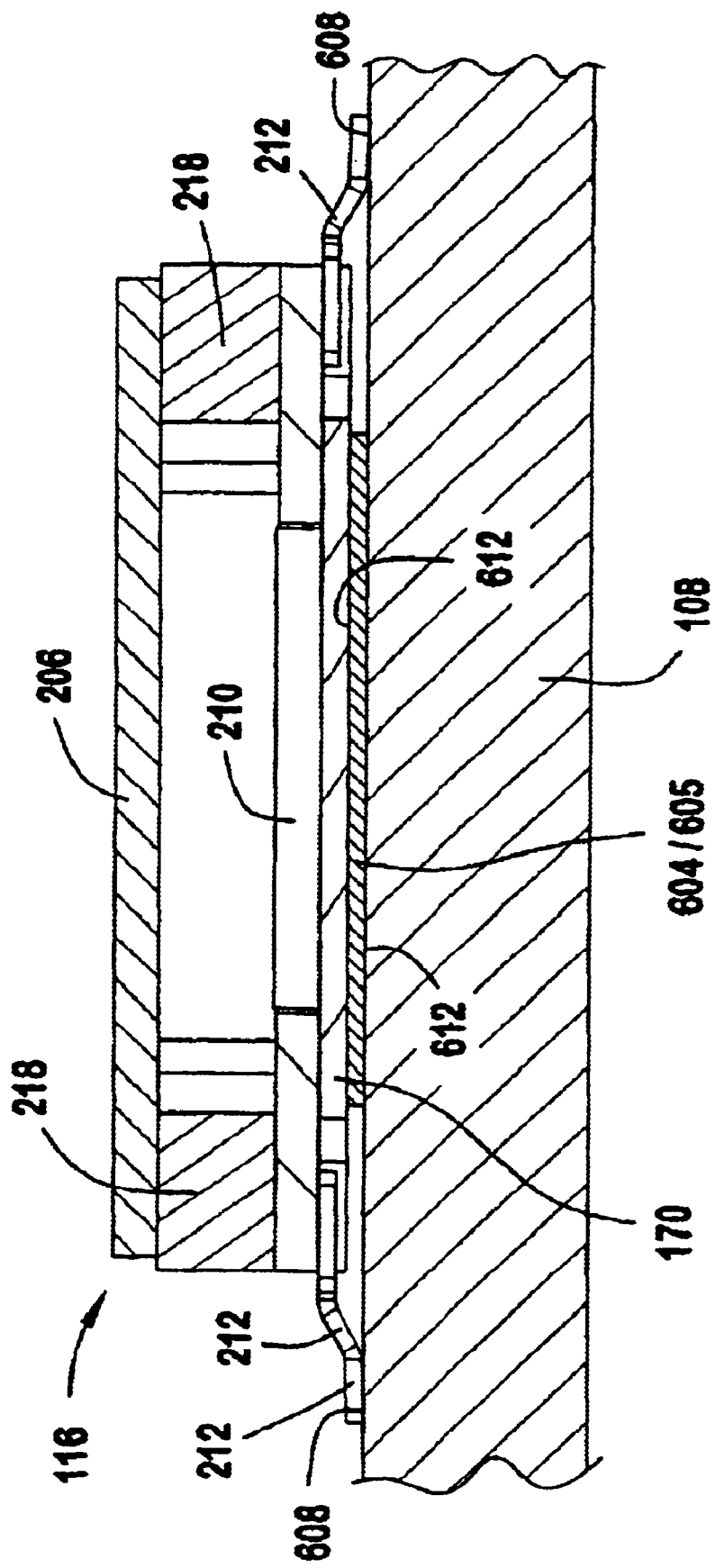
FIG. 18 shows a side view of one embodiment of a surface mount that secures an optical device.

This portion describes certain embodiments of surface mounts 603 for optical devices 116 (such as optical transmitters 112 and optical receivers 114) as shown in FIGS. 16 and 18. The surface mount 603 includes the optical device 116, a receiver adhesive pad 605 or a transmitter adhesive pad 604, an attachment region 606 located on the circuit board 108, and electrical connections 608 to which the electric lead interconnects 212 connect. The surface mount 603 acts to mechanically and electrically connect the optical device 116 to some portion of the device package case 122, as shown in FIG. 3 or some component within the device package. Surface mounts 603 can be configured to take into account a variety of design considerations such as thermal, electrical, and mechanical attachment and expansion, and/or optical considerations.

An attachment region 606, on which the surface mount is mounted, may be located on the circuit board 108, or alternatively as a separate platform on the device package case 122 as shown in FIG. 3. The circuit board 108 includes a substantially planar attachment region 606 that can be adhered to by the adhesive pad 605. Mechanical considerations involve physically securing the device package case 122 to the circuit board 108 and/or the casing 118, so that the optical fiber cable 120 can be secured and operatively positioned for the optical device 116. Electrical considerations provide for the necessary electrical coupling of electrical signals from outside of the device package case 122 of the optical device to the electrical hybrid subassembly 110 and optical subassembly 210 via the electric lead interconnects 212 and/or the electric traces 214.

Figure 17A:
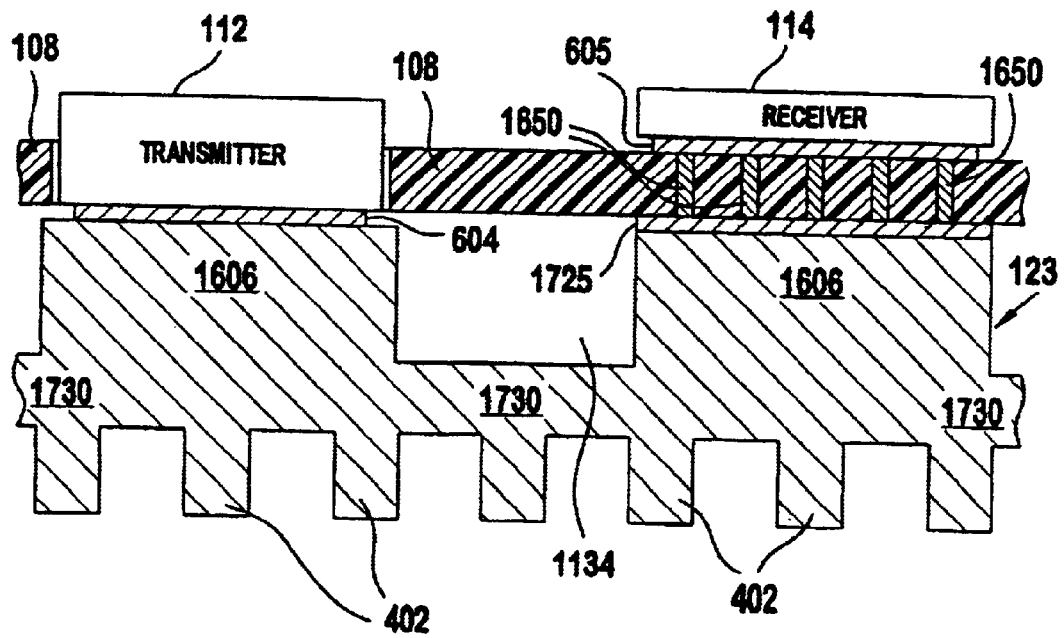
FIG. 17A shows a side partial cross-sectional view taken through the optical transmitter, the optical receiver, and a portion of the casing package as shown in FIG. 3.

FIG. 17A shows a cross-sectional view of one embodiment of the mounting of the optical transmitter 112 and optical receiver 114 secured within a portion of the housing case 123. The optical receiver 114 is mounted by the adhesive pad 605 to the circuit board 108. The circuit board 108 includes a plurality of thermal vias 1650 that extend from the attachment region 606 downwardly through the vertical height of the circuit board. The thermal vias 1650 transfer heat from the adhesive pad 605 downwardly to the thermal pads 1725.

The optical transmitter 112 (in comparison to the optical receiver) is not affixed relative to the circuit board 108. Instead the optical transmitter extends through the cut-away region 602 as shown in FIGS. 2 and 3, and connects via the attachment pad 604 directly to the housing 1606.

The housing case 123 includes a plurality of housings 1606, that support, and transfer heat downwardly from, the optical receiver 114. Located below the housing 1606, across a large range of the bottom of the housing case 123, are the plurality of heat sink fins 402. Between different ones of the plurality of housings 1606 (that may support, for example, the optical transmitter and the optical receiver) extends a plurality of connecting regions 1730 that additionally form part of the housing case package 123. The vertical height of the connection region 1730 is small compared to the vertical height of the housing 1606.

As such, the amount of heat that can be transferred from one housing 1606 to another housing (e.g., such a plurality of housings may support an optical receiver 114 and an optical transmitter 112), and thereby limit the amount of heat that flow between the housings. Since the amount of heat that can transfer between the different housing 1606 is limited by the dimension of the connecting region 1730, most of the heat that transfers from the optical device 116 via the thermal vias 1650 to the housing 1606 will continue downwardly to the heat sink fins 402. The base of the heat sink fins 402 are in contact with a surface that the housing case 123 is secured to (the surface should be thermally conductive) by securement fasteners 403, as shown in FIG. 2. As such, there is a thermal heat dissipation path from each device package case 122 through the housing case 123 to a surface external of the device package. This removal of heat from the optical device allows the optical devices to operate at cooler temperatures, thereby possibly enhancing the operation thereof as described herein.

Another embodiment of mechanical connection that includes an attachment region 606 for each optical device is shown in FIG. 16. The attachment regions 606 can be located on the circuit board 108 to provide separate surface mounts 603 for each optical device 116. The components of the optical transmitter 112 and the components of the optical receiver 114 may, in certain embodiments, be located in the same device package case 122. The components of the optical transmitter 112 and the optical receiver 114 include, respectively, electrooptical transmitter components and electrooptical receiver components.

One embodiment of the receiver adhesive pad 605 includes a copper pad that has a suitable adhesive coating 612 on both faces, as shown in greater detail in FIGS. 16 and 18. Such receiver adhesive pad 604 or transmitter adhesive pad 605 (or alternatively adhesive tape) are typically commercially available having peelable paper affixed to both faces (not shown), wherein the paper can be peeled away leaving the adhesive coating exposed on the face of the adhesive pad 604 or 605. In another embodiment, the receiver adhesive pad 604 can be formed from aluminum, that is as thermally conductive, though not as electrically conductive, as copper.

In one embodiment, the transmitter adhesive pad 604 used to secure the optical transmitter 112 is formed of different materials than the receiver adhesive pad 605 that is used to secure an optical receiver 114. Generally, receiver adhesive pads 605 that mount optical receivers 114 may be configured to be electrically conductive (e.g., 0–0.20 ohm/sq inch) as well as thermally conductive (e.g., 0.5–6.0 watts/m-K.) By comparison, transmitter adhesive pads 604 that mount optical transmitters 112 may be designed to be electrically insulative (e.g., $10^6$ ohm/sq inch) and thermally conductive (e.g., 0.5–6.0 watts/m-K.)

The receiver adhesive pad 605 (including the adhesive) is electrically conductive, and has good thermal characteristics. Copper, which forms the adhesive pad 605 for optical receivers, has very good electrical thermal characteristics among the metals. Their coat adhesive is applied to both planar faces of the adhesive pad 605 to affix the baseplate 170 to the attachment region 606 on the circuit board 108. The thin coat adhesive, while in one embodiment not in itself electrically conductive, is sufficiently thin so electrical current can flow there through. It may be necessary to form the thin coat adhesive of a sufficient cross-sectional area to provide the necessary electrical current flow. The adhesive pads 604 and 605 can be cut relative to, or formed in, a shape to accommodate their particular optical device 116.

The height of the adhesive pad 604 and 605 are related to certain configurations of the optical device 116. As such, the height of the adhesive pad 604 or 605 determines any designed difference in vertical height between the lower most surface of the receiver baseplate 170 or transmitter baseplate 202 and the lowermost surface of the electric lead interconnects 212.

In FIG. 16, a distance 720 represents the vertical distance between the lower most point of the electric lead interconnects 212 and the lower most portion of the device package case 122. Similarly, a distance 722 shows the vertical distance between the upper surface of the attachment region 606 and the upper surface of the electric contacts 608 on the circuit board 108. The distance 722 is often zero since the electric contacts 608 are often deposited at the same vertical height as the attachment region 606. Both distances 720 and 722 should be designed considering the prescribed thickness of the receiver adhesive pad 605 or the transmitter adhesive pad 604.

If the distance 720 is greater than the distance 722, and if the device package case 122 were attempted to be laid directly on the attachment region 606, then the lower-most portion of the electric lead interconnects 212 would actually contact the electric contact 608 thereby spacing the lower most surface of the device package case 122 from the attachment region 606. The distances 720 and 722 compensate for vertical height of the adhesive pad 604 or 605. For example, assuming that the adhesive pad 604 or 605 has a vertical height of 5 mils the combined distances 720 and 722 would be selected to equal 5 mils.

By using optical devices that are configured so the difference in distances 720 and 722 match the prescribed height of the adhesive pad 604 or 605; the electric lead interconnects 212 contact the electric contact 608 when the device package case 122 is secured to the adhesive pad 604. Such contact of the electric lead interconnects 212 to the electric contacts 608 allows for relative positioning therebetween that enhances rapid and effective soldering of the electric lead interconnects 212 to the electric contacts 608.

The distance 720 may change as the electric lead interconnects 212 are flexible to deflect under light loads. Such flexibility of the electric lead interconnects 212 may be desired so that the electric lead interconnects 212 are physically biased against the electric contact 608 as the device package case 122 is mounted to the attachment region 606 using the adhesive pad 604. Such biasing may obviate the need for soldering, or alternatively, to enhance the effectiveness of the soldering to provide an effective electric contact. If the electric lead interconnects 212 are flexible, however, then the thickness of the pad is determined with distance 720 represented by the electric lead interconnects 212 positioned in their respective deformed, or flexed, positions. The strength of the adhesive coating both the planar faces of the adhesive pad 604 or 605 has to be selected to be sufficient to secure the device package case 122 so each of the electric lead interconnects 212 is in its flexed position.

Compression of the adhesive pad 604 or 605 in the vertical direction is limited, since the adhesive pad has a limited spring constant and is relatively thin (in one application, the pad is 4.4 mils thick). The electric lead interconnects 212 may have a certain amount of spring bias. As the optical device 116 is mounted to the attachment region 606, the electric lead interconnects 212 will deform so the electric lead interconnect 212 is biased against its respective electrical contact 608. This spring bias connection is in lieu of, or in combination with, a soldered connection.

Once the optical transmitter 112 or optical receiver 114 is affixed using the receiver adhesive pad 605 or the transmitter adhesive pad 604, a separate electrical contact 608 is established for each of the electric lead interconnects 212 to the respective electric contact 608. In one embodiment, the electric lead interconnects 212 are soldered to electrical contacts 608 formed in the circuit board 108 using localized heat. To effect such soldering of the electric lead interconnects 212 to the electric contact 608, the user could solder each electric lead interconnect individually using that source equipment and solder materials, a laser, solder paste, or a variety of other soldering techniques. Certain electrically conductive adhesives, glues, or epoxies such as Ablebond 967-1 may be used to mechanically secure and electrically couple the electric lead interconnects 212 to their respective electrical contact 608.

Each electric lead interconnect 212 of the device package electrically connects to one electric contact 608 formed on the circuit board 108 as shown in FIG. 16. The electric contact 608 forms a portion of an electronic mateable connector 140 as shown in FIGS. 2, 3, and 16. After the device package case 122 is secured to the circuit board 108 using techniques described herein, the electric lead interconnects 212 are individually attached to their respective electric contacts 608 located on the circuit board 108 by soldering techniques. The device package case 122 does not have to be heated during the soldering. The temperature of the optical device package case 122 thus can be maintained within a relatively low desired range during the securing of the device package case 122 of the optical device 116 to the attachment region 606. It is desired to limit the heat applied to the device package case 122 to maintain the operational characteristics of the optical device 116. The surface mount 603 therefore satisfies certain mechanical, thermal, electrical, and optical needs for optical devices 116. The design of the optical device 116 can be optimized to provide effective operation as well as to provide desirable optical, thermal, mechanical, and electrical characteristics. Surface mounts 603 can be used regardless of the operating frequency of the particular optical device 116.

IE. Optical Device Removal Tool

This section describes an optical device removal tool 900 for removing optical devices secured by surface mounts 603. Mechanically, the adhesive pad 604 or 605 acts to secure the optical device 116 to the attachment region 606 of the circuit board 108. At some point in time, either during manufacture or service, it may be desired to remove the optical device 116 (e.g., the optical transmitter 112 or the optical receiver 114) without damaging either the circuit board 108 or the optical device 116. An optical device removal tool 900, as shown in FIG. 19, can remove the optical device 116 secured with the adhesive pad 604 or 605 to the attachment region 606. It may be desired to remove the optical device 116 to replace, repair, upgrade, or modify the optical device 116. It may be especially desirable to replace the optical devices for repairability and/or failure analysis, but additionally the optical device removal tool 900 could be used for device upgrades, etc.

Figure 19A:
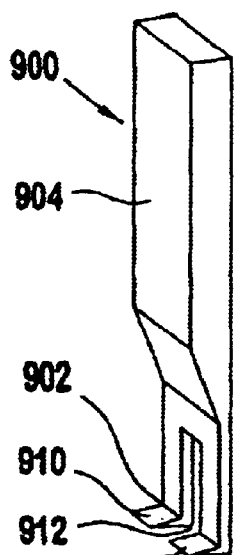
FIG. 19A shows a perspective view of one embodiment of an optical device removal tool.
Figure 19B:
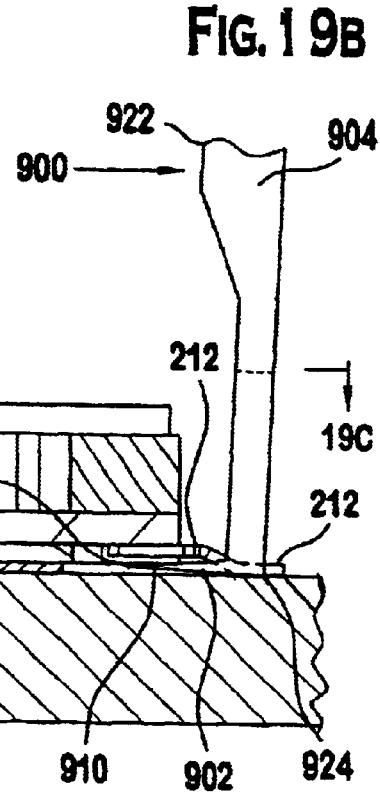
FIG. 19B shows a side view of the optical device removal tool being used to remove an optical device from a circuit board.
Figure 19C:
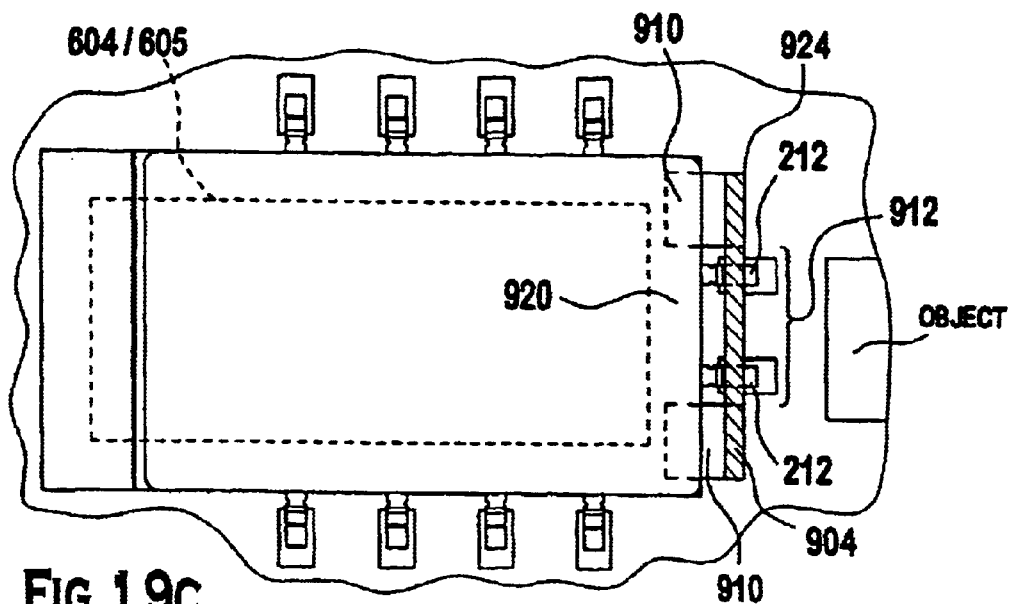
FIG. 19C shows a top view of FIG. 19B.

In time the adhesive in the adhesive pad 604 or 605 sets up, and it becomes difficult to separate the optical device 116 from the circuit board 108. The embodiment of the optical device removal tool 900 shown in FIG. 19 has the shape of a miniscule crow bar, a knife, or other shape that allows for a peeling or prying action. FIG. 19A shows a perspective view of one embodiment of optical device removal tool 900. The optical device removal tool 900 includes a peeling blade 902 and a handle 904. The peeling blade 902 extends substantially perpendicular to the handle 904 so as shown in FIG. 19C, the relatively small peeling blade, and not the handle, is proximate a footprint 940 in the congested circuit board 108 during removal of the optical device 116. There cannot be any optical components positioned in the footprint that the peeling blade 902 is configured to operate within. The peeling blade 902, in one embodiment, includes a plurality of fork portions 910 that surround a cavity 912. The cavity extends into the handle 904, and is designed to fit around or straddle the leads 212 as shown in FIG. 19B and 19C, such that the fork portions 910 do not physically contact and damage the sensitive leads 212 during removal of the optical device 116. The optical device removal tool 900 may be several inches long so that the user can securely grip the handle 904 of the tool during the peeling or prying action. However, the base dimension w1 of the fork portions 910 is sufficiently small to fit on a correspondingly small area on the board, such that use of the tool does not damage other devices on the board during the prying action. The adhesive pads 604 or 605 as shown in FIG. 19B and 19C may be configured to have a smaller dimension than the optical device 116, thereby permitting the fork portions 910 to fit within an overhang portion 920. Movement of the handle 904 as indicated by arrow 922 thereby causes the fork to apply an upward force against the optical device 116 at the overhang portion 920, therefore prying the optical device 116 away from the circuit board 108. The length of the handle 904 is considerably larger than that of the fork 910, and therefore as the force is applied to the handle 904, a pivot point 924 is created causing an increased force to be applied to the for portions 910.

Prior to use of the optical device removal tool 900 to remove the optical device 116 from the circuit board 108, however, the solder connections that mechanically and electrically secure the electric lead interconnects 212 to the electrical contacts 608 on the circuit board 108 have to be broken. To break the solder connections, the circuit board 108 may be heated above the temperature at which the solder melts, but below the temperature that would cause any permanent damage to electric lead interconnects 212 or to the device package case 122. Any technique that breaks the solder connections may be used. After this breaking of the solder, the electric lead interconnects 212 are physically separated from the respective electrical contacts 608 to which they have been soldered, adhered, or otherwise attached.

To break the mechanical attachment between the optical device 116 and the attachment region 606 on the circuit board 108, the optical device removal tool 900 first separates a small portion of the adhesive pad 604 or 605 from the attachment region 606. Another knife tool, such as an exacto-knife, may then cut away a portion of the adhesive pad 604 or 605 at a location on the adhesive pad that is separate from where the optical device removal tool initially pried a portion of the attachment pad 604 or 605 (e.g., on an exposed end). The prying action by the optical device removal tool 900 acts to decrease the cutting force necessary to remove the optical device. The fork portions 910 optical device removal tool 900 are designed to be very narrow so as not to interfere with other components that are physically positioned adjacent to the removed optical device 116. Less force (and less resultant damage) is necessary to remove an adhesive-attached planar object (such as the optical device 116) affixed to a surface by peeling the planar adhesive at one edge than to shear the entire planar surface. Use of the optical device removal tool 900 limits the risk of damage to the circuit board 108 and optical device by shearing. With the peeling action, an edge portion of the adhesive pad 604 or 605 is peeled using the peeling blade 902. The optical device removal tool 900 can be used to pry the remainder of the optical device 116 from the circuit board 108. After removal of the optical device 116 from the circuit board 108, the optical device removal tool 900 can remove the adhesive pad 604 or 605 from the circuit board 108 or the optical device 116 to which it remains affixed.

When an optical device 116 is peeled and pried from the circuit board 108, certain forces are generated within both the optical device 116 and the circuit board 108. These forces may include one or more torsional and/or shear forces. The circuit board 108 and the optical device 116 are both designed to have sufficient strength to resist any force that would be reasonably applied by the optical device removal tool 900 during this removal process. The prying action should not be applied to a metalization region (such as the electric lead interconnects 212) that could be damaged. The forks 910 of the optical device removal tool 900 thereby actually straddle the electric lead interconnects 212 during operation. Components are positioned so as not to be located close to the electric lead interconnects 212 to limit the possibility of the components being damaged during removal.

IF. Optical Bench

Figure 20A:
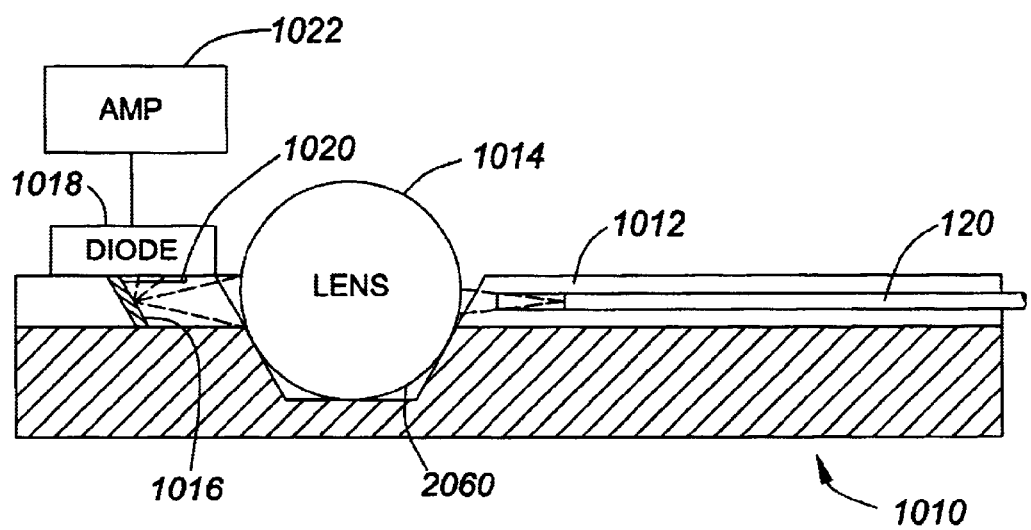
FIG. 20A shows a cross-sectional view of one embodiment of a receiver optical bench.
Figure 20B:
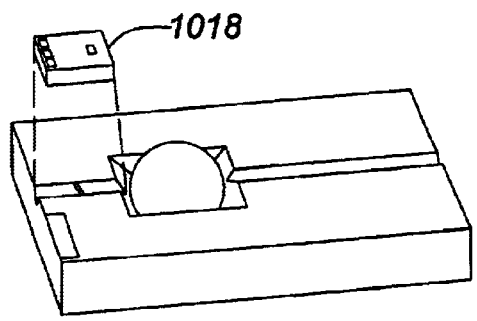
FIG. 20B shows a perspective view of the receiver optical bench shown in FIG. 20A.

Many embodiments of optical subassemblies 210 include an optical bench 1010, (one embodiment shown in FIGS. 20A and 20B). There are two embodiments of optical bench described in this disclosure. A receiver optical bench 1010 is described in this section that secures those optical components that receive light, and convert the light into electrical energy as described relative to FIGS. 20A and 20B. A transmitter optical bench, or header, 1108 as shown in FIGS. 21, 22A, 22B, 22C is designed to support a laser (and other necessary components) that translate an electrical signal into light. The different embodiments of optical bench 1010 and 1108 are illustrative in nature, and not limiting in scope, and illustrate that optical benches must be configured to encounter a wide variety of applications, conditions, and environments.

The receiver optical bench 1010 includes a V-groove 1012, a lens 1014, a turning mirror 1016, and a photodiode 1018. The receiver optical bench 1010 acts like a fixture that securely holds and relatively positions/aligns the various components 1012, 1014, 1016, and 1018 within the device package case 122. The receiver optical bench 1010 adds a great deal of structural stability to the components supported therein. In the receiver optical bench 1010 shown in FIGS. 20A and 20B, light travels through the optical fiber cable 120 located in the V-groove 1012, exits the optical fiber cable 120, and is directed at the lens 1014 which focuses the light. The focused light is reflected off the turning mirror feature 1016 integrated in the receiver optical bench 1010. The light reflects from the turning mirror 1016 and strikes the photodiode 1018 on the bottom side. The light is absorbed by the photodiode 1018, and is converted into an electrical signal.

The photodiode 1018 is affixed to the receiver optical bench 1010. In one embodiment, the photodiode 1018 is secured above the turning mirror feature 1016 by, e.g., soldering. In one embodiment the photodiode 1018 is bonded directly to the receiver optical bench 0110. The lens 1014 is positioned in a cavity 2060 formed in the receiver optical bench 1010. The optical fiber cable 120 is inserted in the V-groove 1012 during assembly. The positioning of the different components within the receiver optical bench 1010 produce the optical alignment. The photodiode 1018 and the optical fiber cable 120 are positioned accurately. In one receiver optical bench 1010 application, optical fiber cable arrays can be spaced using receiver optical benches 1010. One embodiment of a receiver optical bench 1010 can be produced as one integral block of material such as silicon, instead of multiple blocks. The one embodiment of the receiver optical bench 1010 is made primarily of silicon in which the turning mirror feature 1016 is coated with a metalization material to provide a reflective surface. Chrome-nickel, gold, etc., or alternatively any optically reflective metalized material that can be coated could be used for the metalization of the turning mirror 1016.

Precise dimensional features and accuracy, low coefficients of thermal expansion, and good thermal conductivity are desired attributes for optical benches. As such, the embodiment of the receiver optical bench 1010 or transmitter optical bench 1108 uses silicon which is structurally robust, in ready supply, can be accurately etched and machined, can be patterned with metalization, and is inexpensive. V-grooves 1012 may be formed in the silicon using anisotropic etching in which the material of the receiver optical bench 1010 or header or transmitter optical bench 1108 is etched at different rates along different directions, depending on the crystalline structure of the material (such as silicon). Anisotropic etching can produce etched surfaces that are exceptionally smooth and planar. Various other techniques can be used to shape silicon and other semiconductors for an receiver optical bench 1010 or the transmitter optical bench 1108. For example, a silicon carbide cutting tool may be used to cut the receiver optical bench 1010 or the transmitter optical bench 1108, or certain etching techniques may be applied.

The photodiode 1018 straddles the turning mirror feature 1016 formed in the receiver optical bench 1010. The photodiode 1018 is preferably rear-illuminated to enhance performance, but can be front-illuminated. Rear-illuminated photodiodes 1018 are preferred for superior responsivities (micro-amps of current generated when subject to a given quantity of light energy in watts) and lower capacitance (faster response time) of the photodiode 1018. An amplifier 1022 is in electrical connection with the photodiode 1018 to amplify the signal produced by the photodiode 1018. The photodiode 1018 and the amplifier 1022 are located close together to minimize signal transmission distance.

A native oxide can be grown upon the surface of the etched silicon to provide an insulative passivation layer upon which metalization can be deposited for the purposed of circuit interconnection. Electric traces, shown in FIG. 22 may, or may not be, formed on the material of the receiver optical bench 1010 or the transmitter optical bench 1108. Silicon can be doped for different bulk resistivity: very high resistivity (greater than 10,000 ohms per square), high resistivity (greater than 1000 ohms per square), low resistivity (greater than 10 ohms per square but less than 1000 ohms per square) and pure intrinsic silicon (less than 10 ohms per square). If the silicon substrate structure is a base for simple electrical interconnections, low resistivity silicon may be used. Silicon material with a relatively low resistivity, under most conditions, would be too lossy to provide good high frequency electrical conductivity. In the current embodiment, the receiver optical bench 1010 or transmitter optical bench 1108 does not rely on running high frequency electric traces 214 on the silicon. However, in another embodiment, high resistivity or very high resistivity silicon material could be used and with a proper configuration could be made to function properly.

The receiver optical bench can be configured as single blocks or alternatively from multiple blocks. Multiple ones of the blocks can be fabricated to increase heat dissipation, such as where the receiver optical bench supports a laser. The receiver optical bench 1010 or transmitter optical bench 1108 may be fabricated from a plurality of assembled "building block" parts that are fabricated to precise dimensional tolerances. Silicon is most adaptable for receiver optical bench 1010 or transmitter optical bench 1108 processing due to its capability of being machined and etched to very close tolerances. The alignment of the components within the optical benches 1010 or 1108 can be relatively simple, and can even be performed passively. An assembled optical bench can use precision etching to provide component mounting locations. Active alignment of optical benches 1010 or 1108 may require the biasing of the optical diode (the laser or the photodiode), monitoring of the output of the optical device based on the biasing the optical diode, and positioning the fiber or lens system or other optical elements to optimize optical performance. Passive alignment of optical benches 1010 or 1108 requires the accurate placement of the components without application of any bias to the laser or the photodiode. In one embodiment using the receiver optical bench 1010, such passive alignment occurs solely by physical placement of a first set of known features on the optical diode relative to a second set of features on the silicon bench. Such optical fibers 120 may be placed into the v-groove 1012 using passive placement techniques and subsequently aligned passively or actively as described herein. They may then be secured in place using laser welding, soldering and/or adhesives following passive alignment or active alignment.

The use of the optical benches 1010 increases the performance capabilities of the optical device. There are component and structural variations between an optical bench to be used for the optical transmitter 112 and an optical bench to be used for the optical receiver 114. For example, the optical bench used for an optical receiver 114 primarily supports the photodiode. Similarly, the optical bench used for an optical transmitter supports a laser and/or a feedback photodiode monitor as described herein that is not included in the receiver optical bench 1010.

Figure 21:
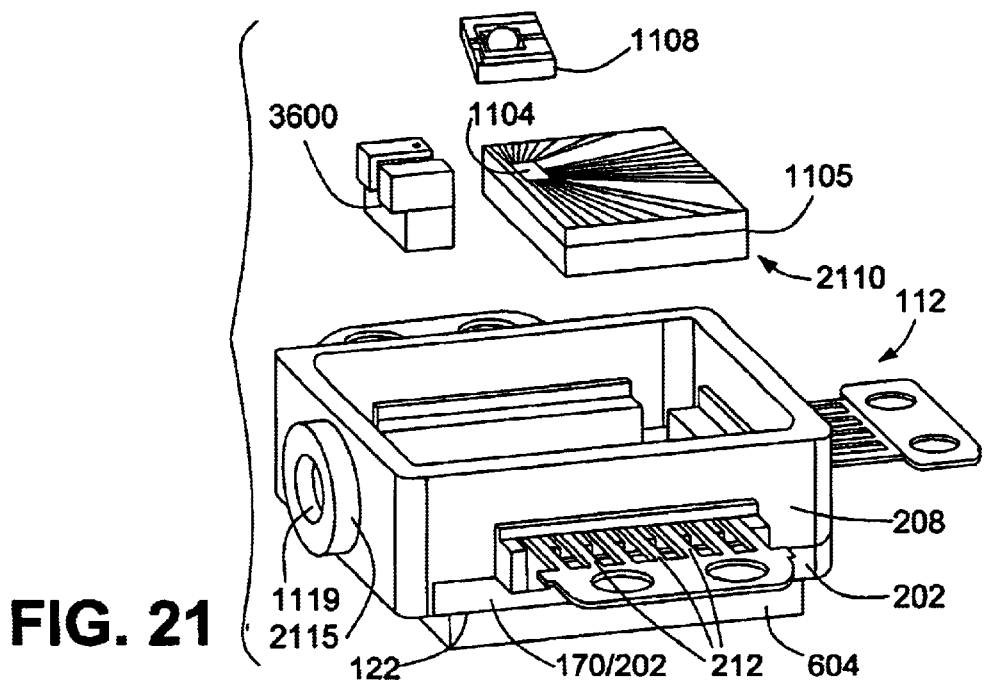
FIG. 21 shows a perspective view of one embodiment of an optical transmitter, in which certain components are shown in an exploded position.

An aluminum nitride or similar substrate material 1105 of FIG. 21 mounted on the baseplate 202, may house electronic components. The aluminum nitride substrate and the baseplate 202 are both thermally conductive, and thus provide for heat dissipation from the electronic components. Other materials can be selected to house the electronic components.

The thermal effectiveness of epoxies or adhesives are limited especially if the epoxy is more than e.g., one-thousandth of an inch thick. As such, the thickness of the epoxy may be limited to below such a prescribed value. The aluminum nitride substrate and the epoxy layer are both selected to be thermally conductive.

This disclosure has been directed to a variety of aspects of optical device 116 including that apply to an optical transmitter 112, an optical receiver 114, or an optical transponder 100. For example, the Faraday cage 840 configuration shown in FIG. 8 can be applied to either an optical receiver 114 or an optical transmitter 112. Similarly, the surface mount 602 described herein can be applied to the device package case 122 for either an optical transmitter 112 or an optical receiver 114. Additionally, the general configuration of the optical device 116 including the lid 206, the baseplate 170, the backbone 204, and the ceramic wall portion 208 may be applied to either an optical transmitter 112 or an optical receiver 114. The optical bench 1010 may also be applied to either an optical transmitter or an optical receiver. For instance, FIGS. 20A and 20B show an optical bench for an optical receiver configuration. By comparison, the header or transmitter optical bench 1108 shown in FIGS. 22A and 22B may be considered as an optical bench for an optical transmitter.

II. Optical Transmitter

Figure 22A:
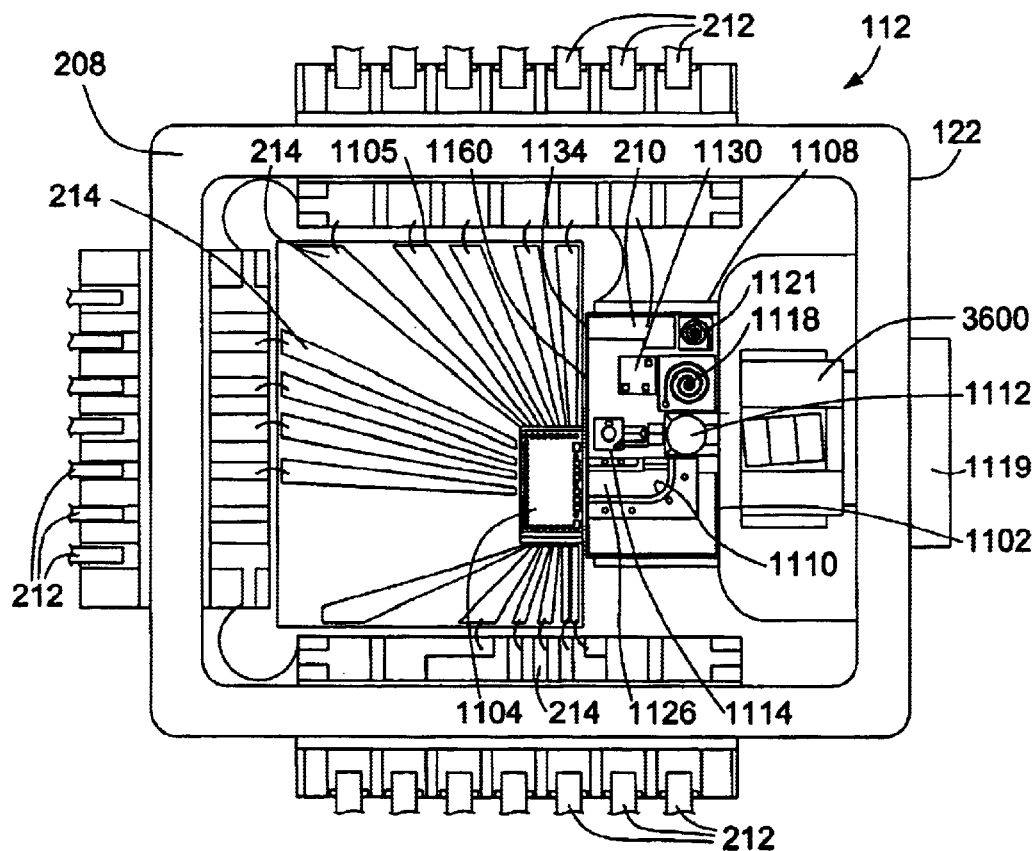
FIG. 22A shows a top view of one embodiment of the components within an optical transmitter.
Figure 22B:
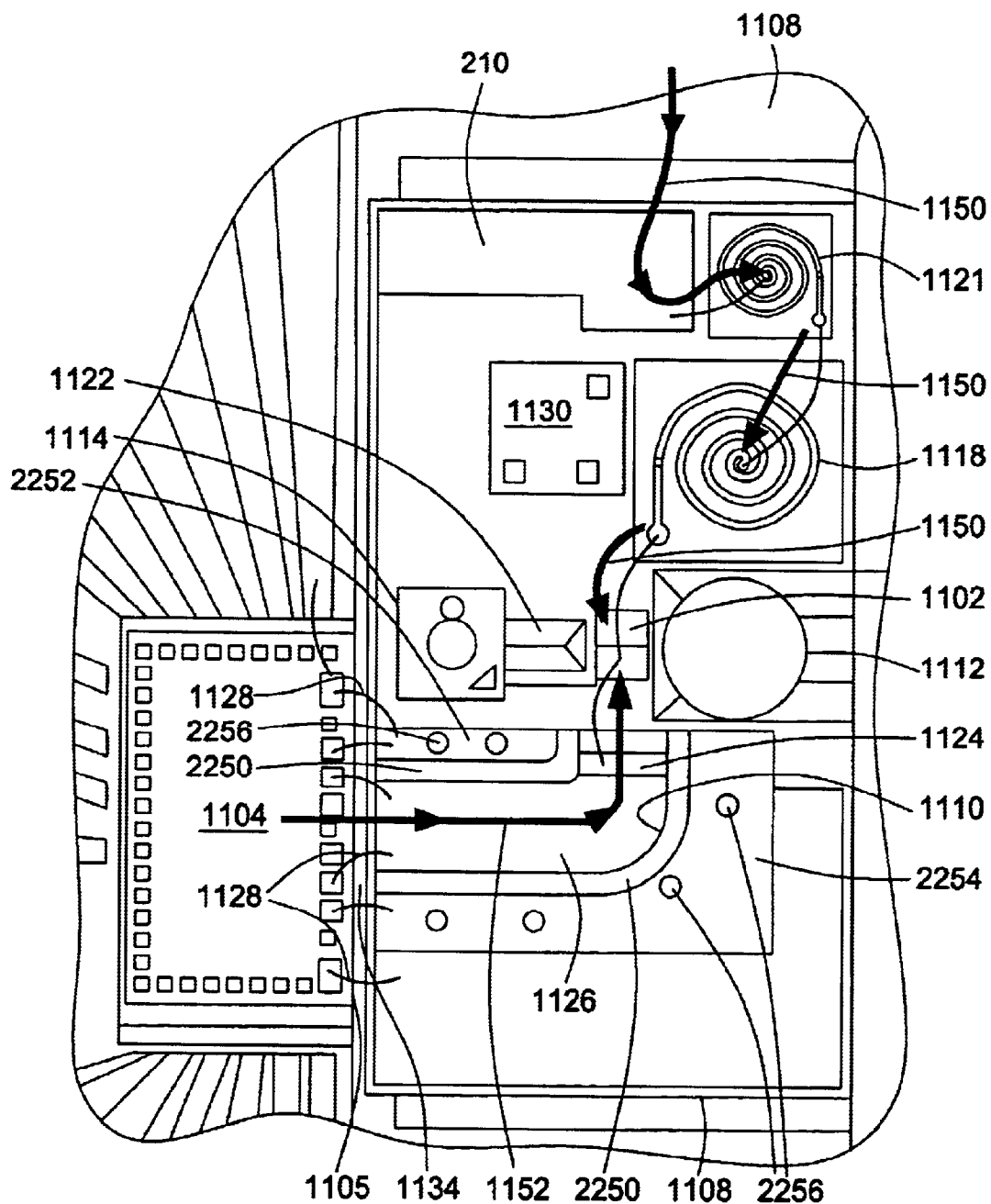
FIG. 22B shows an expanded view of one embodiment of certain ones of the components in the optical transmitter shown in FIG. 22A.

This segment of the disclosure is directed particularly to certain aspects and embodiments of optical devices 116 configured as optical transmitters 112 that include a laser 1102 described particularly relative to FIGS. 22B, 27B and 27C. One aspect relates to the components that are located on the header or transmitter optical bench 1108 that support the laser 1102. One aspect relates to sinking heat away from the laser 1102 within the optical transmitter 112. Another aspect relates to forming air trenches between a header or transmitter optical bench 1108 that support the laser 1102 and a hybrid subassembly 1105 that supports a laser driver 1104. Yet another aspect relates to various configurations of coplanar waveguides that transmit an electric signal from the laser driver 1104 to the laser 1102. Another aspect relates to the configuration of optical isolators. These aspects are described below.

IIA. Optical Transmitter Configuration

The embodiment of optical transmitter 112 shown in FIGS. 21, 22A. 22B, and 22C includes the header or transmitter optical bench 1108; the hybrid subassembly 1105; a lens 1112; a second lens 1119; an isolator assembly 1129; and a co-planar waveguide 1126. The header or transmitter optical bench 1108 supports and provides a heat sink for the laser 1102. The hybrid subassembly 1105 supports and provides circuitry for the laser driver 1104. The optical isolator assembly 1129 is located between the two lenses 1112 and 1119 and prevents reflections from the optical network 106 from re-entering the laser and degrading optical performance. The lens 1112 columnmates the coherent light emitted from the laser and lens 1119 refocusses the light onto the optical fiber cable 120.

The laser driver 1104 imparts sufficient electrical energy to a lasing medium in the laser 1102 to cause the laser to generate coherent light by lasing action. The laser 1102, the laser driver 1104, and certain other components will generate a considerable amount of heat during the lasing operation within the optical transmitter 112. Therefore, the header or transmitter optical bench 1108, the hybrid subassembly 1105, and certain other components of and within the device package 122 case of the optical transmitter 112 (and housing case 123 of the optical transponder 102) are configured to dissipate thermal energy through passive conductive heat sinking. Such passive conductive heat sinking dissipates heat from the laser 1102 and the laser driver 1104 through the device package case 122 and the housing case package 123.

Figure 22C:
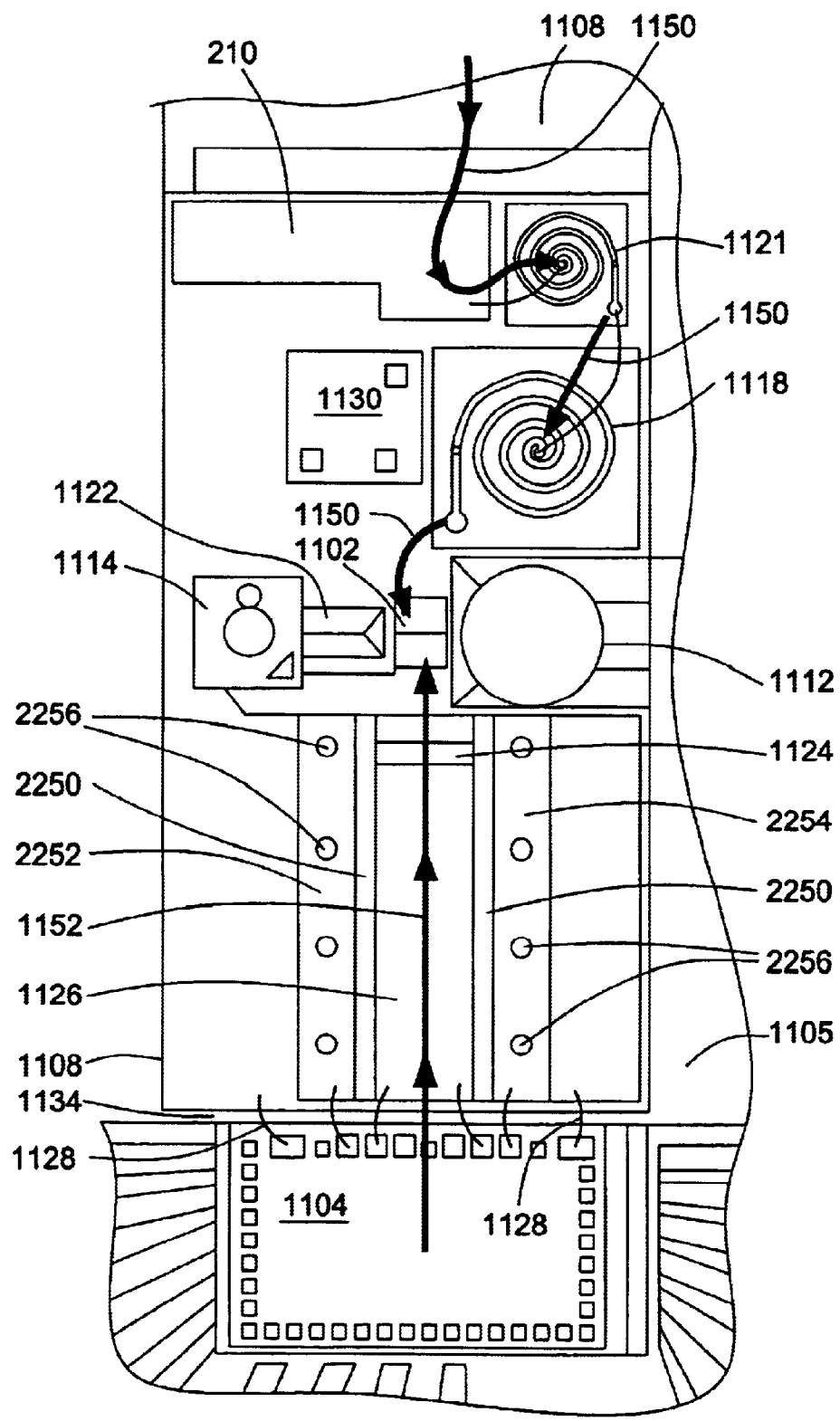
FIG. 22C shows an exploded view of another embodiment of certain ones of the components in the optical transmitter shown in FIG. 22A.
Figure 22D:
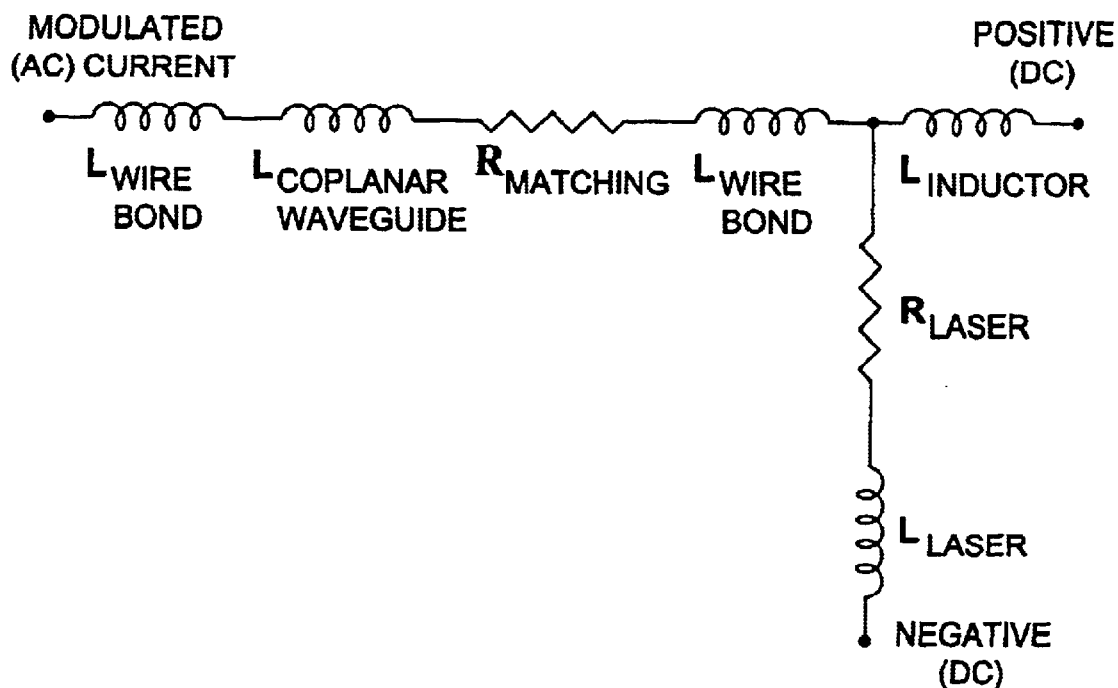
FIG. 22D shows a generalized circuit diagram of certain components of the optical transmitter as shown in FIGS. 22A, 22B, and 22C.

There are a variety of power sources that supply power to the laser 1104 including alternating current (AC) electric input and direct current (DC) electric input. The hybrid subassembly 1105 supports the laser driver 1104. Additionally, the hybrid subassembly 1105 supplies DC and RF electrical signals to the header or transmitter optical bench 1108, and eventually to the laser 1102. The arrow 1150 shown in FIG. 22B and 22C shows the path of current to provide the positive DC electric input to the laser. The arrow 1150 passes through an electric contact 1149 and a pair of inductors 1118 and 1121 (which as an RF filter) to provide the DC electric input to the laser 1104. In one embodiment, an AC signal (e.g., R.F., microwave, etc.) generated by the laser driver 1104 is directed at a coplanar waveguide 1126. The arrow 1152 shown in FIG. 22B and 22C shows the path of the AC electric current through the components to provide the AC electric input to the laser. The arrow 1152 passes through the laser driver 1104 and the coplanar waveguide 1126 to provide the AC signal to the laser 1104. The combined AC and DC signals are capable of applying sufficient electrical energy at the laser 1102 wherein the laser 1102 lases and emits light.

The header or transmitter optical bench 1108 is densely populated with such passive electric components as the inductors 1118 and 1121, the co-planar waveguide 1126 and an integrated matching resistor 1124. Such dense population limits the electrical signal transmission period to the laser.

The laser is capable of emitting light from both the front facet (to the right of the laser 1104 shown in FIGS. 22A and 22C) and the backside facet (to the left of the laser as shown in FIGS. 22A and 22C). The forward direction and the rearward direction are substantially colinear and follow a lasing axis. Light emitted by the laser 1102 in a forward direction is directed towards the lens 1112. In one embodiment, the laser driver 1104 is oriented so its projected energy is substantially parallel to the lasing axis of the laser 1102. Light emitted rearward from the laser is directed to the photomonitor 1114. The AC amplitude and the positive DC bias applied to laser is varied based on the output of photomonitor 1114, and the temperature sensor 1119 described below. The photomonitor 1114 and the temperature sensor 1119 are active components located on the header or transmitter optical bench 1108, but they are not high bandwidth components. RF components mounted on the header or transmitter optical bench 1108 may include, e.g., one or more inductor coils 1118, 1121, co-planer waveguide 1126 and/or laser 1102. The header or transmitter optical bench 1108 may be made of a material such as silicon, sapphire, aluminum nitride, diamond or other material that allows for the desired physical attributes: ease of fabrication and metalization patterning, low thermal expansion, high heat transfer, precise physical geometries, and suitable electrical properties. Features, such as V-grooves and metalization features may be precisely formed on, and in between, the header or transmitter optical bench 1108 by etching or other means a previously described. The laser 1102 is positioned relative to the lens 1112 and affixed onto the header or transmitter optical bench 1108.

Due to the relative position of the laser 1102 and the lens 1112, light emitted from the front of the laser 1102 is directed toward the lens 1112 and is collimated by the lens 1112. Light passes through the optical isolator assembly 1129. After light passes through the isolator assembly 1129, the light passes through a second lens 1119 where the light is refocused and coupled into the optical fiber cable 120 and hence is transmitted over the optical fiber cable 120. The positions and characteristics of lenses 1112 and 1119 are selected based on the dispersion angles of the laser 1102 and the desired focal distance for the fiber 120. The header or transmitter optical bench 1108 components are precisely positioned relative to other optical transmitter 112 components to provide acceptable alignment of the light paths and device operation.

Different embodiments of the laser 1102 include a distributed feedback (DFB) laser, a Fabry-Perot (FP) laser, or other similar type of semiconductor-based laser. The semiconductor-based laser 1102 may be arranged having a low profile (the laser 1102 is relatively short), therefore the device package case 122 containing the laser 1102 can thus also be relatively small. The laser driver 1104 is mounted on the hybrid subassembly 1105 of the optical transmitter 112 to provide an effective modulation source. The photomonitor 1114 is mounted on the header or transmitter optical bench 1108 behind the laser 1102 in the embodiment shown in FIGS. 22B and 22C.

IIB. Coplanar Waveguide

The coplanar waveguide 1126 transmits the AC (e.g., RF) signal from the laser driver 1104 to the laser 1102. The coplanar waveguide 1126 thus extends from the laser driver mounted on the hybrid subassembly 1105 to the laser 1102 mounted on the header or transmitter optical bench 1108. The coplanar waveguide 1126 may be considered as not acting as a waveguide in an optical sense, but instead as a waveguide in the AC or microwave sense since the coplanar waveguide can transmit the high-frequency signals from the laser driver 1104 to the laser 1102 with low electrical loss and low electrical reflections. The coplanar waveguide 1126 is configured to adapt to the relative positions of the laser driver 1104 and the laser 1102. The coplanar waveguide 1126 may, thus, be straight, curved, angled, or a variety of different configurations. It is desired to minimize the electric transmission loss through the coplanar waveguide 1126. Typical high speed (radio frequency) transmission line theory can be used to compute the required characteristic geometries required for a selected substrate material. Software programs exist to assist in the computation and analysis of these characteristic geometries. Another technique that minimizes the transmission loss is to make all transitions and turns of the coplanar waveguide 1126 as gradual as possible. For example, jagged surfaces, sharp angles and radical constrictions should be avoided in the waveguide surface 2252 of the coplanar waveguide. The coplanar waveguide 1126 includes a support substrate 2254, the waveguide surface 1126, a pair of electric insulator strips 2250 that define respective opposed outward return field planes of the waveguide surface 2252, a pair of electric contact locations 2252, and a plurality of ground vias 2256. The coplanar waveguide 1126 has different configurations depending on the relative location of the laser driver 1104 and the laser 1102. There are a variety of coplanar waveguide designs that are described herein. In FIG. 22B, for example, the coplanar waveguide 1126 curves 90 degrees in a horizontal plane. The curves surface 1110 has a full radius shape to minimize electrical reflections of the electric energy provided by the laser driver 1104 at the laser. Alternatively, an arc or parabolic shape could be used for alternate configurations. The embodiment of the coplanar waveguide 1126 shown in FIG. 77B is angled through 90 degrees to accomplish multiple features. The 90 degree curve allows the transmission of an AC signal from the laser driver 1104 along the path indicated by arrow 1152 to the laser 1102 to be directed on a low-loss element from the laser driver 1104 to reach the laser 1102 with a minimum signal perturbation. The channeling within the coplanar waveguide 1126 keeps all the high frequency signals intact, robust, and very pure into the laser 1102. Additionally, the 90 degree curve allows the laser driver 1104 to be positioned on an opposed side of a vertical air trench 1134 from the laser 1102. This separation of the laser 1102 from the laser driver 1104 by the vertical air trench 1134 allows the laser to operate cooler, as described herein. Additionally, the selected geometry permits integration of a matching resistor 1124 into the co-planar waveguide at a location very close to the laser 1102. The matching resistor 1124 is mounted adjacent to the laser 1102 creating a matched circuit based on the resistance of the matching resistor 1124 and the laser 1102.

Figure 28:
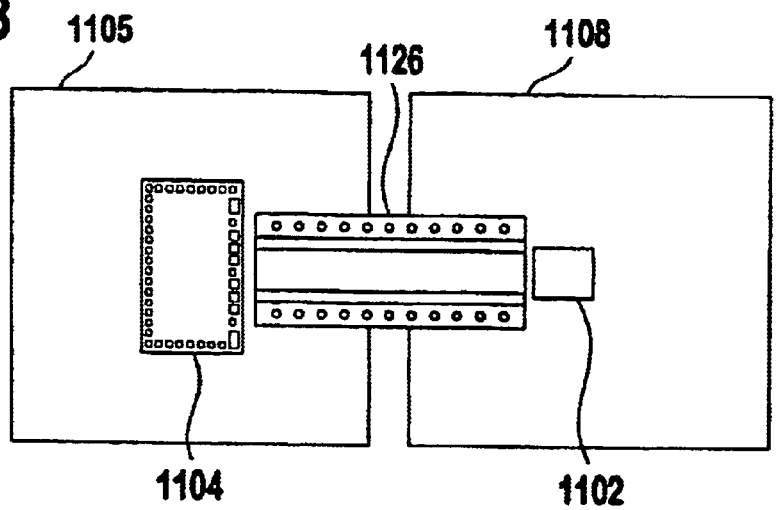
FIG. 28 shows a top view of a laser and laser driver configuration for the optical transmitter.
Figure 29:
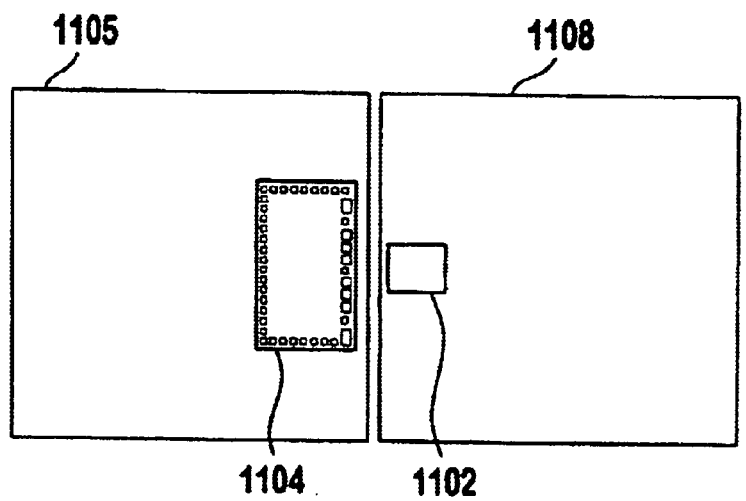
FIG. 29 shows a top view of another laser and laser driver configuration for the optical transmitter.
Figure 30:
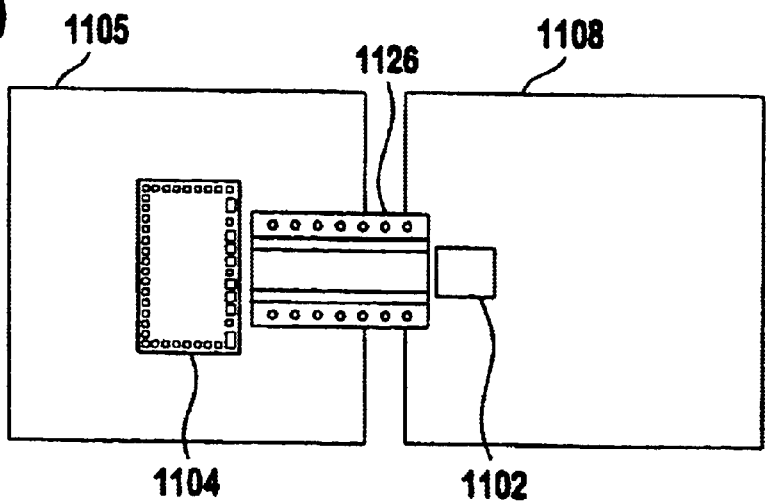
FIG. 30 shows a top view of yet another laser and laser driver configuration for the optical transmitter.

In FIG. 22C, the coplanar waveguide is straight. FIGS. 28 and 30 show further embodiments of coplanar waveguides. In the embodiment of FIG. 28, the laser driver 1104 and laser 1102 are positioned at the centers of their respective substrates. In some applications, positioning of laser 1102 and laser driver 1104 at the centers of the header 1108 and hybrid subassembly 1105, respectively, may result in improved heat sinking.

The embodiment of coplanar waveguide 1126 shown in FIGS. 22A and 22B has a 90-degree bend within a substantially horizontal plane as shown by 1110 that directs energy emitted from the laser driver 1104 to the laser 1102. The angle from surface 1110 may be as desired to allow the laser driver 1104 to be positioned, as desired, relative to the laser 1102. The coplanar waveguide 1126 can be manufactured separately from the rest of the header or transmitter optical bench 1108 from less expensive, precision materials such as alumina, and then integrated as a separate unit on the header or transmitter optical bench 1108. Alternatively, the header or transmitter optical bench 1108 and the coplanar waveguide 1126 can be formed as an integrated device where the discrete coplanar waveguide effectively is not necessary.

IIC. Header and Hybrid Configuration

The hybrid subassembly 1105 is discrete and includes an aluminum nitride substrate that acts as part of its heat dissipation system. Aluminum nitride is a very good thermal conductor. Beryllium oxide, silicon carbide, diamond or sapphire could alternatively be used. In certain embodiments, portions of the header or transmitter optical bench 1108 and the hybrid subassembly 1105 are made of alumina. Alumina is relatively inexpensive and has very good microwave properties but poor thermal properties. The header or transmitter optical bench 1108 is typically, however, formed from silicon. Such silicon may, or may not, be a semiconductor based on the doping levels applied to the silicon.

The material and configuration of the header or transmitter optical bench 1108 has a bearing on the laser 1102 operation. The input from the laser driver 1104 is located proximate to the laser 1102. The optical transmitter 112 may have RF electric lead interconnects 212 extending along one side of the device package case 122 and DC electric lead interconnects 212 extending from another side of the device package case 122 to limit a direct lead interconnect interference that might otherwise provide considerable electromagnetic interference (EMI). Also, the electric traces 214 in the device package case 122 have to be routed to where they can be used. Therefore, the electric traces 214 can be relatively long in cases where the device package case 122 is relatively large or there are multiple non-separated device packages. Long electric traces can act as antennae that generate considerable EMI. With a miniaturized device package case 122 as shown in FIGS. 21 and 22, the length of the electric traces 214 included within the device package case 122 (and any associated EMI) is limited. The high-frequency signals can thus be driven from the side of the optical transmitter 112, through controlled impedance traces, through the laser driver 1104, by means of a co-planar waveguide 1126 and to the laser 1102 without signal perturbation or degrading irradiation.

The header or transmitter optical bench 1108 can be designed of either a low-resistivity silicon (less than 1000 ohms per square and greater than 10 ohms per square) or a high-resistivity silicon (greater than 1000 ohms per square) or very high resistivity silicon (greater than 10,000 ohms per square). High-resistivity silicon is more expensive than low-resistivity silicon due to controlled doping processes and because of the relatively low availability in the marketplace. However, use of the high-resistivity silicon allows the co-planar waveguide 1126 and the matching resistor 1124 to be integrally patterned on the header or transmitter optical bench 1108. The matching resistor 1124 has an impedance that matches the impedance of the laser. The matching resistor should be located in close proximity to the laser 1102. In one embodiment, a plurality of ribbon bonds 1128 (as shown in the embodiment of FIGS. 22A and 22B) electrically interconnect the laser driver 1104 to the hybrid subassembly 1105. The approximate size of one embodiment of ribbon bond 1128 is 10 mils by 3 mils by 0.5 mils thick.

The laser 1102, the lens 1112, the optical isolator assembly 1129, and the lens 1119 may be arranged substantially axially to partially define the optical path through the optical transmitter 112.

In one embodiment, a temperature sensor 1130 is located on the header or transmitter optical bench 1108 to provide real time temperature monitoring of the laser 1102. The temperature sensor 1130 is located close to the laser 1102, as a result there is little thermal impedance between the two. In this embodiment, the header or optical bench 1108 has an upper surface that defines a plane on which the is laser mounted. The axis of light emitted from the laser 1102 is parallel to the plane of the header or optical bench 1108. The temperature of the laser is obtained from the output of the temperature sensor 1130 without application of an offset to the temperature sensor output. An effective closed loop management of the laser positive DC bias electric current source is therefore established that provides output power control using feedback based on predefined laser operating parameters at known temperatures. In one embodiment, the header or transmitter optical bench 1108 is about 5 mm or less in width, and the temperature sensor 1130 is positioned within 2.5 mm of the laser 1102. In a further embodiment, the temperature sensor 1130 is positioned within 1 mm of the laser 1102.

In the embodiment of the header or transmitter optical bench 1108 shown in FIGS. 21, 22A, 22B, and 22C, there are a number of components mounted on the header or transmitter optical bench 1108 in close proximity to the laser 1102. These components include a plurality of electric contacts, a pair of inductors 1118 and 1121, a co-planar waveguide 1126, and a resistor (not shown, but can be used in place of one of the inductors 1118 and 1121 in certain configurations). These inductors 1118, 1121, and resistors can be characterized as passive electronic components, and have less wirebond parasitics due to their proximity. Additionally, maintaining a very small temperature gradient across the components, both active and passive electronic components, on the header or transmitter optical bench 1108 (most particularly the laser 1102) to maintain their operation is desired.

AC and DC source currents are both applied to the laser 1102. An advantage of the present invention is that the AC and DC currents (as represented by arrow 1152 and arrows 1150 in FIG. 22B and 22C, respectively) come into a single branch point proximate (or directly on) the laser 1102. Larger components make the branch point from the AC and DC sources move further from the laser. The present invention uses smaller components in more dense configurations, and has a branch point that converges close to the laser.

In certain embodiments, as shown in FIG. 22B, the temperature sensor 1130 is positioned as close as practical (e.g., less than several millimeters, such as 0.6 mm) from the center of the laser 1102. It may be desired to position the temperature sensor 1130 further away from the header or transmitter optical bench because the header or transmitter optical bench 1108 (on which the laser 1102 is mounted) can be very densely populated. Positioning the temperature sensor 1130 at locations remote from the header or transmitter optical bench 1108 still can provide relatively reliable temperature indications, although not as on the header or transmitter optical bench 1108. Positioning the temperature sensor 1130 and the laser 1102 on the header or transmitter optical bench 108 is especially important to provide accurate feedback regarding the temperature of the laser in order to modify the AC current and the positive DC bias current appropriately to control the optical light output of the laser very accurately over a broad temperature range. In miniaturized optical devices some heat is radiated through the air from the laser 1102 to the temperature sensor 1130 however convective and radiative effects are negligible as compared to the thermally conducted energy.

The thermal cross-coupling between the heat generated by the laser driver 1104 and heat generated by the laser 1102 is limited by physical location. In some embodiments, some components that determine the approximate temperature of the laser 1102 are placed within the device package case 122 but not on the header or transmitter optical bench 1108. In such embodiments, an offset or calibration factor approximation must be determined to account for the thermal resistance between the laser and the aforementioned temperature transducer. Alternatively, optical wavelength measurements can be taken over a given temperature range to determine laser device temperature quite accurately to verify the accuracy of the temperature measured by the temperature sensor 1130. This procedure may not be practical for real time temperature monitoring for certain applications.

By positioning filter elements and/or other RF components 1116 inside the device package case 122 for the optical transmitter, the bias noise produced by devices external to the device package to the filter elements inside the device package is limited. Such bias noise would otherwise interfere with the signal quality at the laser 1102. Actively filtering this pseudorandom bias noise is impractical. Eye diagrams, e.g., FIG. 34 (which represent the integrity of the rise time and the fall time of the electrical signal, and can similarly be used to describe the quality of an optical signal) indicate a compromise in the output of the optical transmitter resulting from any external bias noise. In such unfilter conditions, overshoot, undershoot, ringing, and various types of signal abnormalities known as jitter, etc. degrade the rise time and fall time and the resultant shape of the eye diagram. In one embodiment, the filtering elements are close to the laser 1102, which allows the eye diagram to be finely tuned.

Considering the relatively small dimensions of the header or transmitter optical bench 1108, many components positioned on the header or transmitter optical bench 1108 are positioned within a small distance (e.g., within a few millimeters) from the laser 1102. The header or transmitter optical bench 1108 can be produced, regardless of its complexity, by etching, micro-machining, plating, metal or glass deposition, implantation or using other conventional semiconductor processing techniques. A mask can be used to form a large number (e.g., sixty or more) headers or optical benches 1108 concurrently using current semiconductor processing techniques.

In one embodiment, the electrical connections to the header or transmitter optical bench 1108 circuitry for purposes of testing subassembly functionality are provided by so-called pogo pins (or probe contacts or testing pins) mounted onto a suitable testcard, physically contact the substrate at predefined locations that are selectively connected. In this embodiment, after fabrication of the header assembly, a plurality of testing probes are moved toward a corresponding plurality of contact pads on the fabricated header assembly. Electrical operation of components on the fabricated header assembly is tested after the testing probes physically contact the contact pads. The testing probes are preferably not permanently affixed to the contact pads during the testing procedure, but simply are in electrical contact therewith. Accordingly, the header assembly design of the present invention represents a fully-testable header assembly design.

The concept of positioning passive electrical components such as inductors, capacitors, resistors, etc. on the header or transmitter optical bench 1108 or the hybrid subassembly 1105 has been described herein. Positioning such passive electrical components as inductors on the same header or transmitter optical bench 1108 as the laser 1102 provides unexpected results since the electronic circuit including the passive components can be designed to operate at a high electrical frequency or data rate. Such an integrated optical transmitter 112 or optical transponder 100 can be applied to telecommunications, medical, computer, and other applications.

Once it is recognized that the passive electrical components could be located inside the device package case 122 on, e.g., the header or transmitter optical bench 1108, it might not be desired to locate these components outside the device package case 122. The physical components of the microwave circuit are important to provide the desired electro-optical operation. The components are closely positioned to the laser 1102 on the header or transmitter optical bench 1108. In other embodiments, these passive components are positioned remotely instead of being on the header or transmitter optical bench 1108. A circuit diagram in which the passive electrical component is positioned in the device package case 122 would appear similar to a circuit diagram in which the passive electrical component is positioned outside of the device package case 122 if a wire extending from inside to outside the device package case 122 were added, but the longer length of the wire would result in producing a larger inductor element and a resistor. The circuit diagram would actually be different if the trace extended off the header or transmitter optical bench 1108, or outside of the device package case 122 due to the added length of such an inductor. As such, one embodiment of micro-circuit requires an inductor to be located near the laser 1102. Different lasers 1102 with different resistances and different bandwidths can therefore be swapped along with suitable matching resistors 1124 within the device package case 122 where it is reconfigured to provide different operational characteristics, and the header or transmitter optical bench 1108 configuration will still provide improved cooling characteristics regardless of the laser 1102 configuration.

In those embodiments of optical transmitter 112 where the inductor and other passive electronic components are inside the device package case 122, the optical devices operate with less EMI transmitted there between. Positioning the electric traces 214 outside the device package case 122 results in a more complex design, because the circuit must be adapted to accommodate various inherent electrical parasitic elements associated with the longer traces and multiple laser 1102 or laser driver 1104 designs.

IID. Heat Sinking

The laser 1102 generates approximately $7/10$ of a watt of power during normal operation. The heat dissipation associated with the laser is spread downwardly through the material of the header or transmitter optical bench 1108 as described herein. The heat sink flow through the optical transmitter is through the following components: laser, the header, the pedestal, the adhesive pad, and the housing case. The adhesive pad 605 secures to the baseplate 202 of the optical transmitter 112 within the optical transponder 100 in a position that sinks heat downwardly from the header or transmitter optical bench 1108 and/or the hybrid subassembly 1105. The header or transmitter optical bench 1108 and the hybrid subassembly 1105 may be configured as heat spreaders. In certain embodiments, the laser driver 1104 generates more thermal energy than the laser 1102; in other embodiments the laser 1102 generates more thermal energy than the laser driver 1104. Any heat flow between the laser 1102 and the laser driver 1104 is a function of the relative temperature of the laser 1102 and the laser driver 1104. Because of the heat transmission (e.g., 0.7 Watts) from the laser 1102 through the header or transmitter optical bench 1108 and by the laser driver 1104 (e.g., 1.5 w) through the hybrid subassembly 1105, the thermal coupling between the laser driver 1104 and the laser 1102 is intentionally limited to improve the operation of the laser 1102. In this embodiment, the heat generated by the laser driver 1104 does not increase the operating temperature of the laser 1102 significantly. This limited thermal cross-coupling is desired since the laser 1102 operation can be maintained within controlled temperature ranges if less external heat is applied to the laser. The bandwidth of the laser 1102 varies inversely as a function of temperature, so reducing temperature of the laser results in higher frequency operation because a higher laser drive current can be used. If the temperature of the laser 1102 is precisely controlled then the bandwidth of the laser is precisely controlled. See FIGS. 23 and 24.

In one embodiment shown in FIGS. 17A, 22 and 27, a substantially vertical air trench 1134 extends between the header or transmitter optical bench 1108 and the hybrid subassembly 1105. Air is a poor thermal conductor and as such, the air trench 1134 insulates against heat transfer. The header or transmitter optical bench 1108, the hybrid assembly 1105 and the baseplate 202 are made of different materials. For example, in certain embodiments, the header or transmitter optical bench 1108 includes silicon, the hybrid subassembly 1105 includes aluminum nitride and the baseplate includes copper tungsten. As discussed previously, other material options exist. The respective layers 2720, 2724, and 2728 of the pedestals 1136, 1137 as shown in FIG. 27A are made from materials having a generally increasing thermal conductivity as the reference character increases (though certain layers may be made from an identical material as an adjacent layer or sub-layer). These pedestal configurations limit heat flow upward from the baseplate 202 via the header or transmitter optical bench 1108 toward such heat generating sources as the laser driver 1104 or the laser 1102. The baseplate 202, and pedestals 1136, 1137 that respectively support the hybrid subassembly 1105 and the header or transmitter optical bench 1108, which in turn respectively support the laser driver 1104 and the laser 1102, as shown in FIG. 27, considered together and described below, act as a heat sink that dissipates heat away from the heat generating components mounted to the header or transmitter optical bench 1108 and the hybrid subassembly 1105.

The flow of heat away from the laser 1102 and the laser driver 1104 into the pedestals 1136 and 1137 can be analogized to the flow of water which naturally flows to the lowest potential. This is the basis for Fourier's Law of Heat Conduction, described generally in E. Sergent and A. Krum, Thermal Management Handbook For Electronic Assemblies, at 5.5–5.7. Heat does not naturally flow against a thermal potential, but instead flows toward a location (e.g., the pedestals 1136, 1137) where less thermal energy is located. Heat generated by the laser driver 1104 flows downwardly through the hybrid subassembly into the device package case 122 of the optical transmitter 112. From there, heat flows downward through the adhesive pad 605 of the optical transmitter 112, into the pedestal 1606, and finally into the housing case 123. Less thermal energy exists in the pedestals 1137 and 1136 than respectively in the header or transmitter optical bench 1108 or the hybrid subassembly 1105 because there are no thermal energy sources directly affixed to or within the pedestals. The air trench 1134 thus acts to decouple the thermal output of the laser driver 1104 from the laser 1102. Air in the air trench 1134 acts as a thermal insulator between pedestals 1136, 1137 (the header or transmitter optical bench 1108 and the hybrid subassembly 1105) that delineates both lateral boundaries of the air trench 1134. The pedestal 1136 that supports the laser 1102 is in one embodiment at substantially the same vertical height as the pedestal 1137 that supports the laser driver 1104. As such, the air trench 1134 is similarly deep for both pedestals 1136 and 1137. The thermal energy therefore sinks through the pedestals 1136, 1137 toward the baseplate 202. The thickness of the layers of the pedestals 1136, 1137 can vary however. For example, in FIG. 27, the pedestal 1136 includes one layer while pedestal 1137 includes two layers. In one embodiment, the pedestals 1136, 1137 are formed from copper tungsten (CuW). Thermal cross-coupling occurs at the base of the air trench 1134 but is too remote from the laser 1102 to have a significant effect on the operation of the laser. Additionally, thermal energy in this region will flow to adjacent regions of lower potential, namely the thermal pad and the pedestal 1606.

The term "sink" normally implies that heat flows in a specific direction from highest to lowest thermal potential (e.g. from hot to cold). In the case of a heat sink, moreover, thermal energy is drawn generally toward the outside of the device package case 122 (into the baseplate 202) from the header or transmitter optical bench 1108 and the hybrid subassembly 1105 because thermal energy flows to the lowest energy potential. Therefore, with the absence of the air trench 1134, heat would couple directly from the laser driver 1104 via the header or transmitter optical bench 1108 and the hybrid subassembly 1105 to the laser 1102. In this embodiment, the thermal coupling would result because the laser 1102 generates less thermal energy (heat) than the laser driver 1104.

Figure 25:
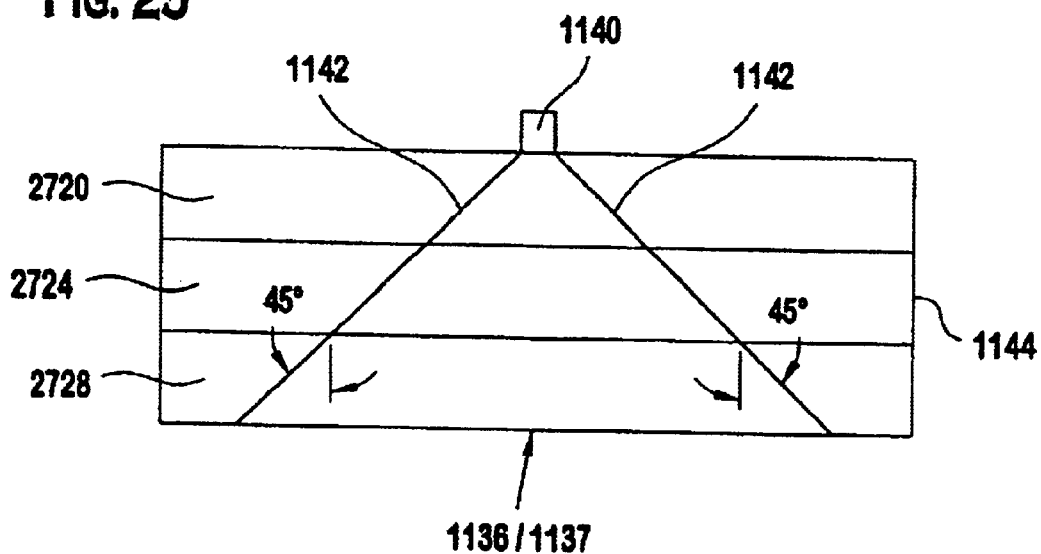
FIG. 25 shows a cross-sectional view of one exemplary embodiment of heat transfer through a series of vertically layered substrates.
Figure 26:
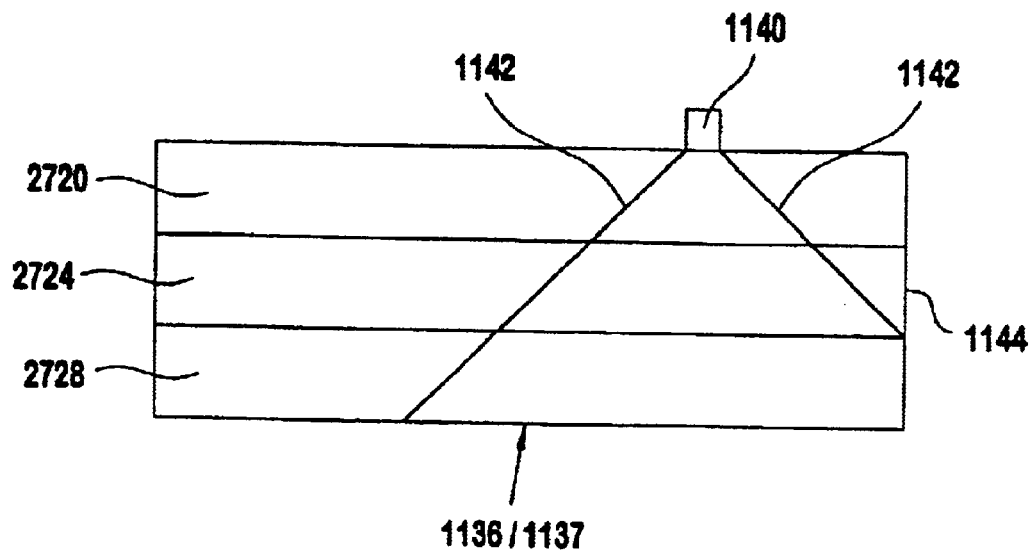
FIG. 26 shows a heat transfer diagram similar to that shown in FIG. 15, except with the heat generation point located proximate to one of the vertical boundaries.

To illustrate the flow of thermal energy (heat) through the header 1108, the hybrid subassembly 1105, and the pedestals 1136, 1137, thermal energy can be modeled to follow within the shape of inverted cones defined by Fourier's Law of Heat Conduction. In the thermal energy to flow through a series of layers 2720, 2724, and 2728 as shown in FIGS. 25 and 26, heat is applied at the upper surface of the pedestals 1136, 1337 (that for the purpose of this discussion includes the header 1108 and the hybrid subassembly 1105), at a modeled heat generation point 1140. To follow the flow of heat through the pedestal 1136, 1137 from the heat generation point 1140, Fourier's Law of Heat Conduction can be applied. At each successive layer 2720, 2724, and 2728 within the pedestals 1136, 1137, thermal energy that is flowing downward within the pedestals 1136, 1137, is gradually dissipated in those areas of the layers 2720, 2724, and 2728 that form an inverted-conical shape formed approximately 45 degrees (i.e., 35–55 degrees) from vertical. As such, the heat-dissipating region is formed by a downward cone 1142 formed approximately 45 degrees from vertical. This approximation assumes that interfacial thermal discontinuities do not exist. Where interfacial discontinuities do exist, horizontal heat spreading will dominate. For example, where the discontinuity is significant, such as a very low thermal conductivity and/or an air-gap, the conical angle described herein will approach 90 degrees from vertical, heat sinking through the material will cease and pure horizontal heat spreading will result. This is the case when a low thermal conductivity material is sandwiched between highly thermally conductive bodies. The heat sinking is successively repeated for each lower layer 2720, 2724, and 2728 within the pedestals 1136, 1137. With each lower layer, the heat is "sunk" over a wider footprint through inverted cones defined by Fourier's Law of Thermal Conduction as long as no vertical wall 1144 or other barrier is encountered. If two such heat sinking cones 1142 converge, thermal cross-coupling results. The less this merging of the heat from the heat sinking cones that is applied to raise the temperature of the header or transmitter optical bench adjacent the laser 1102, the better thermal energy from external sources is isolated from the laser. Due to thermal flow at the overlap of the heat sinking regions, the hotter region heats the cooler region. However, if a critical barrier such as the vertical wall 1144 or air trench 1134 is encountered, as shown in FIG. 26, the heat no longer follows the inverted cone as described by Fourier's Law of Heat Conduction, but instead is constrained to follow the outline of the respective limiting barrier wall 1144 or air trench 1134. When the conical surface encounters a barrier wall 1144 or air trench 1134, the heat no longer propagates at approximately 45 degrees. The heat flowing within the material of the pedestal 1136 or 1137 reaches the edge of the air trench 1134 and thereupon saturates at the edge to form a truncated heat dissipation region. Therefore, the pedestals 1136, 1137 do not provide the same thermal transfer rate if the lateral area of heat dissipation is limited.

Effective heat sinking increases the performance of the layers 2720, 2724 and 2728 (of the pedestals 1136, 1137), acts to lower the temperature of the laser 1102, and thereby increases the laser's performance. By positioning a heat-generation source such as the laser 1102 or laser driver 1104 in the middle of the pedestal 1137 (away from any vertical wall 1144), the effectiveness of the heat sinking improves. This heat sinking improvement can be considered as equivalent to increasing the dimensions of heat sinking cones 1142 in each pedestal 1136, 1137. This increase in the dimension of the heat sinking cones 1142 results in an increased horizontal cross-sectional area of the material of the header or transmitter optical bench 1108 that is allowed to sink heat. If the heat generation point 1140 is horizontally located near a vertical wall 1144 (as a result of a boundary with, e.g., an air trench 1134), the heat sinking cone 1142 is truncated by the trench or wall. The laser 1102 is thereby positioned near the middle of the pedestal 1136 for effective heat sinking. Thermal considerations are very critical to improve laser 1102 operation as described herein. In one configuration, shown in FIG. 27A, the laser 1102 is positioned on the header or transmitter optical bench such that the heat sinking cone that extends downward through the pedestal supporting the header does not intersect the vertical wall of air trench 1134.

The material of the header or transmitter optical bench 1108 is partially selected to match the coefficient of thermal expansion of the laser 1102. Due to this matching of the thermal expansion, the laser 1104 does not develop cracks from internal stresses generated between the laser 1104 and the header or transmitter optical bench 1108 when the temperature of the laser 1102 cycles. The material of the hybrid subassembly 1105 is configured to match the coefficient of thermal expansion of the material of the laser driver 1104. The hybrid subassembly 1105 is at least partially formed, in one embodiment, of aluminum nitride, based on thermal and expansion characteristics of the material of the laser driver 1104. Additionally, the laser driver 1102 does not develop cracks from internal stresses generated between the laser driver 1102 and the hybrid subassembly 1105 as the temperature cycles.

Certain components mounted on the header or transmitter optical bench 1108 do not generate heat, and as such are not modeled as heat-generation points. For example, co-planar waveguides, capacitors, inductive coils and certain active integrated circuits do not generate heat. Certain resistors and transistors (not shown but common in electronic devices), lasers 1102, and laser drivers 1104 do generate heat. Decreasing the depth of the air trench 1134 acts to increase the thermal cross-coupling between heat-generating components on the pedestals 1136, 1137 which respectively support the laser 1102 and the laser driver 1104. In certain configurations, if the base of the air trench 1134 is not sufficiently deep, the laser 1102 could be subjected to increased heat exposure from thermal coupling from the laser driver 1104 via the hybrid subassembly 1105 and the header or transmitter optical bench 1108 to the laser 1102. This thermal cross-coupling might diminish the operating characteristics of the laser as described herein. It is therefore desired to extend the air trench 1134 lower into the substrate relative to the laser 1102 and the laser driver 1104, or alternatively, to increase the height of the pedestals 1136, 1137. Such increase in thermal cross-coupling from the laser driver 1104 via the hybrid subassembly 1105 can also be increased by selecting materials that have an increased heat-sinking characteristic.

For thermal and optical reasons, the laser 1102 is positioned on a different pedestal 1136 (that corresponds to the header or transmitter optical bench 1108) from the pedestal 1137 (that corresponds to the hybrid subassembly 1105) on which the laser driver 1104 is positioned. Locating the laser driver 1104 in addition to the laser 1102 on the header or transmitter optical bench 1108 would complicate the design because there would be a significant thermal source proximate to the laser 1102. As such, the thermal conductivity characteristics of the header or transmitter optical bench 1108 have not been changed and thus are not able to adequately dissipate the thermal energy for a second heat generating device. The laser driver 1104 produces a great amount of heat, and the heat from the laser 1102 and the laser driver 1104 would increase the temperature of the laser.

There are therefore two balancing considerations: heat should be locally sunk from the laser 1102 as effectively as possible, and the thermal coupling heat between the laser driver 1104 and the laser 1102 should be limited. Sinking heat from the laser 1102 without heat from the laser driver 1104 being thermally coupled to the laser 1102 improves the laser 1102 operating conditions. Laser 1102 operating characteristics are improved in those applications where the laser 1102 is located in the middle of the header or transmitter optical bench 1108, and the header is sufficently large to satisfy unimpeded heat spreading. Small headers (e.g., 2–3 times larger than the laser surface area) or edge-mounted lasers are less able to effectively dissipate energy.

Figure 23:
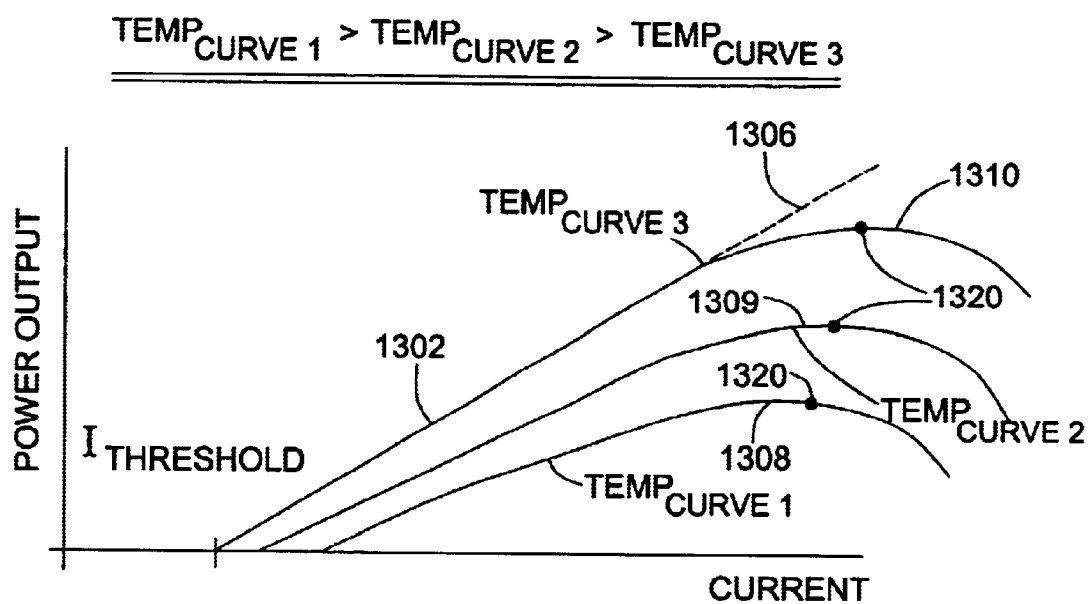
FIG. 23 shows a plot illustrative of the power out as a function of the current for one embodiment of the laser of the optical transmitter of FIGS. 22A and 22B at different temperatures.
Figure 24:
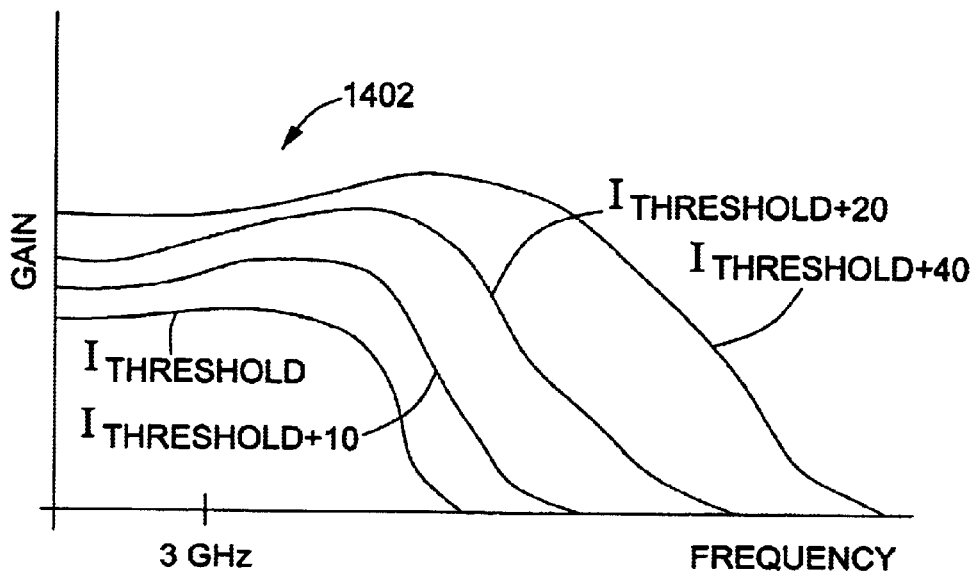
FIG. 24 shows an exemplary plot of gain vs. frequency for one embodiment of the laser as used in the optical transmitter of FIGS. 22A and 22B at different currents.

As shown in FIGS. 23–24, these heat sinking concepts are applicable to 1 GHz, and are of even more concern in 1 GHz and other higher frequency systems of that operate in the absence of thermoelectric coolers. Certain embodiments of the header or transmitter optical bench 1108 supporting the laser 1102, are designed to be capable of dissipating one watt or more of power (energy). The laser 1102, in the herein-described embodiment, runs at a high output and at a relatively low temperature above the transmitter package case temperature, and yet is still effective. The heat sinking can be modeled using existing commercially available heat transfer computer simulation programs.

Two exemplary plotted curves, as shown in FIGS. 23 and 24, together illustrate how the operation of the laser 1102 is affected by temperature. The curves 1308, 1309, 1310 as shown in FIG. 23 plot current (abscissa) versus power out (ordinate) of a laser at different temperatures. Preferably, a steeper slope of power versus current is desired (a higher effective temperature is detrimental to output power). FIG. 24 plots a gain-bandwidth curve in which frequency (abscissa) is. plotted versus gain (ordinate) at different electrical currents applied to the laser.

In FIG. 24, curve 1402 shows how the gain-bandwidth of a typical laser is dependent on the amount of current applied above the threshold condition. Curve 1404 shows the curve for 10 milliamps above threshold ($I_{th+10}$). Curve 1406 shows 20 milliamps above threshold ($I_{th+20}$). As more current is applied, the curves extend to a higher frequency bandwidth as shown by curve 1408. The curves 1402, 1404, 1406, and 1408 shown in FIG. 24 generally gradually merge as the frequency increases. Then at the some gain value particular for each curve 1404, 1406, 1408, each curve value quickly diminishes toward zero gain.

Present systems, for telecommunications lasers, presently operate at 2.5 GHz at which frequency the laser operates at approximately $I_{th+10}$ milliamps. To increase bandwidth, higher laser drive currents are required which in turn generates more thermal energy at the laser. At 10 GHz the laser operates at $I_{th+40}$ milliamps, for example. Therefore, it becomes even more important to dissipate sufficient heat to maintain the laser 1102 within reasonable operating conditions.

As per FIG. 23 and 24, high bandwidth devices (e.g., 10 GHz), are often required to operate at their functional limits. Each curve 1308, 1309, 1310 does not extend indefinitely, but each curve tends to "roll-over" at a point 1320 where the slope of the power-current curve is zero. Therefore, the rate of increase for output power diminishes for a corresponding increase in input current after the laser reaches its roll-over point 1320. If the laser 1102 is driven harder by more current being applied to the laser, and no more light will be projected by the laser since the laser is outputting its maximum light, any power applied to/from the laser 1102 that is not converted into light is converted primarily into heat. If more heat is applied to the laser 1102, the laser will therefore degrade in its operation and reliability, and follow the lower power-current curves 1308, 1309. By effectively heat sinking the laser 1102, the slope of the power-current curve that the laser follows increases (as shown by curve 1310) to a higher power value curve. The heat sinking configurations described above seek to maintain the laser 1102 at a maximum slope efficiency (power as a function of current).

The curve 1310 produces more light for a given current level than curves, 1308 and 1309, due to the fact that the laser is operating cooler because more heat has been drawn away from the laser 1102. This heat sinking allows significantly improved (e.g., 40% or more) output power from certain lasers 1102, when compared to standard commercially available laser-mount heat sinks. This increased output power from the laser 1102 effectively produces more light, with less current at a higher bandwidth because the structure concurrently sinks more heat than conventional designs. In another embodiment, the increased heat would otherwise have to be dissipated by use of a thermoelectric cooler to get similar power-current results. As such, it is possible, with proper thermal design, that high bandwidth lasers can produce more light output with less current without the use of active cooling techniques such as thermoelectric coolers or heatpipes.

If the laser 1102 is operating hotter, it requires more current to produce equivalent levels of light output. As per FIG. 23, if heat sinking is poor, then the temperature of the laser increases. If the heat sinking is poor and the laser temperature increases, the slope efficiency (which is represented by the slope of curves 1308, 1309, and 1310) will decrease as represented on FIG. 23. When operating under decreasing slope efficiencies, in order to obtain an equal amount of light, the input current to the laser has to increase. Per Ohm'sLaws, when the laser current increases, the laser temperature increases, which results in a continued drop in slope efficiency. This associated looping of the increasing current to the laser, increasing heat generated by the laser, and increasing slope efficiency can result in a so-called "thermal runaway" condition, under which conditions, eventually the current of the laser increases along the particular temperature curve 1308, 1309 and 1310 until they reach the respective "roll-over" point 1320 along the particular curve 1308, 1309, 1310. Continuing to apply electric current to the lasers on a particular curve 1308, 1309, 1310 where the current exceeds that of the roll-over point, will not only result in diminishing light output, but may eventually damage the laser 1102 itself.

Lasers that are operated at higher temperatures because of poor laser heat sinking therefore can be run only operate safely at lower output power for an equivalent amount of drive current, and therefore cannot reliably produce the same level of light as more efficient, better heat sinked lasers. Tests indicate the operating temperature of lasers are typically reduced by, e.g., three to five degrees (laser operating temperature) by using effective passive heat sinking techniques. This three to five degree reduction provided by the heat sinking described herein can be very significant in increasing light output potential, desirable for longer transmission lengths in the optical network, and limiting laser operational degradation, as degradation occurs exponentially as temperature increases.

The low thermal resistances of the header or transmitter optical bench 1108 and pedestal provide very efficient thermal design of the optical transmitter 112. In one embodiment, a cooler can be located external to the device package case 122 to provide cooling. External coolers can be used rather than internal coolers that are located within the device package case 122. In one embodiment, an internal cooler can be configured as a small thermoelectric cooler that can be applied to cool only the mounted laser header or transmitter optical bench internal to the package. The laser 1102 could be cooled independently from the other techniques described herein to provide superior cooling. Positioning the external cooler outside of device package case 122 simplifies the packaging design, while keeping the optical device dimensions the same; in this configuration, the cooling efficiency may decrease.

Cooling the laser 1102 becomes very important in a variety of laser-based system where the laser operating frequency is a function of the temperature of the laser 1102. For a laser that is being operated at a prescribed wavelength, the electric current versus the power (and frequency) plot can therefore more precisely be controlled as desired if the temperature of the laser is precisely monitored and controlled. One application using multiple lasers that in which each are precisely individually controlled is wavelength division multiplexing (WDM) systems. Such WDM systems utilize a plurality of lasers, each laser operating at a slightly different wavelength (color), and the different data streams output by all of the lasers are merged in the same optical fiber cable 120. It therefore becomes even more essential to ensure that the output wavelength of the light is very tightly controlled. Each laser is very tightly monitored and controlled, so the different wavelengths of light produced by each distinct laser is stable over a broad temperature range. All the lasers have to be cooled/heated to their particular fixed operating temperature. To achieve this cooling/heating, a wavelength photo monitor 1114 can monitor the output of each laser 1102. To provide multiple lasers 1102 in the same device package case 122, the lasers 1102 must be cooled/heated very accurately and independently. Again, the temperature sensor 1130 may be positioned on the header or transmitter optical bench 1108. With dense wavelength division multiplexing (DWDM), the temperature of each laser 1102 has to be very accurately controlled over its active life. Thus, a laser 1102 producing a specific wavelength (e.g., 1550 nm) may be necessary to achieve proper operation in certain operations.

If it is desired to integrate a component (e.g., a co-planar waveguide) into silicon patterning, high-resistivity silicon is necessary. A high-resistivity silicon could cost considerably more than a low-resistivity material. For comparison purposes, a high-resistivity silicon might cost five to ten times as much as low-resistivity silicon. The low resistivity silicon makes the silicon more economically feasible for a broader base of products. The optical transmitter 112 and optical transponder 100 utilizing low-resistivity silicon may be desired for many applications because it does not have the cost associated with high resistivity silicon. The thermal conductivity of doped silicon is indistinguishable from that of non-doped silicon, because the dopant is so subtle.

Metal filled vias (not shown in this embodiment) may be used in the embodiment of hybrid assembly 1105, and may be made from alumina, to remove the heat generated by the laser driver 1104, and other heat generating components. The vias in the alumina configuration of the hybrid assembly 1165 extend straight down to the baseplate 202, so the dissipated heat travels down within the vias in which there is a more limited area to dissipate heat than the embodiment shown in the ceramic layers 2720, 2724, and 2728 of FIG. 27. Thus vias would not be as effective for heat dissipation as the aluminum nitride included in the hybrid assembly 1105 described above because of the limited spreading effect. The heat cannot spread laterally from the small area defined by the vias. From a thermal density point of view, the vias 218 of the alumina embodiment of the hybrid assembly 1105 act like a thermal choke limited by vertical conduction with very little horizontal heat spreading.

Figure 17B:
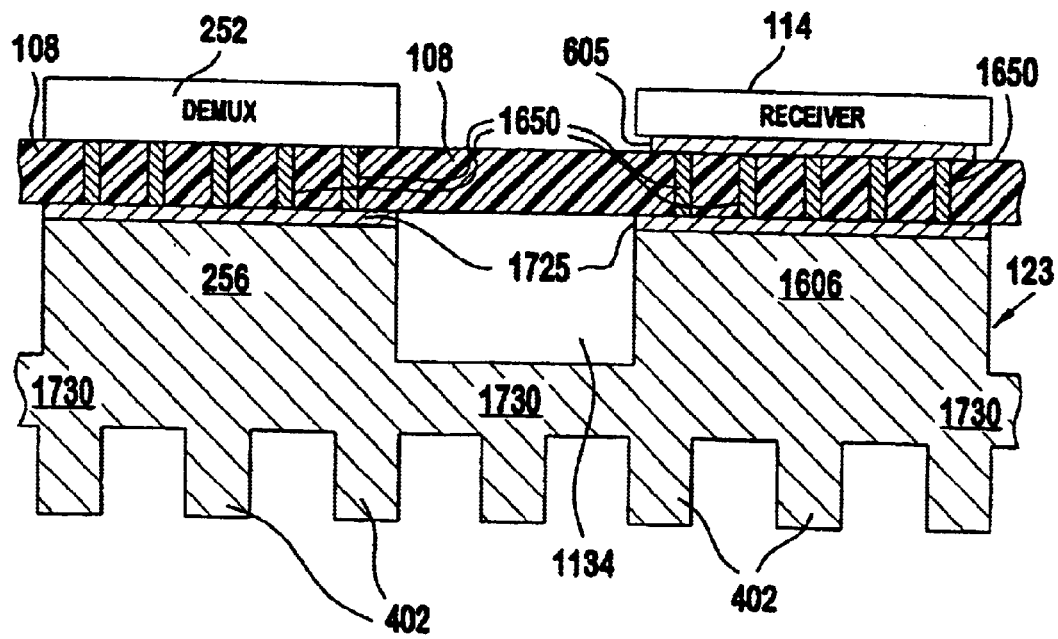
FIG. 17B shows a side partial cross-sectional view taken through the optical transmitter, the optical receiver, and a portion of the casing package as shown in FIG. 3.

The embodiment of hybrid subassembly 1105 formed from aluminum nitride, by comparison, has good heat coefficient properties and thus provides an improved thermal sinking and spreading effect. Similar results could be achieved with the header or transmitter optical bench 1108 being formed from silicon carbide, beryllium oxide, sapphire or diamond. Diamond headers 1108 are not commonly used for economic reasons and beryllium oxide is not frequently used because of toxicity hazards. The heat sinking aspects described above are also applicable to other portions of the transponder 100. For example, an air trench 1134 can be formed between whichever pair of elements generate considerable heat. In FIG. 17A, the air trench 1134 is formed between the pedestal 1606 supporting the optical receiver 114 and the pedestal 1606 supporting the optical transmitter 112. By comparison, an air trench 1134 can be provided between the pedestal 256 supporting an electrical demultiplexer 252 and a pedestal 1606 supporting the optical receiver 114 as shown in the embodiment of FIG. 17B. The selection of which pair, or pairs, of heat generating components to position an air trench between depends largely on selecting those pairs of components that are generating the most heat within the optical transponder 100. For instance, in certain transponder configurations, the electrical demultiplexer 252 and the optical receiver may generate the most heat.

IIE. Optical Isolators

Figure 35:
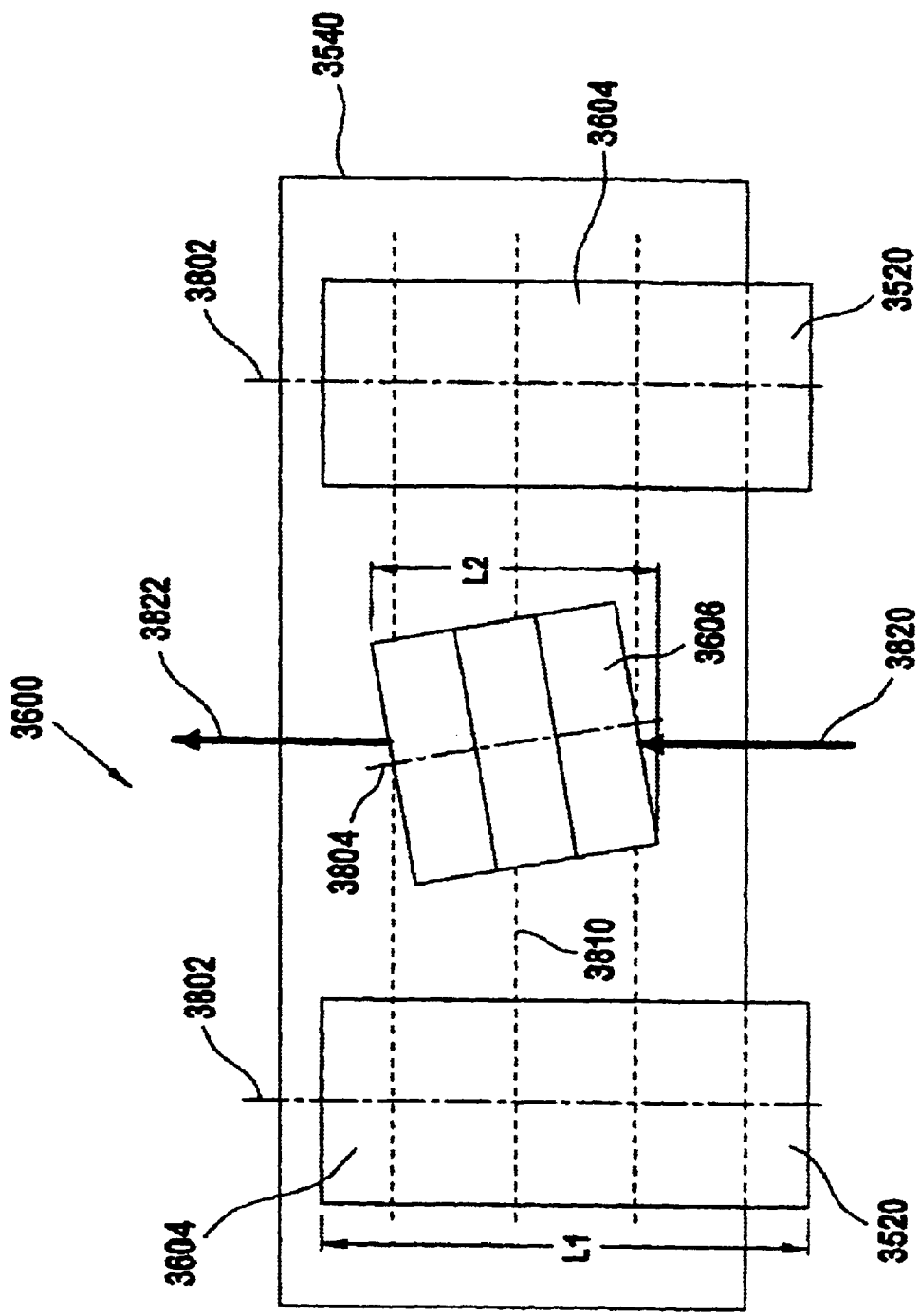
FIG. 35 shows an optical isolator in accordance with the present invention.

FIG. 35 illustrates an optical isolator. The purpose of optical isolators, in general, is to act as optical diodes to allow light to travel in a first direction, while limiting the transmission of light in a second direction, that is opposed from the first direction. As such, magnetic fields maybe applied to the optical element 3606 by magnetic polar sources 3604. Magnet fields affect the polarization of the optical element, thereby affecting whether the optical isolator allows light to pass through the optical element.

Light can travel within the optical isolator 3600 in a direction generally parallel to, or slightly angled from, the optical element axis 3804. The optical isolator 3600 is configured so that light from a laser, such as 1102 shown in FIG. 22A, can be directed therethrough. If light emitted from the laser 1102 is reflected from the optical isolator 3600 back to the laser, degredation can result to the optical signal. As such, the optical element axis 3804 is configured at an angle, so that none of the incident light from the laser that is reflected off of the surface of the first optical element, reflects back toward the laser. As such, any light emitted from the laser 1102, which the contacts the optical element 3606 will typically pass through the optical element, however, any light that is reflected from the optical element will not be reflected back to the laser.

As shown in FIG. 35, each one of a plurality of magnetic polar sources 3604 has its own magnet axis 3802. Each magnetic polar source 3604 has a length (L1) that extends beyond the length (L2) of the optical element 3606. The optical element 3606 has a central or optical element axis 3804. The optical element axis 3804 is tilted with respect to each of the magnet axis 3802, at an angle of 2–12 degrees. The length (L1) of the magnetic polar sources 3604 taken in a direction along the magnet axis 3802, is elongated compared to the length (L2) of the optical element 3606 as taken in the direction parallel to the magnet axis 3802. The magnets 3604 are of sufficient length to extend past the edge of the mounting substrate 3540. As such, the magnets have an overhang portion 3520. The overhang portion 3520 has a mounting substrate 3540 that is sufficiently planer to provide for a mounting against a planer surface of the interior of the housing case 122. Such elongation of the magnets 3802 relative to the optical element 3606 provides the ability to position the optical isolator 3600 with housing case 122 simply by placement of the optical isolator 3600 along the inner surface of housing case 122. Without the overhang portions 3520, the magnetic elements 3604 could not come in direct contact with the planer surface of the interior of the housing case and the structure would tilt out of position.

Figure 37:
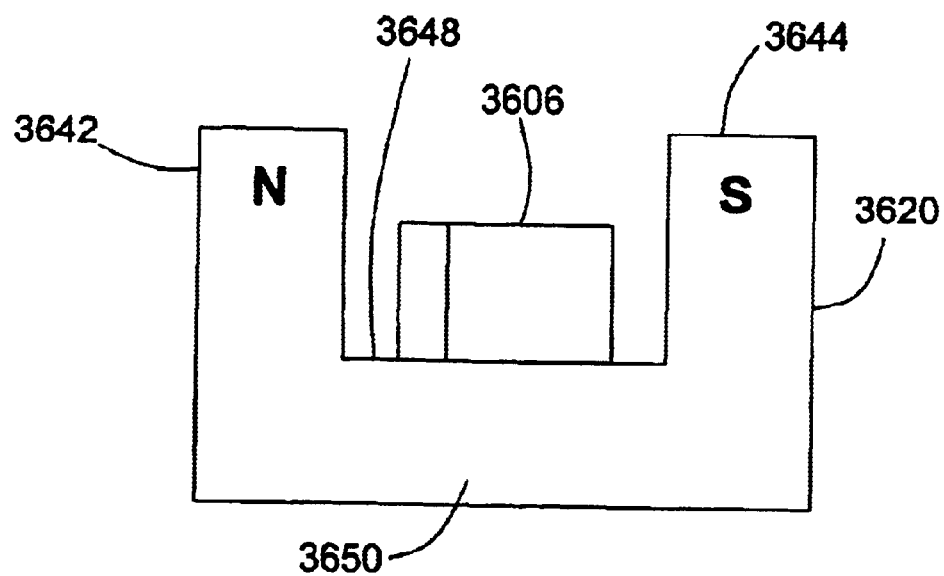
FIG. 37 shows a cross-sectional view of the optical isolator shown in FIG. 36.
Figure 36:
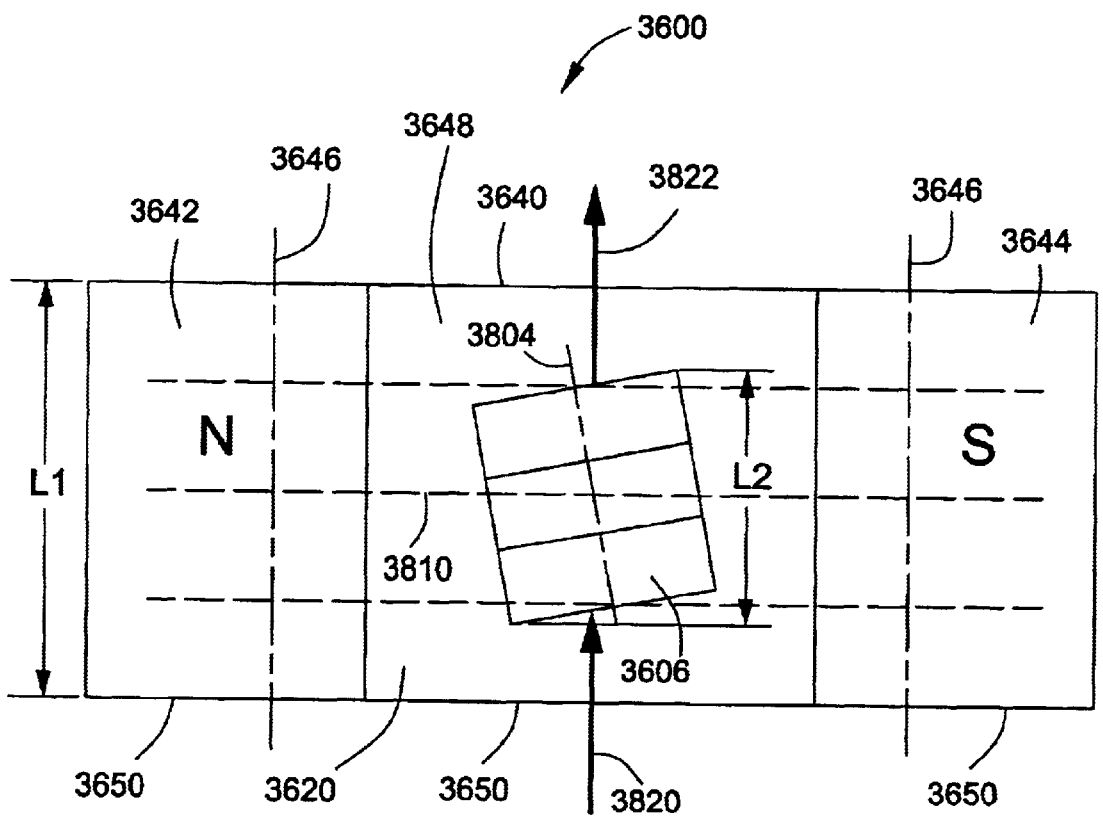
FIG. 36 shows an optical isolator in accordance with a further embodiment of the present invention.

Another embodiment of optical isolator 3600 is shown in FIGS. 36 and 37. The optical isolator 3600 includes a single U-shaped magnet 3640. The U-shaped magnet 3640 has a first magnetic polar source 3642 (e.g., a "north pole"), a second magnetic polar source (e.g., a "south pole") 3644, and a connector segment 3650. The optical element 3606 is connected to the connector segment 3650 by any fasten method such as adhesive, epoxy, solder, mechanical connector, or the like. The first magnetic polar source 3642 and the second magnetic polar source 3644 each have their individual pole source axis 3646. The optical element axis 3804 is tilted from 2 to 12 degrees from each magnetic polar source axis 3646, to limit the light from the laser being reflected back toward the laser (as described relative to the embodiment shown in FIG. 35). The length L1 of the magnetic polar sources 3642, 3644 exceeds the length L2 of the optical element 3606.

The U-shaped magnet 3640 has a substantially planer mounting surface 3650, formed from a substantially planer edge of the U-shaped magnet 3640. The housing case 123 of the optical transmitter 112 (and/or a component connected thereto) includes magnetically attractive material of sufficient strength to semi-permanently secure the optical isolator 3600 relative to the housing case 123.

In one embodiment of optical transmitter 112, as shown in FIG. 22, the optical isolator 3600 is shown as being secured to the housing case 123 by magnetic attraction between the magnets 3604 of the optical isolator and the housing case 123. The housing case 123 includes a magnetically attractive component, such as the transmitter package wall 208 being formed from such magnetically attractive material as Kovar. The mounting provides a strong magnetic attraction to the magnets 3604 that is by itself sufficient to maintain the optical isolator 3600, and the associated optical element 3606, at its desired location after placement of the optical element 3606 during assembly. This strength is sufficiently strong to maintain the optical isolator in position during normal operation of the optical transmitter. For more robust reliability, the isolator could be permanently affixed (e.g., by soldering, adhesive or some mechanical fixture.)

II.F. Reconfigurable Header

Figure 31:
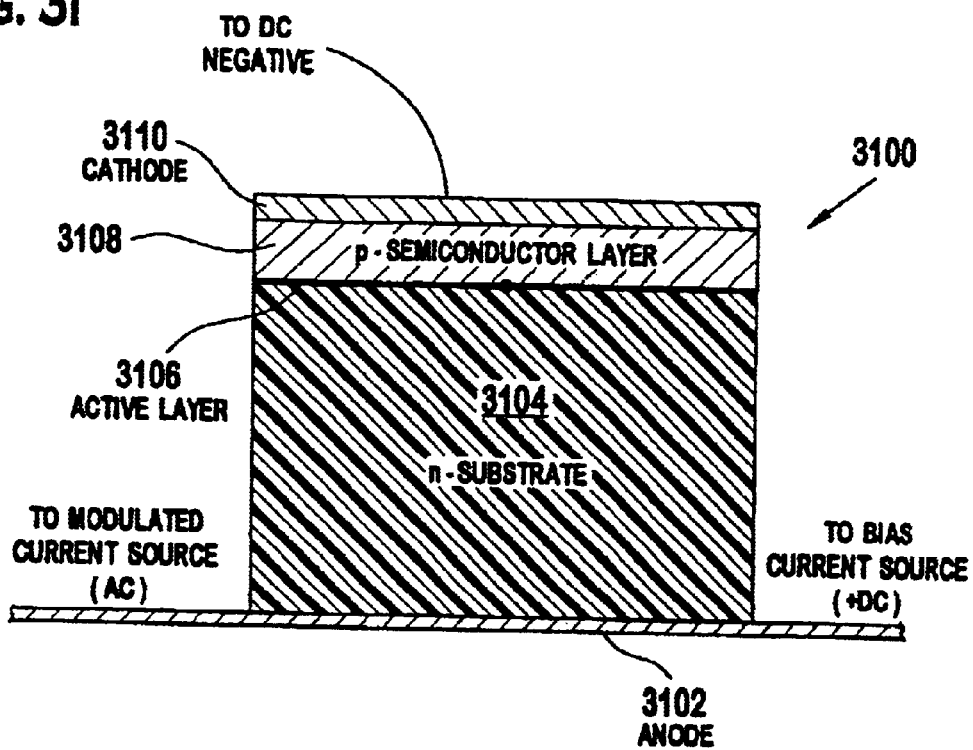
FIG. 31 shows a side view of an n-doped laser substrate structure, including biasing.
Figure 32:
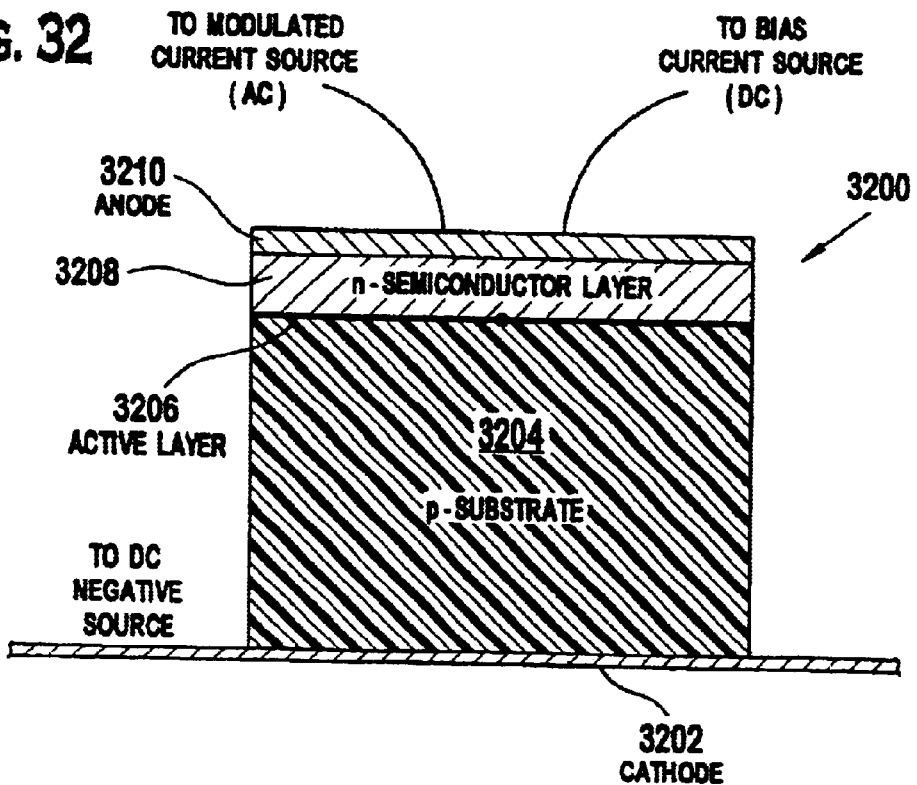
FIG. 32 shows a side view of a p-doped laser substrate structure, including biasing.

FIG. 31 shows one embodiment of an n-doped laser substrate structure 3100, while FIG. 32 shows one embodiment of a p-doped laser substrate structure 3200. The n-doped laser substrate structure 3100 and the p-doped laser substrate structure 3200 differ from each other primarily by their anode and cathode assignments are opposite. The embodiments of the laser substrate structures 3100, 3200 shown in FIGS. 31 and 32 are intended to be illustrative in nature, while it is to be understood that other configurations of lasers may be used while remaining within the intended scope of the present invention.

Not only does the doping of the n-doped laser substrate structure 3100 differ from that of the p-doped laser substrate structure 3200, but to provide proper operation, the biasing applied to the laser substrate structures 3100, 3200 must differ as well. For example, dependent on the laser substrate structure, different current sources are connected at different locations to the different portions of the laser substrate structure.

The n-doped laser substrate structure 3100, as shown in FIG. 31, includes a base anode electric contact 3102, and n-substrate 3104, an active region 3106, a p-semiconductor layer 3108, and a laser cathode electric contact 3110. To properly bias the n-doped laser substrate structure 3100, a DC positive bias electric current source 3112 is applied to the base anode electric contact 3102, a modulated electric (AC) current source 3114 is also electrically connected to the base anode electric contact 3102, and a DC negative current source 3116 is electrically connected to the laser cathode electric contact 3110. The DC positive bias electric current source 3112, the modulated electric (AC) current source 3114, and the DC negative electric current source 3116 are electrically connected at remote electrically sources by wire or ribbon bonds. Wire or ribbon bonds are used to connect the various current sources to their respective location on the laser cathode electric contact 3110 or the base anode electric contact 3112.

The p-doped laser substrate structure 3200, as shown in FIG. 32, includes a base cathode electric contact 3202, a p-substrate 3204, an active region 3206, an n-semiconductor layer 3208, and a laser anode electric contact 3210. The lasing action is produced within the active region 3206, in a similar manner to lasing action being produced in the active region 3106 of the n-doped laser substrate structure 3100. To properly bias the p-doped laser substrate structure 3200, the modulated electric (AC) current source 3114 is electrically connected to the laser anode electric contact 3210, the DC positive bias electric current source 3112 is electrically connected to the laser anode electric contact 3210, and the DC negative current source 3116 is electrically connected to the base cathode electric contact 3202.

Figure 33A:
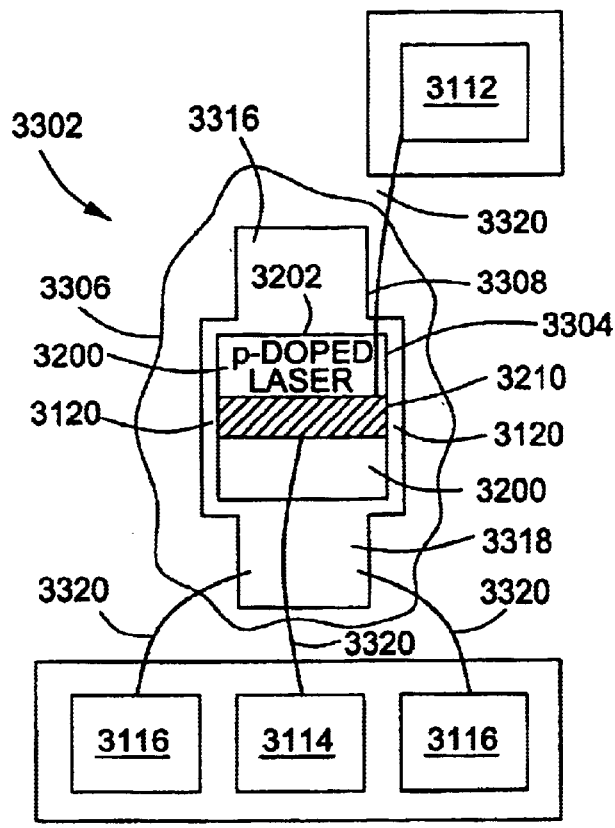
FIG. 33A shows the reconfigurable laser header of the present invention, configured for a p-doped laser substrate structure.
Figure 33B:
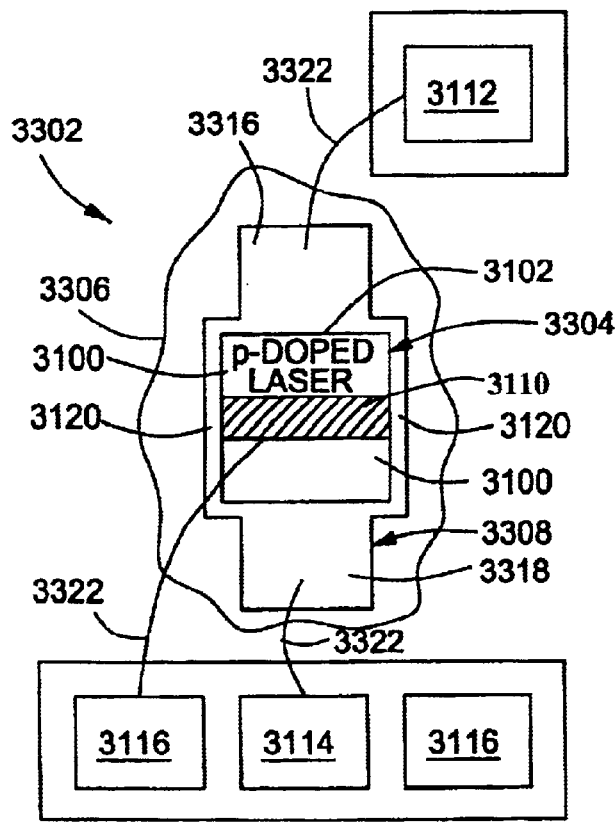
FIG. 33B shows the reconfigurable laser header of the present invention, configured for a n-doped laser substrate structure.

The embodiment of reconfigurable laser header 3302, as shown in FIGS. 33A or 33B is used in such a manner that a laser 3304 (whether it is a p-doped laser substrate structure 3200 as shown in FIG. 32, or a n-doped laser substrate structure 3100 as shown in FIG. 31) may be properly biased. The reconfigurable laser header assembly 3302 is shown in FIG. 33A in its configuration to bias a p-doped laser substrate structure 3200, and is shown in FIG. 33B in its configuration to bias an n-doped laser substrate structure 3100. The reconfigurable laser header assembly 3302 includes, in one embodiment, a header 3306, the laser 3304, an electric conductor 3308, the bias DC positive electric current source 3112, the DC negative current source 3116, and the modulated electric (AC) current source 3114. The header 3306 is provided to support the laser 3304. The electrical conductor 3308 extends around the periphery of the laser 3304, and is electrically connected to the base electric contact 3102 of laser 3304. In FIG. 33A, the base electric contact 3202 may be considered as extending around the periphery at the base of the laser 3200. In FIG. 33B, the base electric contact 3102 may be considered as extending around the periphery of the base of the laser 3100.

The electrical conductor 3308 may be patterned on the header or silicon optical bench 3306. The header or transmitter optical bench may be made out of any suitable material, including, but not limited to, silicon, aluminum nitrate (AlN), or silicon carbide (SiC), diamond or sapphire.

In one embodiment, the electrical conductor 3308 includes a first metalized region 3316 and a second metalized region 3318. The selection of which metalized region is characterized as the first metalized region 3316 or the second metalized region 3318 determines the lasing orientation of the laser. The actual structure of both metalized regions are preferably identical, but located on opposite sides of the laser 3304. The electrical conductor 3308 further includes a pair of connecting electrical conductors 3120 that electrically connect the first metalized region 3316 to the second metalized region 3318. The connecting electrical conductors 3120 extend around opposed sides of the laser 3304, as illustrated in FIG. 33A and 33B.

As mentioned, the reconfigurable laser header assembly 3302 may be used to properly electrically bias the laser 3304 regardless of whether the laser 3304 is a p-doped laser substrate structure 3200, as shown in FIG. 32, or an n-doped laser substrate structure 3100, as shown in FIG. 31. To accomplish this biasing of the p-doped laser substrate structure 3200, as shown in FIG. 33A, a first set of wire bonds 3320 are connected from a variety of current sources to a variety of locations relative to the laser substrate structure 3200. In this disclosure, the term "wire bond" may include any wire bond, ribbon bond, or other wire or conductor that electrically connects the two locations as described herein. A first wire bond 3320 extends from the DC positive electric current source 3112 to the laser anode electric contact 3210. A second wire bond 3320 extends from the modulated electric (AC) current source 3114 to the laser anode electric contact 3210. A third one of the wire bonds 3320 extends from one or more of the DC negative current source 3116 to the second metalized region 3318 (alternatively, the first metalized region 3316).

In those instances where the laser 3304 is an n-doped laser substrate structure 3100, as illustrated in FIG. 31, the biasing of the reconfigurable laser header assembly 3302 is different as shown in FIG. 33B. One second wire bond 3322 extends from the DC positive bias electric current source 3112 to the metalized region 3316 (alternatively, the second electrical metalized region 3318). Another second wire bond 3322 extends from one or more of the DC negative electric source 3316 to the laser cathode electric contact 3310. Another second wire bond 3322 extends from the modulated electric (AC) current source 3114 to the second metalized region 3318 (or alternatively, the first metalized region 3316).

II.G. Performance Characteristics

Figure 34:
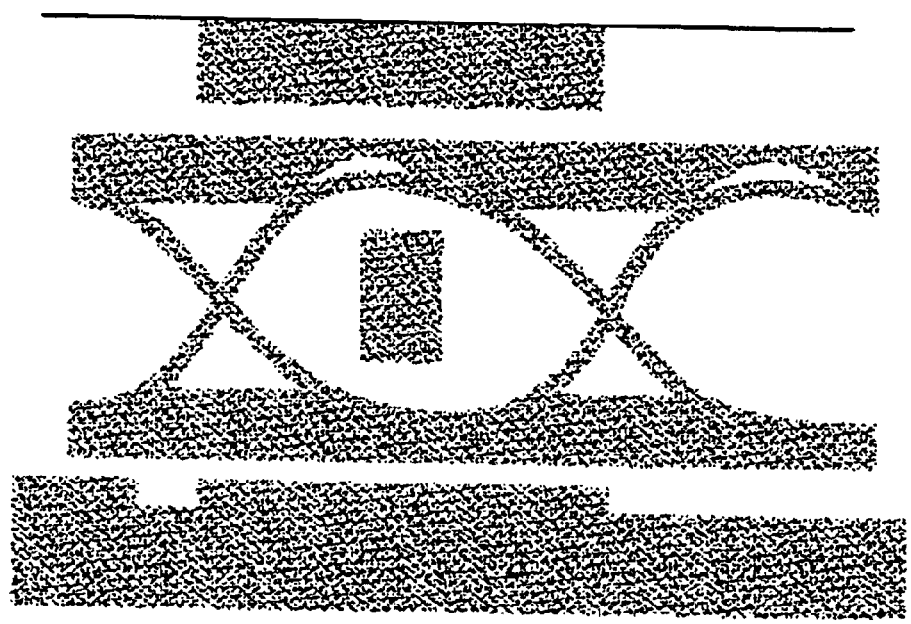
FIG. 34 shows an eye diagram for one embodiment of laser operating in an optical transmitter in one embodiment of the present invention.

The integration of components on the optical header and the heat sinking aspects described above result in an optical transmitter having substantially improved operating characteristics. An eye diagram of an optical transmitter operating in accordance with the present invention is shown in FIG. 34. As illustrated by that figure, the optical transmitter of the present invention exhibits a "wide open" eye, has low overshoot, and a high mask margin at high extinction ratios. Significantly, at higher temperatures, the eye integrity of the light produced by the laser is maintained. The proximity of the temperature sensor to the laser on the header as described above contributes to better control of the laser, and enhanced performance of the laser at temperatures approaching the roll over point.

Another important feature of certain embodiments of the optical transmitter described above, is the absence of any thermo-electric cooler from the device. A thermo-electric cooler will typically have significant power requirements, and the addition of a thermo-electric cooler to an optical transmitter may in some cases double the power required to operate the device. The optical transmitter of the present invention is able to achieve an eye diagram having a "wide open" eye at high operating temperatures, even in the absence of any thermoelectric cooler. This result is based in large part on the heat sinking methodology employed in connection with the device, as well as precise temperature control over the laser.

Table I below illustrates that the optical transmitter of the present invention is able to continue operating without degradation of performance with low differentials between the laser temperature on the one hand, and the temperatures of the housing case (T1) and the transmitter package case (T2). The locations on the device where temperatures T1, T2 are measured, are shown respectively on FIG. 27B.

TABLE I

|  | Laser Maximum Operating Temperature | Maximum Transponder Housing Case Temperature (T1) | Maximum Transmitter Package Case Temperature (T2) |
| --- | --- | --- | --- |
| Prior Art | 75° C. | 55–60° C. | 65–70° C. |
| Invention | 75° C. | 70° C. | 74° C. |

As shown in Table I, the optical transmitter of the present invention can achieve a 5° C. temperature delta between the laser temperature and the housing case temperature without degradation of the operation of the device. In particular, when the optical transmitter of the present invention is configured using a laser that operates in the range of 1260–1360 nm, and the transmitter package case is made small such that it that either (i) covers less than 0.30 square inches of surface area on a surface to which the package case is mounted, or (ii) is less than 0.062 cubic inches in volume, the optical transmitter continues to function in compliance with the transmission requirements of International Telecommuncations Union (ITU-T) Standard G.693 and/or G.691, the Synchronous Optical Network Transport System (SONET/SDH) Standard STM-64 and/or the SONET Standard OC-192, without thermoelectric cooling, when the thermal resistance of the transmitter package is less than or equal to 0.7 degrees C. per Watt and an external temperature of the functioning transmitter package case is at or within 1° C. of a temperature of the laser, and/or when the thermal resistance of the housing case is less than or equal to 1.1 degrees C. per Watt and the external temperature of the functioning housing case is at or within 5° C. of a temperature of the laser. In addition, these small temperature deltas can be maintained when the optical transmitter is operating continuously (e.g., for days or weeks on end) to transmit data at frequencies at or above 2.5 Gbit, with an output power of at least 5 dBm, and with the laser operating at a duty cycle of at least 50% or better. In some embodiments, the housing case is 3 inches long x2.0 inches wide x0.53 inches thick, or 3 inches long x2.0 inches wide x0.53 inches thick, or smaller.

While the principles of the invention have been described above in connection with the specific apparatus and associated method, it is to be clearly understood that this description is made only by way of example and not as a limitation on the scope of the invention.

What is claimed is:

1. A reconfigurable laser header assembly, wherein either an n-doped laser substrate or a p-doped laser substrate can be properly biased, the reconfigurable laser header assembly comprising:
   a header coupled to a modulated AC electric current source, a DC positive bias electric current source, and a DC negative electric current source;
   an electrical conductor on the header including first and second metalized regions; and
   a laser of the type selected from the group consisting of an n-doped laser substrate, and a p-doped laser substrate;
   wherein the n-doped laser substrate includes: an n-substrate with a base anode contact, and a p-semiconductor layer with a laser cathode contact;
   wherein the p-doped laser substrate includes a p-substrate with a base cathode contact, and an n-semiconductor layer with a laser anode contact;
   wherein the electrical conductor is electrically connected to the base anode contact of the n-doped laser substrate or to the base cathode contact of the p-doped laser substrate,
   wherein the modulated AC electric current source and the DC positive bias electric current source are electrically connected to the laser anode contact with first relocatable conductors or to the base anode contact via the first relocatable conductors electrically connected to the first and/or second metalized regions; and
   wherein the DC negative electric current source is electrically connected to the laser cathode contact with a second relocatable conductor or to the base cathode contact via the second relocatable conductor electrically connected to the first and/or the second metalized regions;
   whereby the laser is properly biased regardless of whether the laser is an n-doped laser substrate structure or a p-doped laser substrate structure.

2. The reconfigurable laser header assembly of claim 1, wherein the first and second metalized regions are electrically connected to the base anode contact or the base cathode contact at positions approximately one hundred and eighty degrees from each other.

3. The reconfigurable laser header assembly of claim 1, wherein the first and second metalized regions are supported by the header.

4. The reconfigurable laser header assembly of claim 1, wherein the first and second metalized regions are mounted on the laser header.

5. The reconfigurable laser header assembly of claim 1, further including a connecting electrical conductor that electrically connects the first and second metalized regions.

6. The reconfigurable laser header assembly of claim 5, wherein the connecting electrical conductor includes a plurality of electrical conductors, two of the plurality of electrical conductors extending around opposed sides of the laser.

7. The reconfigurable laser header assembly of claim 1, wherein the laser is a p-doped laser substrate structure,
   wherein the first and second relocatable conductors include a plurality of wire bonds,
   wherein a first wire bond extends from the modulated AC electric current source to the laser anode contact,
   wherein a second wire bond extends from the DC positive bias electric current source to the laser anode contact, and
   wherein a third wire bond extends from the DC negative electric current source to the first metalized region.

8. The reconfigurable laser header assembly of claim 1, wherein the laser is an n-doped laser substrate structure,
   wherein the relocatable conductors include a plurality of wire bonds,
   wherein a first wire bond extends from the modulated AC electric current source to the first metalized region,
   wherein a second wire bond extends from the DC positive bias electric current source to the second metalized region, and
   wherein a third wire bond extends from the DC negative electric current source to the laser cathode contact.

9. A method for biasing either an n-doped laser substrate structure or a p-doped laser substrate structure mounted on a laser header, the method comprising:
   a) providing a modulated AC electric current source, a DC positive bias electric current source, and a DC negative electric current source;
   b) mounting an electrical conductor including a first and second metalized regions onto the laser header;
   c) mounting a p-doped or an n-doped laser substrate structure onto the electrical conductor, the p-doped laser substrate structure including a p-substrate with a base cathode contact and an n-semiconductor layer with a laser anode contact, the n-doped laser substrate structure including an n-substrate with a base anode contact and a p-semiconductor layer with a laser cathode contact;
   d) electrically connecting both the modulated AC electric current source and the DC positive bias electric current source to the laser anode contact with relocatable conductors or to the base anode contact via relocatable conductors electrically connected to the first and/or the second metalized regions, and
   e) electrically connecting the DC negative electric current source to the laser cathode contact with a relocatable conductor or to the base cathode contact via a relocatable conductor electrically connected to the first and/or the second metalized region,
   wherein the laser substrate structure is properly biased regardless of whether the laser is an n-doped laser substrate structure of a p-doped laser substrate structure.

10. The method of claim 9, wherein the first and second metalized regions are electrically connected to the base anode contact or the base cathode contact at positions approximately one hundred and eighty degrees from each other.

11. The method of claim 9, wherein the first and second metalized regions are supported by the laser header.

12. The method of claim 9, wherein the first and second metalized regions are mounted on the laser header.

13. The method of claim 9, further including providing a connecting electrical conductor that electrically connects the first and second metalized regions.

14. The method of claim 13, wherein the connecting electrical conductor includes two electrical conductors extending around opposed sides of the laser.

15. The method of claim 9, wherein:
   step c includes mounting an n-doped laser substrate structure onto the electrical conductor;
   step d) includes electrically connecting a first wire bond from the modulated AC electric current source to the first metalized region;
   step d) includes electrically connecting a second wire bond from the DC positive bias electric current source to the second metalized region;

step e) includes electrically connecting a third wire bond from the DC negative electric current source to the laser cathode contact.

16. The method of claim 9, wherein:

step c includes mounting a p-doped laser substrate structure onto the electrical conductor;

step d) includes electrically connecting a first wire bond from the modulated AC electric current source to the laser anode contact;

step d) includes electrically connecting a second wire bond from the DC positive bias electric current source to the laser anode contact;

step e) includes electrically connecting a third wire bond from the DC negative electric current source to the first metalized region.

* * * * *